(12) United States Patent
Mihara

(10) Patent No.: US 9,543,314 B2
(45) Date of Patent: Jan. 10, 2017

(54) MANUFACTURING METHOD OF SEMICONDUCTOR DEVICE AND SEMICONDUCTOR DEVICE

(71) Applicant: Renesas Electronics Corporation, Koutou-ku, Tokyo (JP)

(72) Inventor: Tatsuyoshi Mihara, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/828,473

(22) Filed: Aug. 17, 2015

(65) Prior Publication Data
US 2016/0064389 A1 Mar. 3, 2016

(30) Foreign Application Priority Data

Aug. 28, 2014 (JP) ................. 2014-174481

(51) Int. Cl.
| | | |
|---|---|---|
| *H01L 27/115* | (2006.01) | |
| *H01L 29/66* | (2006.01) | |
| *H01L 29/792* | (2006.01) | |
| *H01L 21/28* | (2006.01) | |

(52) U.S. Cl.
CPC ..... *H01L 27/1157* (2013.01); *H01L 21/28282* (2013.01); *H01L 27/11573* (2013.01); *H01L 29/66545* (2013.01); *H01L 29/66833* (2013.01); *H01L 29/792* (2013.01)

(58) Field of Classification Search
CPC ............ H01L 27/1157; H01L 21/28273; H01L 21/28282; H01L 29/66545; H01L 29/66833; H01L 29/792

USPC .......................................... 257/314; 438/261
See application file for complete search history.

(56) References Cited

U.S. PATENT DOCUMENTS

| | | | | |
|---|---|---|---|---|
| 2008/0185635 A1* | 8/2008 | Yanagi | ............... | G11C 16/0466 257/325 |
| 2011/0001179 A1* | 1/2011 | Yanagi | ............... | G11C 16/0408 257/316 |
| 2012/0299084 A1* | 11/2012 | Saito | ................. | H01L 21/28282 257/324 |
| 2014/0213030 A1* | 7/2014 | Tsukuda | ............ | H01L 29/66833 438/287 |

FOREIGN PATENT DOCUMENTS

JP    2011-029631 A    2/2011

* cited by examiner

*Primary Examiner* — Cuong Q Nguyen
*Assistant Examiner* — Tong-Ho Kim
(74) *Attorney, Agent, or Firm* — Shapiro, Gabor and Rosenberger, PLLC

(57) ABSTRACT

A semiconductor device including a memory cell having a control gate electrode and a memory gate electrode formed via a charge accumulation layer with respect to the control gate electrode is provided which improves its performance. A control gate electrode which configures a memory cell, and a metallic film which configures part of the memory gate electrode are formed by a so-called gate last process. Thus, the memory gate electrode is configured by a silicon film corresponding to a p-type semiconductor film being in contact with an ONO film, and the metallic film. Further, a contact plug is coupled to both of the silicon film and the metallic film which configure the memory gate electrode.

16 Claims, 24 Drawing Sheets

FIG. 20

| | OPERATION SYSTEM WRITE/ERASE | WRITE OPERATING VOLTAGE (V) Vmg/Vs/Vcg/Vd/Vb | ERASE OPERATING VOLTAGE (V) Vmg/Vs/Vcg/Vd/Vb | READ OPERATING VOLTAGE (V) Vmg/Vs/Vcg/Vd/Vb |
|---|---|---|---|---|
| A | SSI(WRITE)/BTBT(ERASE) | 10/5/1/0.5/0 | −6/6/0/open/0 | 0/0/1.5/1.5/0 |
| B | SSI(WRITE)/FN(ERASE) | 10/5/1/0.5/0 | 12/0/0/0/0 | 0/0/1.5/1.5/0 |
| C | FN(WRITE)/BTBT(ERASE) | −12/0/0/0/0 | −6/6/0/open/0 | 0/0/1.5/1.5/0 |
| D | FN(WRITE)/FN(ERASE) | −12/0/0/0/0 | 12/0/0/0/0 | 0/0/1.5/1.5/0 |

MANUFACTURING METHOD OF SEMICONDUCTOR DEVICE AND SEMICONDUCTOR DEVICE

CROSS-REFERENCE TO RELATED APPLICATIONS

The disclosure of Japanese Patent Application No. 2014-174481 filed on Aug. 28, 2014 including the specification, drawings and abstract is incorporated herein by reference in its entirety.

BACKGROUND

The present invention relates to a semiconductor device and a manufacturing method therefor, and is particularly available in, for example, the manufacture of a semiconductor device having a nonvolatile memory.

As nonvolatile semiconductor memory devices capable of electrically writing and erasing, an EEPROM (Electrically Erasable and Programmable Read Only Memory) has been widely used. These memory devices typified by a flash memory widely used at present respectively have a conductive floating gate electrode or a trapping insulating film surrounded by an oxide film under a gate electrode of a MISFET, and takes a charge accumulated state at a floating gate or the trapping insulating film as memory information and reads out it as a threshold value of a transistor. The trapping insulating film refers to an insulating film capable of accumulating charges and includes a silicon nitride film or the like as one example. The trapping insulating film shifts the threshold value of the MISFET according to the injection/emission of charges into or from an area for such charge accumulation and is allowed to operate as a memory element. As the nonvolatile semiconductor memory device using the trapping insulating film, there is a split gate type cell which uses a MONOS (Metal Oxide Nitride Oxide Semiconductor) film.

There has been described in Patent Document 1 (Japanese Unexamined Patent Publication Laid-Open No. 2011-29631) that a gate electrode of a memory cell which configures a nonvolatile semiconductor memory device is configured by a two-layered film of a nondoped polysilicon layer and a metal material electrode layer.

RELATED ART DOCUMENT

Patent Document

[Patent Document 1] Japanese Unexamined Patent Publication Laid-Open No. 2011-29631

SUMMARY

There has been a demand for an improvement in the performance of a semiconductor device having a nonvolatile memory as much as possible even in such a semiconductor device. Alternatively, there has been a demand for an improvement in the reliability of the semiconductor device having the nonvolatile memory as much as possible even in such a semiconductor device. Alternatively, it has been desired to improve the manufacturing yield of the semiconductor device. Or it has been desired to realize the plural ones of those problems.

Other problems and novel features will be apparent from the description of the present specification and the accompanying drawings.

A summary of a typical one of embodiments disclosed in the present application will be briefly described as follows.

There is provided a manufacturing method of a semiconductor device showing one embodiment, in which a control gate electrode which configures a memory cell, and a metallic film which configures part of a memory gate electrode are formed by a gate last process to thereby configure the memory gate electrode by a silicon film corresponding to a p-type semiconductor film being in contact with an ONO film, and the metallic film.

Further, there is provided a semiconductor device showing another embodiment, including a memory cell which has a control gate electrode, and a memory gate electrode adjacent to the sidewall of the control gate electrode through an ONO film and in which the memory gate electrode is configured by a silicon film corresponding to a p-type semiconductor film being in contact with the ONO film, and a metallic film, and the same contact plug is coupled to the silicon film and the metallic film.

According to one embodiment, the performance of the semiconductor device can be improved. Alternatively, the reliability of the semiconductor device can be improved. In other words, the manufacturing yield of the semiconductor device can be improved. Or alternatively, the plural ones of their advantageous effects can be realized.

BRIEF DESCRIPTION OF THE DRAWINGS

FIG. 20 is a table showing one example of conditions for application of voltages to each part of a selected memory cell at the time of "writing", "erasing", and "reading";

DETAILED DESCRIPTION

Figure 1:
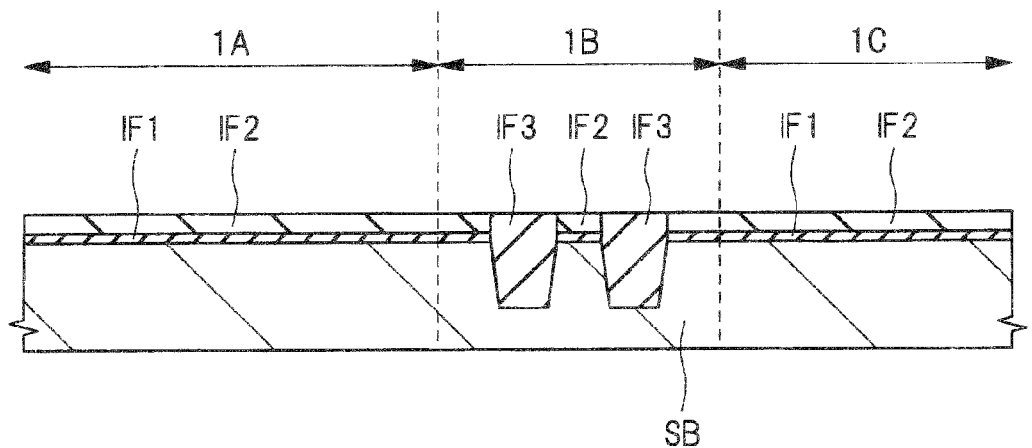
FIG. 1 is a sectional diagram in a manufacturing process of a semiconductor device showing an embodiment 1.

Embodiments will hereinafter be described in detail based on the accompanying drawings. Incidentally, in all of the drawings for explaining the embodiments, the same reference numerals are respectively attached to components having the same function, and their repetitive descriptions will be omitted. Further, in the following embodiments, the description of the same or like components will not be repeated in principle other than when required in particular.

Further, signs "−" and "+" respectively indicate the relative concentration of an impurity having a conductivity type which is an n type or a p type. In the case of, for example, the n type impurity, the impurity concentration increases in order of "$n^-$", "n", and "$n^+$".

Embodiment 1

Semiconductor devices according to the present embodiment and the following embodiments are semiconductor devices each equipped with a nonvolatile memory (nonvolatile memory element, flash memory, nonvolatile semiconductor memory device). In the present embodiment and the following embodiments, the nonvolatile memory will be described on the basis of a memory cell based on an n channel type MISFET (Metal Insulator Semiconductor Field Effect Transistor). Further, the polarities (polarity of the voltage applied at the time of writing/erasing/reading and the polarity of a carrier) are intended to describe the operation of the memory cell based on the n channel type MISFET. When the memory cell is based on a p channel type MISFET, the same operation can be obtained in principle by inverting all polarities of an applied potential, the conductivity type of a carrier, etc.

<Manufacturing Method of Semiconductor Device>

A method for manufacturing the semiconductor device according to the present embodiment will be described with reference to FIGS. 1 through 19. The semiconductor device according to the present embodiment includes a split gate type MONOS memory.

FIGS. 1 through 16, FIG. 18, and FIG. 19 are respectively sectional diagrams in a manufacturing process of the semiconductor device according to the present embodiment. FIG. 17 is a plan diagram in the manufacturing process of the semiconductor device according to the present embodiment. In FIGS. 1 through 16 and FIG. 18 of these drawings, sectional diagrams of a memory cell area 1A, a capacitive element area 1B, and a peripheral circuit area 1C are shown in order from the left to right sides of the respective drawings. There are shown therein the manner in which a memory cell of a nonvolatile memory is formed in the memory cell area 1A, a trench type capacitive element is formed in the capacitive element area 1B, and a low breakdown voltage MISFET is formed in the peripheral circuit area 1C, respectively.

Figure 17:
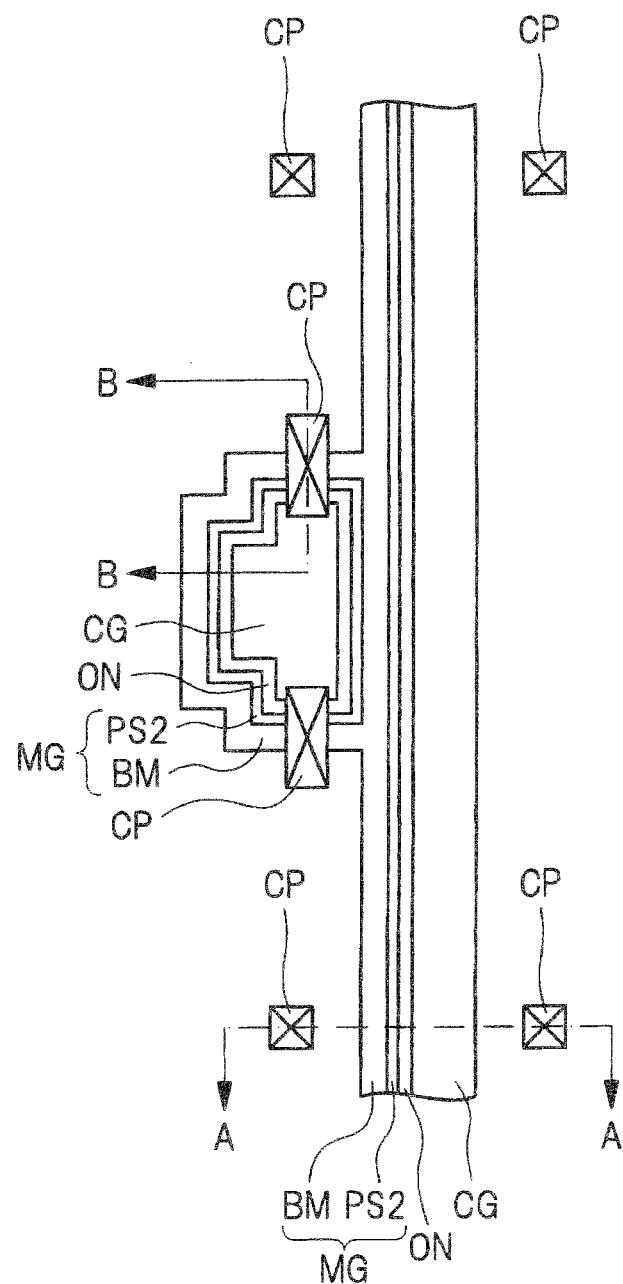
FIG. 17 is a plan diagram in the manufacturing process of the semiconductor device, following FIG. 16.
Figure 18:
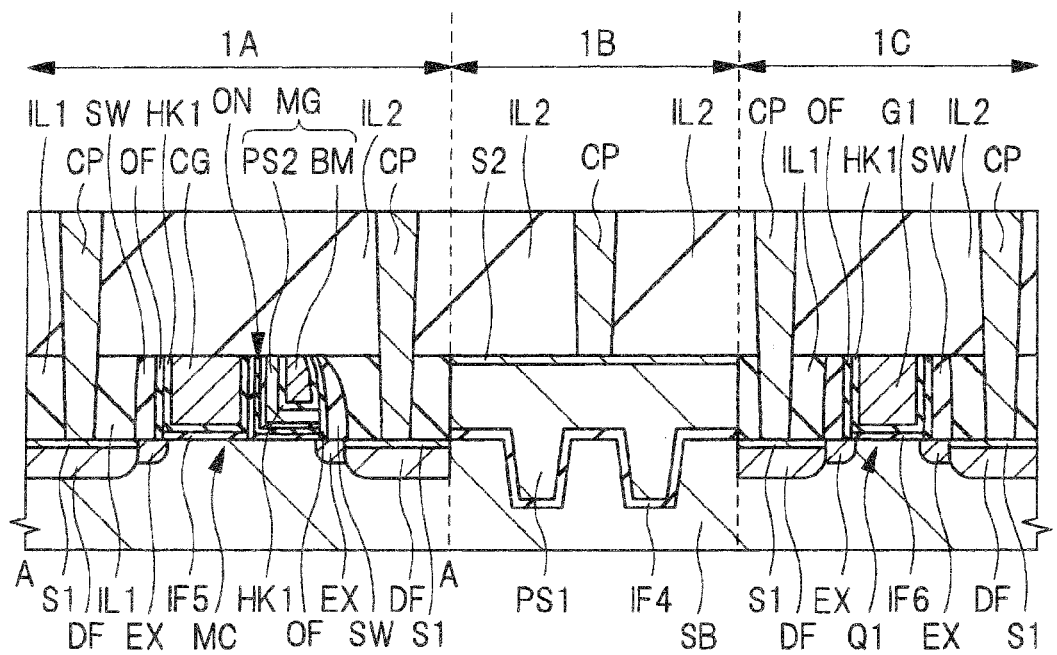
FIG. 18 is a sectional diagram in the manufacturing process of the semiconductor device, following FIG. 16.
Figure 19:
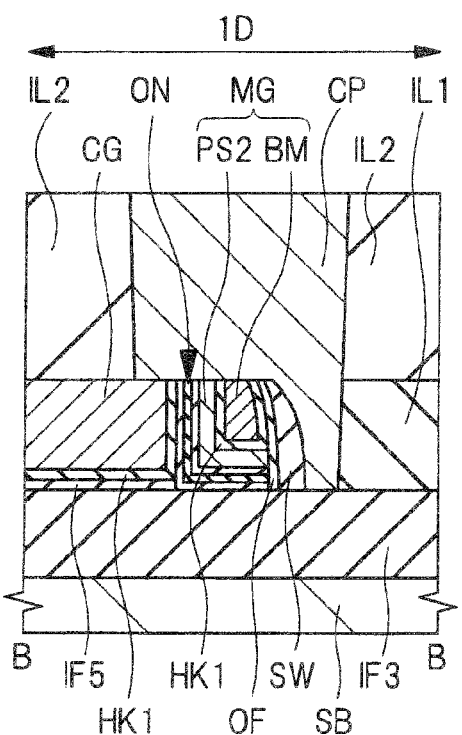
FIG. 19 is a sectional diagram in the manufacturing process of the semiconductor device, following FIG. 16.

The boundaries between the areas adjacent to each other in the memory cell area 1A, the capacitive element area 1B, and the peripheral circuit area 1C are indicated by broke lines in FIGS. 1 through 16 and FIG. 18. The areas adjacent to each other are spaced away from each other as compared with the case where they are shown in the above drawings. An element isolation region or the like is formed between the adjacent areas. Further, a sectional diagram of a power feeding area 1D is shown in FIG. 19. A cross-section of the memory cell area 1A in FIG. 18 is a cross-section taken along line A-A shown in FIG. 17, and a cross-section of the power feeding area 1D in FIG. 19 is a cross-section taken along line B-B shown in FIG. 17.

Further, the memory cell area 1A, the capacitive element area 1B, and the peripheral circuit area 1C exist on the side of a main surface of the same semiconductor substrate SB side by side in a direction extending along the main surface.

Here, peripheral circuits are circuits other than the nonvolatile memory, e.g., a processor such as a CPU, a control circuit, a sense amplifier, a column decoder, a row decoder, an input/output circuit, etc. The MISFET formed in the peripheral circuit area 1C is a low breakdown voltage MISFET for the peripheral circuit.

Further, in the present embodiment, a description will be made about the case where the n channel type MISFET (control transistor and memory transistor) is formed in the memory cell area 1A. However, a p channel type MISFET (control transistor and memory transistor) can also be formed in the memory cell area 1A by inverting the conductivity type. Similarly, although a description will be made about the case where in the present embodiment, the n channel type MISFET is formed in the peripheral circuit area 1C, the p channel type MISFET can also be formed in the peripheral circuit area 1C by inverting the conductivity type. Further, both of the n channel type MISFET and the p channel type MISFET, i.e., a CMISFET (Complementary MISFET) can also be formed in the peripheral circuit area 1C.

In the manufacturing process of the semiconductor device, a semiconductor substrate (semiconductor wafer) SB comprised of, for example, p-type monocrystalline silicon (Si) having a resistivity of about 1 to 10 Ωcm, or the like is first provided as shown in FIG. 1. Then, an element isolation region for defining an active region is formed in the main surface of the semiconductor substrate SB.

The element isolation region is comprised of an insulator such as silicon oxide and can be formed by, for example, an STI (Shallow Trench Isolation) method or a LOCOS (Local Oxidation of Silicon) method or the like. A description will be made here about the case where the element isolation region is formed by the STI method, and the trench type capacitive element is formed using the process of forming the element isolation region.

That is, after an insulating film IF1 and an insulating film IF2 are sequentially formed over the semiconductor substrate SB, the insulating film IF2 is processed by using a photolithography technique and a dry etching method to open the insulating film IF2 in each of the area for forming the element isolation region and the area for forming a trench for embedding the electrode of the trench type capacitive element. Subsequently, the insulating film IF1 is opened by using a wet etching method with the insulating film IF2 as a hard mask to expose the upper surface of the semiconductor substrate SB. Thereafter, a plurality of trenches are formed in the upper surface of the semiconductor substrate SB exposed from the insulating film IF2 and the insulating film IF1 by using the dry etching method. The insulating film IF1 is comprised of, for example, silicon oxide ($SiO_2$), and the insulating film IF2 is comprised of, for example, silicon nitride (SiN).

Subsequently, an insulating film IF3 comprised of, for example, silicon oxide is embedded in the trenches to enable each element isolation region (not shown) to be formed. The element isolation region is formed, for example, between the memory cell area 1A and the capacitive element area 1B and between the capacitive element area 1B and the peripheral circuit area 1C. Thus, the structure shown in FIG. 1 is obtained. Here, the insulating film IF3 is formed over the semiconductor substrate SB and the insulating film IF2 by using, for example, a CVD (Chemical Vapor Deposition) method, and thereafter the extra insulating film IF3 lying over the insulating film IF2 is polished and removed by, for example, a CMP (Chemical Mechanical Polishing) method to enable the insulating film IF3 to be left in the above trenches.

Figure 2:
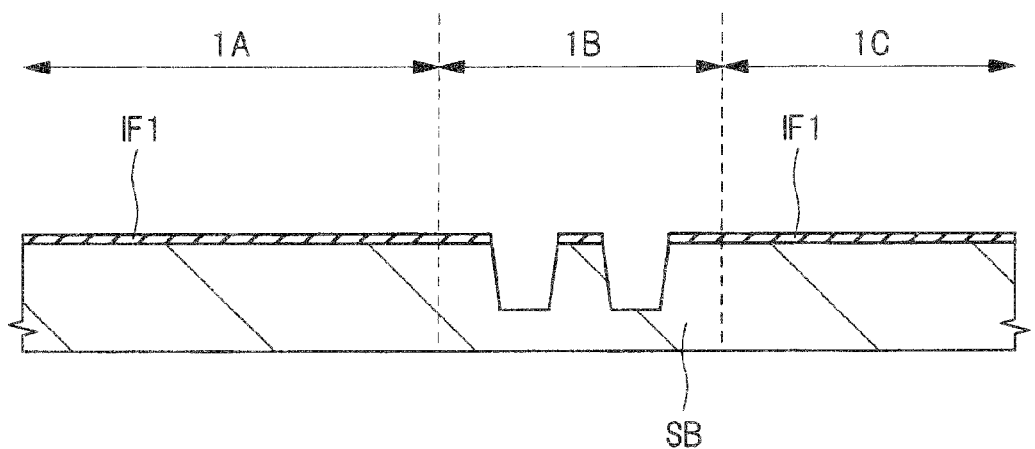
FIG. 2 is a sectional diagram in the manufacturing process of the semiconductor device, following FIG. 1.

Next, as shown in FIG. 2, the insulating film IF2 taken as the hard mask is removed after removal of the insulating film IF3 embedded in the trenches formed in the upper surface of the semiconductor substrate SB in the capacitive element area 1B. Thus, the surface of the semiconductor substrate SB is exposed within the trenches formed in the upper surface of the semiconductor substrate SB in the capacitive element area 1B. Although the insulating film IF1 is left over the semiconductor substrate SB in FIG. 2, the insulating film IF1 may be removed. At this time, the element isolation region (not shown) remains unremoved.

Next, although omitted in the drawing, a p-type well is formed in the memory cell area 1A of the semiconductor substrate SB, and a p-type well is formed in a MISFET forming region of the peripheral circuit area 1C. Incidentally, a semiconductor region relatively high in impurity concentration may be formed over the upper surface of the semiconductor substrate SB in the capacitive element area 1B. These p-type wells can be formed by, for example, ion-implanting a p-type impurity such as boron (B) into the semiconductor substrate SB.

Figure 3:
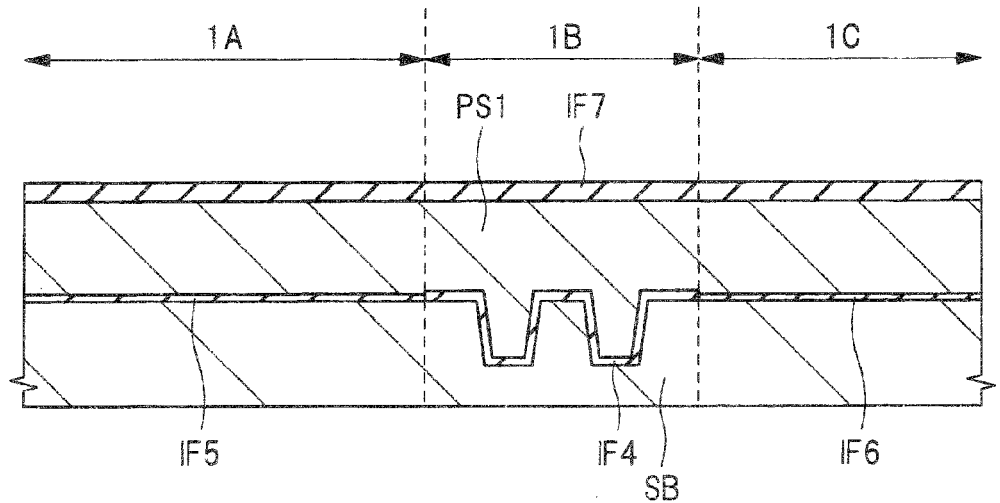
FIG. 3 is a sectional diagram in the manufacturing process of the semiconductor device, following FIG. 2

Next, as shown in FIG. 3, insulating films IF5 and IF6 for a gate insulating film and an insulating film IF4 for electrode isolation of the capacitive element are formed over the main surface of the semiconductor substrate SB. The insulating film IF5 is formed over the upper surface of the semiconductor substrate SB in the memory cell area 1A. The insulating film IF6 is formed over the upper surface of the semiconductor substrate SB in the peripheral circuit area 1C. The insulating film IF4 is formed over the upper surface of the semiconductor substrate SB in the capacitive element area 1B. For example, a silicon oxide film can be used as the insulating films IF4 to IF6. The insulating films IF4 to IF6 can also be formed in the same process, but are formed here in different processes. For example, the insulating film IF5 is larger than the insulating film IF6 in thickness, and the insulating film IF4 is larger than the insulating film IF5 in thickness.

Further, an insulating film for the gate insulating film, which is larger in thickness than the insulating films IF4 and IF5, is formed in an area which is an unillustrated area in the peripheral circuit area 1C and is for forming a high breakdown voltage MISFET used in the input/output of power between an external device and the semiconductor device according to the present embodiment. When insulting films different in thickness are formed, there are used, for example, a method for forming a thick insulating film over the semiconductor substrate SB by using the CVD method or the like and thereafter partly leaving and removing the thick insulating film, and then forming a thin insulating film over the semiconductor substrate SB by using a thermal oxidation method or the like.

Thereafter, a silicon film PS1 comprised of a polycrystalline silicon film is formed over the semiconductor substrate SB to cover the upper surfaces of the insulating films IF4 to IF6 by using the CVD method, for example. In film-forming, the silicon film PS1 is formed as an amorphous silicon film and then the silicon film PS1 comprised of the amorphous silicon film can also be changed to the silicon film PS1 comprised of the polycrystalline silicon film. Further, the silicon film PS1 can be taken as a low-resistance semiconductor film (doped polysilicon film) by implanting an impurity in film forming or ion-implanting an impurity after film forming.

Incidentally, a dummy control gate electrode DC to be described later, which is formed in the memory cell area 1A by using the silicon film PS1, and a dummy gate electrode DG to be described later, which is formed in the peripheral circuit area 1C by using the silicon film PS1, are removed in a subsequent process. Therefore, the silicon film PS1 in the memory cell area 1A and the peripheral circuit area 1C is not required to be implanted with an impurity in consideration of a reduction in resistance. If it is however taken into consideration that the silicon film PS1 in these areas is removed by etching, for example, an n-type impurity is preferably implanted. As the n-type impurity to be implanted in the silicon film PS1, for example, phosphorus (P) can suitably be used.

Next, an insulating film IF7 is formed over the silicon film PS1 by using the CVD method, for example. The insulating film IF7 is a cap insulating film comprised of, for example, silicon nitride (SiN). The thickness of the insulating film IF7 can be assumed to be, for example, about 20 to 50 nm.

Figure 4:
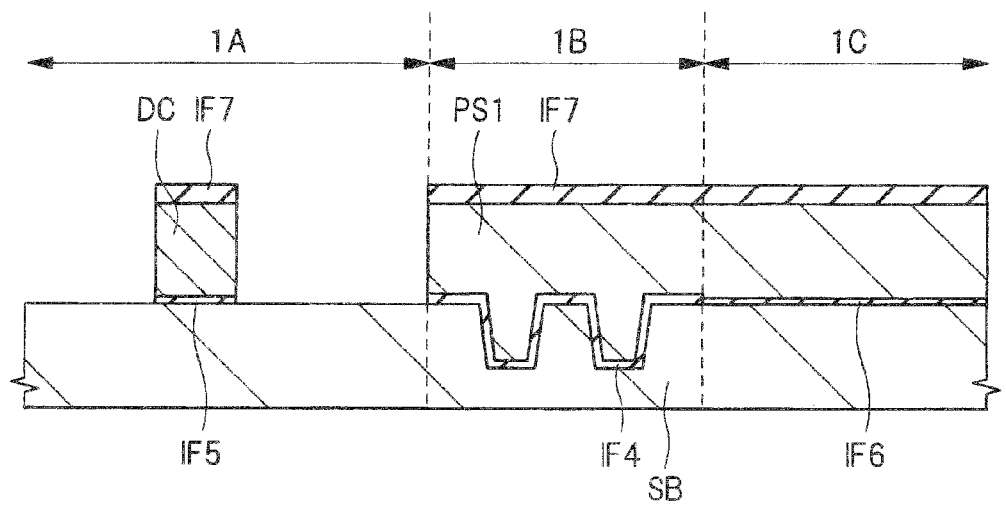
FIG. 4 is a sectional diagram in the manufacturing process of the semiconductor device, following FIG. 3.

Next, as shown in FIG. 4, a laminated film comprised of the insulating film IF7, the silicon film PS1, and the insulating film IF5 in the memory cell area 1A, and a laminated film comprised of the insulating film IF7, the silicon film PS1, and the insulating film IF4 in the capacitive element area 1B are patterned by the photolithography technique and the etching technique. Thus, the gate insulating film comprised of the insulating film IF5 is formed in the memory cell area 1A. Further, the dummy control gate electrode DC comprised of the silicon film PS1 in the memory cell area 1A is formed by this etching process. The dummy control gate electrode DC corresponds to the semiconductor film to be removed in a subsequent process. The dummy control gate electrode DC is a pattern which extends in a predetermined direction as viewed in plan view. The predetermined direction is a depth direction in FIG. 4.

The above patterning process can be done in the following manner, for example. That is, the insulating film IF7 in the memory cell area 1A is first processed by using the photolithography technique and the etching method. Then, the silicon film PS1 and the insulating film IF5 in the memory cell area 1A are processed by using the dry etching method with the insulating film IF7 as a mask. Thus, the dummy control gate electrode DC and the above gate insulating film are formed.

Further, an upper electrode of the capacitive element comprised of the silicon film PS1 in the capacitive element area 1B is formed by the above patterning process. Thus, the capacitive element comprised of both the silicon film PS1, the insulating film IF4 provided directly therebelow, and the semiconductor substrate SB in the capacitive element area 1B is formed. That is, the semiconductor substrate SB below the silicon film PS1 in the capacitive element area 1B configures a lower electrode of the capacitive element. The capacitive element is an element which generates a capacitance by spacing the upper electrode comprised of the silicon film PS1 and the semiconductor substrate SB from each other by the insulating film IF4.

In the trench type capacitive element formed in this way, the silicon film PS1 and the semiconductor substrate SB can be increased in terms of their areas opposite to each other by embedding part of the silicon film PS1 into the trenches in the upper surface of the semiconductor substrate SB as compared with the case where the silicon film is formed over the flat semiconductor substrate SB. Thus, even when the area occupied by the capacitive element is small in the semiconductor device, the capacitive element can be increased in capacity.

Incidentally, although the silicon film PS1 in the capacitive element 1B and the silicon film PS1 in the peripheral circuit area 1C are illustrated to be integrated with each other in FIG. 4, the silicon films PS1 and the insulating films IF7 in the capacitive element area 1B and the peripheral circuit area 1C are actually respectively separated from each other by the above etching process described using FIG. 4. That is, the silicon film PS1 in the capacitive element area 1B configures a pattern independent of the silicon film PS1 in the peripheral circuit area 1C.

Figure 5:
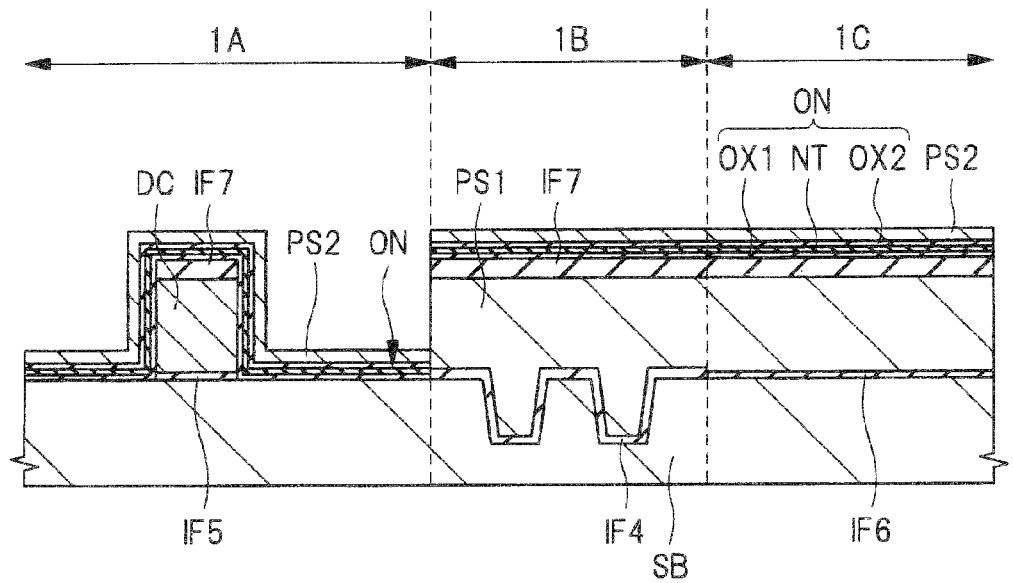
FIG. 5 is a sectional diagram in the manufacturing process of the semiconductor device, following FIG. 4.

Next, as shown in FIG. 5, an ONO (oxide-nitride-oxide) film ON for the gate insulating film of the memory transistor is formed over the entire main surface of the semiconductor substrate SB. The ONO film ON covers the upper surface of the semiconductor substrate SB in the memory cell area 1A, the sidewalls and upper surface of the laminated film comprised of the insulating films IF5 and IF7 and the dummy control gate electrode DC. Further, the ONO film ON convers the sidewalls and upper surface of the laminated film comprised of the insulating films IF4 and IF7 and the silicon film PS1 in the capacitive element area 1B, and covers the upper surface of the insulating film IF7 in the peripheral circuit area 1C.

The ONO film ON is an insulating film for the gate insulating film of the memory transistor and having a charge accumulation part there inside. Specifically, the ONO film ON is comprised of a laminated film of a silicon oxide film OX1 formed over the semiconductor substrate SB, a silicon nitride film NT formed over the silicon oxide film OX1, and a silicon oxide film OX2 formed over the silicon nitride film NT.

The silicon oxide films OX1 and OX2 can be formed by, for example, an oxidation process (thermal oxidation process) or the CVD method, or a combination thereof. Upon the oxidation process at this time, ISSG (In Situ Steam Generation) oxidation can also be used. The silicon nitride film NT can be formed by, for example, the CVD method.

In the present embodiment, the silicon nitride film NT is formed as an insulating film (charge accumulation layer) having a trap level. The film used as the charge accumulation film is preferably a silicon nitride film in terms of reliability, but is not limited to the silicon nitride film. For example, a high permittivity film (high permittivity insulating film) having permittivity higher than the silicon nitride film, such as an aluminum oxide film (alumina), a hafnium oxide film or a tantalum oxide film can also be used as the charge accumulation layer or the charge accumulation part. Incidentally, it is considered that the structure of the silicon film PS1 or the like formed over the semiconductor substrate SB is subjected to a high temperature when forming the ONO film ON.

The thickness of the silicon oxide film OX1 can be taken to be, for example, about 2 to 10 nm. The thickness of the silicon nitride film NT can be taken to be, for example, about 5 to 15 nm. The thickness of the silicon oxide film OX2 can be taken to be, for example, about 2 to 10 nm.

Subsequently, a polycrystalline silicon film PS2 is formed over the entire main surface of the semiconductor substrate SB so as to cover the surface of the ONO film ON by using the CVD method, for example. Thus, the sidewalls and upper surface of the ONO film ON, which have been exposed in the memory cell area 1A, are covered by the silicon film PS2. That is, the silicon film PS2 is formed over the sidewalls of the dummy control gate electrode DC through the ONO film ON. The thickness of the silicon film PS2 is 10 nm, for example. In film-forming, the silicon film PS2 is formed as an amorphous silicon film, and then the silicon film PS2 comprised of the amorphous silicon film can also be changed to the silicon film PS2 comprised of a polycrystalline silicon film by a subsequent heat treatment. The silicon film PS2 is an intrinsic semiconductor film which hardly contains an impurity.

In the case of a specific film, the thickness described herein refers to the thickness of the corresponding film in the direction perpendicular to the surface of a base of the corresponding film. When the silicon film PS2 is formed over the surface extending along the main surface of the semiconductor substrate SB, and along the corresponding surface as in the upper surface of the ONO film ON, etc. for example, the thickness of the silicon film PS2 refers to the thickness of the silicon film PS2 in the direction perpendicular to the main surface of the semiconductor substrate SB. Further, in the case of the silicon film PS2 of the portion formed in contact with each wall perpendicular to the main surface of the semiconductor substrate SB as in the sidewalls of the ONO film ON, the thickness refers to the thickness of the silicon film PS2 in the direction perpendicular to the sidewalls.

Figure 6:
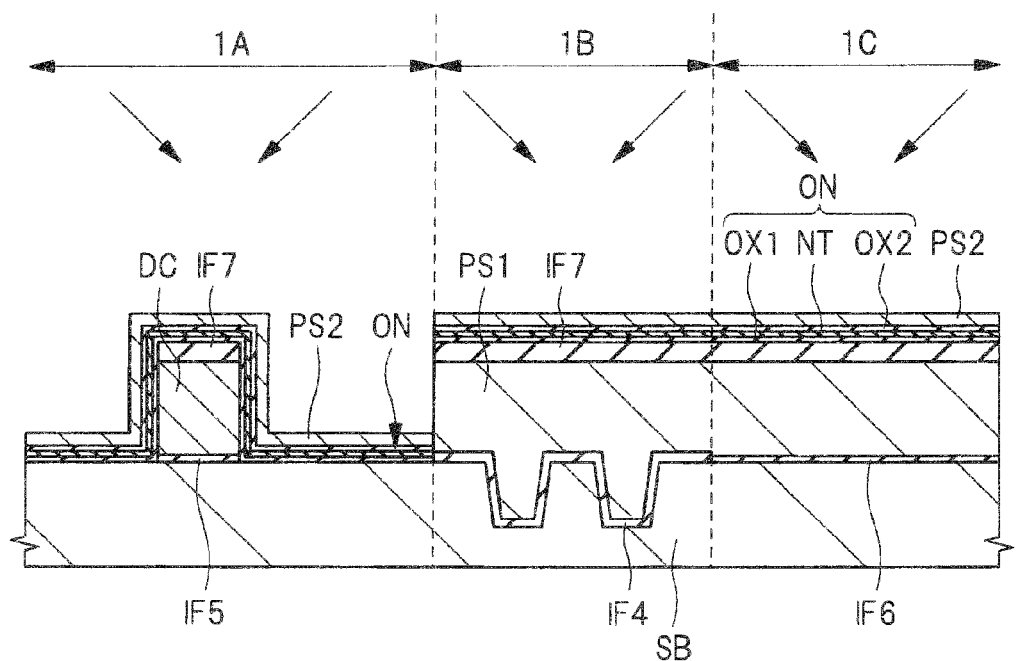
FIG. 6 is a sectional diagram in the manufacturing process of the semiconductor device, following FIG. 5.

Next, as shown in FIG. 6, a p-type impurity (e.g., boron (B)) is implanted in the silicon film PS2 in a relatively high concentration by using an ion implantation method, for example. The ion implantation is done for the primary purpose of implanting the impurity in the silicon film PS2 covering the sidewalls of the dummy control gate electrode DC and the silicon film PS2 covering the main surface of the semiconductor substrate SB located laterally of the dummy control gate electrode DC. Accordingly, the ion implantation is done from an angle of 45° with respect to the main surface of the semiconductor substrate SB. Further, the ion implantation is carried out from four directions tilted by 45° with respect to the direction in which the dummy control gate electrode DC extends, i.e., a gate width direction in plan view, respectively. That is, the ion implantation includes four implantation steps carried out from directions different from each other.

By the above implantation steps, the silicon film PS2 becomes a p$^+$ type semiconductor film. Thereafter, a heat treatment for diffusing the impurities implanted in the silicon film PS2 and the like is performed on the semiconductor substrate SB. The silicon film PS2 is a film for forming a dummy memory gate electrode DM to be described later and a memory gate electrode MG to be described later.

Figure 7:
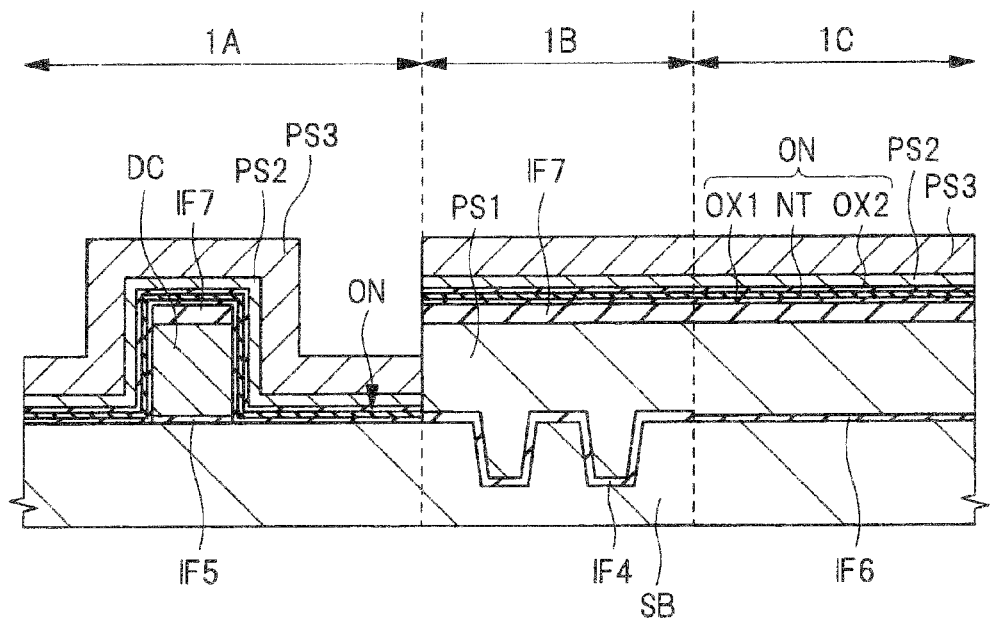
FIG. 7 is a sectional diagram in the manufacturing process of the semiconductor device, following FIG. 6.

Next, as shown in FIG. 7, a silicon film PS3 is formed over the entire main surface of the semiconductor substrate SB, i.e., the silicon film PS2 by using the CVD method, for example. The silicon film PS3 is a film for forming the dummy memory gate electrode DM to be described later. The silicon film PS3 is comprised of a polycrystalline silicon film. The deposited thickness of silicon film PS3 can be taken to be, for example, about 30 nm. The setting of the thickness of the silicon film PS3 to 30 nm which is relatively large is done for improving the embedding property of a metallic film embedded in a trench opened by removing the silicon film PS3 as subsequently described using FIGS. 14 and 15.

In film-forming, the silicon film PS3 is formed as an amorphous silicon film and then the silicon film PS3 comprised of the amorphous silicon film can also be changed to the silicon film PS3 comprised of the polycrystalline silicon film by a subsequent heat treatment. The silicon film PS3 is an intrinsic semiconductor film which hardly contains an impurity.

Figure 8:
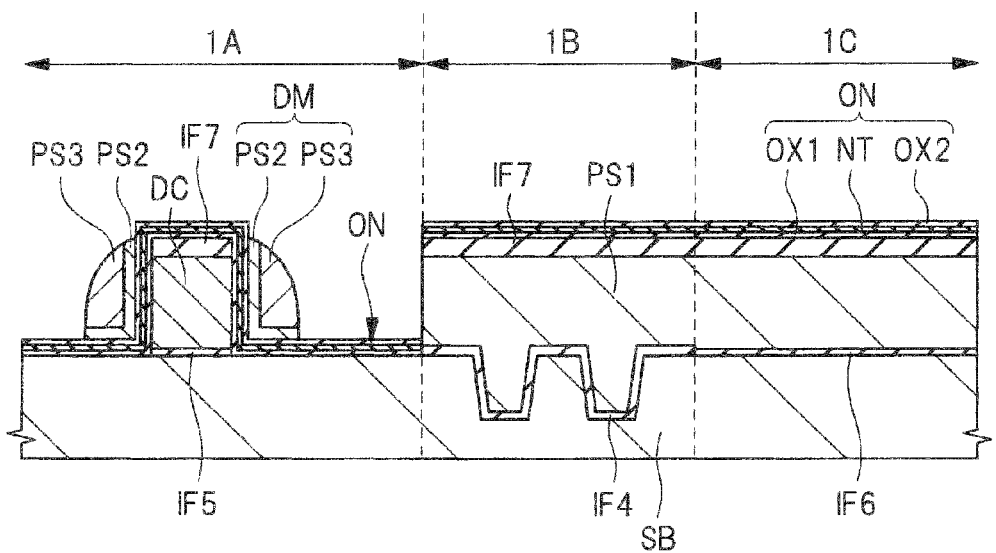
FIG. 8 is a sectional diagram in the manufacturing process of the semiconductor device, following FIG. 7.

Next, as shown in FIG. 8, the silicon films PS2 and PS3 are etch-backed (etching, dry etching and isotropic etching) by an isotropic etching technique to expose the surface of the ONO film ON. In the etchback process, the silicon films PS2 and PS3 are left in a sidewall form on both sidewalls of the laminated film comprised of the insulating films IF5 and IF7 and the dummy memory gate electrode DM through the ONO film ON by isotropically etching (etchbacking) the silicon films PS2 and PS3.

Thus, in the memory cell area 1A, the dummy memory gate electrode DM is formed over one of the sidewalls of the laminated film by the silicon films PS2 and PS3 left in the sidewall form through the ONO film ON. The dummy memory gate electrode DM formed over one sidewall of the dummy control gate electrode DC is a semiconductor film whose part is removed in a subsequent process. Incidentally, in the etchback process, the height of the dummy memory gate electrode DM is not required to be lower than the height of the dummy control gate electrode DC. When the height is mentioned in the present application, it is assumed to refer to the height in the direction substantially vertical to the main surface of the semiconductor substrate SB. Further, the upper surface of the ONO film ON in each of the capacitive element area 1B and the peripheral circuit area 1C is exposed by the above etchback.

Figure 9:
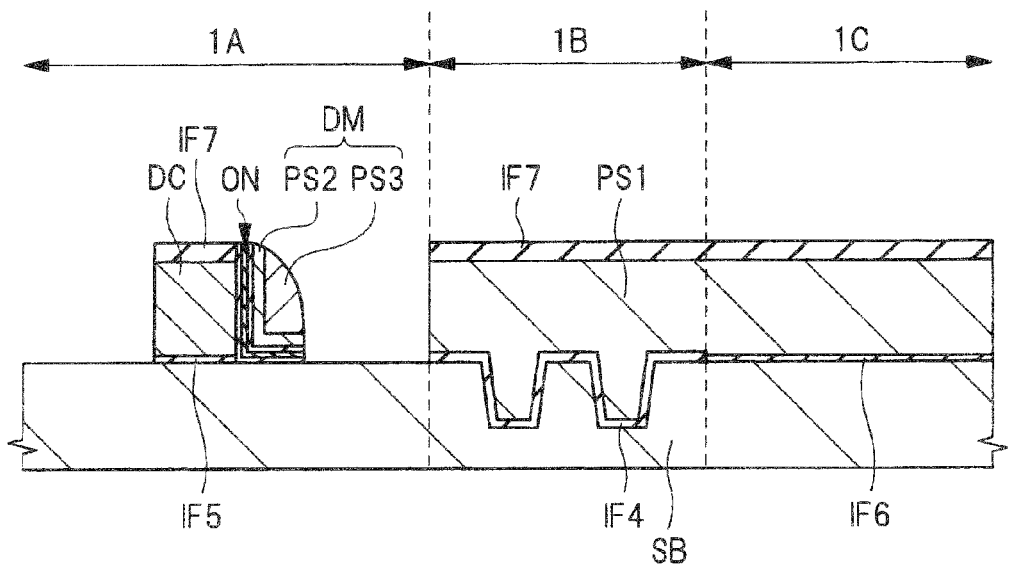
FIG. 9 is a sectional diagram in the manufacturing process of the semiconductor device, following FIG. 8.

Next, as shown in FIG. 9, a photoresist pattern (not shown) which covers the dummy memory gate electrode DM adjacent to one sidewall of the dummy control gate electrode DC and exposes the silicon films PS2 and PS3 adjacent to the other sidewall of the dummy control gate electrode DC is formed over the semiconductor substrate SB by using the photolithography technique. Thereafter, the silicon films PS2 and PS3 formed on the opposite side of the dummy memory gate electrode DM with the dummy control gate electrode DC interposed therebetween are removed by performing etching with the photoresist pattern as an etching mask. Thereafter, the photoresist pattern is removed. Since the dummy memory gate electrode DM is covered with the photoresist pattern at this time, it remains without being etched.

Subsequently, the portion of the ONO film ON, which is exposed without being not covered with the dummy memory gate electrode DM is removed by etching (e.g., wet etching). At this time, the ONO film ON located immediately under the dummy memory gate electrode DM remains without being removed in the memory cell area 1A. Likewise, the ONO film ON located between the laminated film including the insulating films IF5 and IF7 and the dummy control gate electrode DC and the dummy memory gate electrode DM remains without being removed. Since the ONO film ON in the other areas is removed, the upper surface of the semiconductor substrate SB in the memory cell area 1A is exposed, and the upper surface of the insulating film IF7 in each of the memory cell area 1A, the capacitive element area 1B, and the peripheral circuit area 1C is exposed. Further, the sidewall which corresponds to the sidewall of the dummy control gate electrode DC and is not adjacent to the dummy memory gate electrode DM is exposed.

Thus, the dummy memory gate electrode DM is formed over the semiconductor substrate SB through the ONO film ON having the charge accumulation part there inside so as to adjoin the dummy control gate electrode DC.

Figure 10:
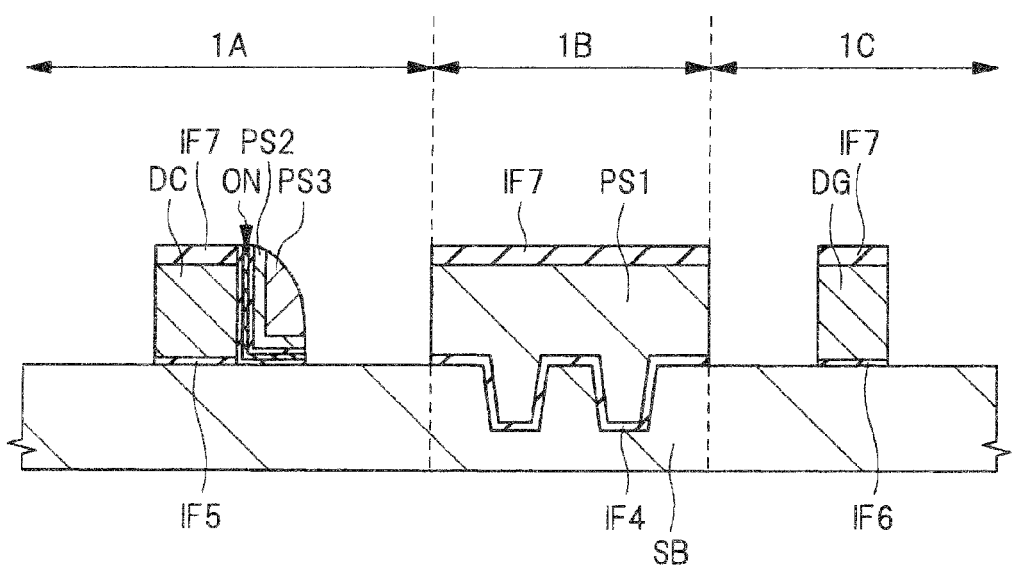
FIG. 10 is a sectional diagram in the manufacturing process of the semiconductor device, following FIG. 9.

Next, as shown in FIG. 10, the insulating film IF7 in the peripheral circuit area 1C is patterned by using the photolithography technique and the etching technique. Thereafter, the silicon film PS1 and the insulating film IF6 are processed by performing etching with the insulating film IF7 in the peripheral circuit area 1C as a mask. Thus, a dummy gate electrode DG comprised of the silicon film PS1 and a gate insulating film comprised of the insulating film IF6 are formed. The dummy gate electrode DG is a semiconductor film to be removed in a subsequent process.

Figure 11:
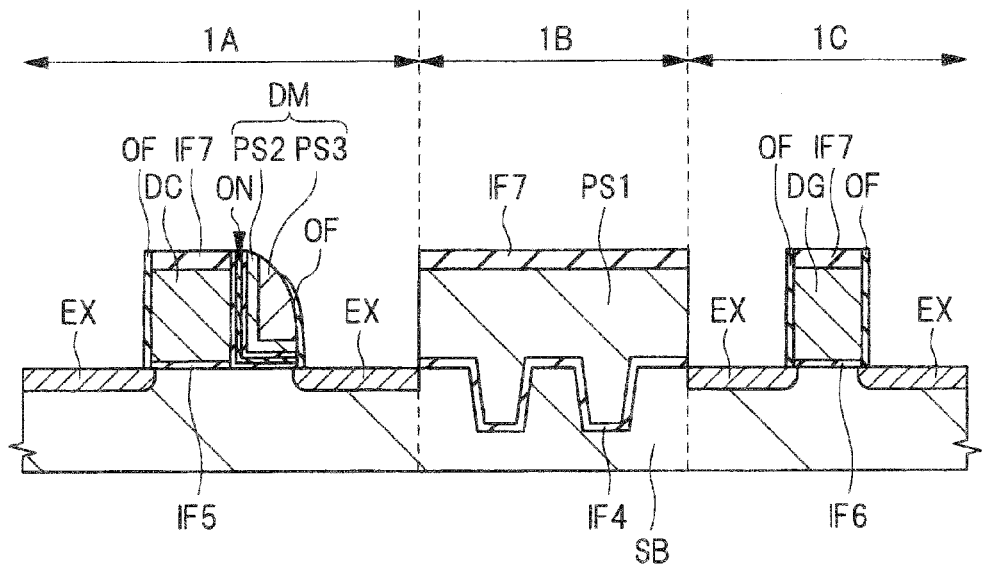
FIG. 11 is a sectional diagram in the manufacturing process of the semiconductor device, following FIG. 10.

Next, as shown in FIG. 11, offset spacers OF are formed which are insulating films covering the sidewalls on both sides of the structure including the dummy control gate electrode DC, the dummy memory gate electrode DM, the insulating film IF5, the insulating film IF7, and the ONO film ON in the memory cell area 1A. Further, offset spacers OF which cover the sidewalls on both sides of the laminated film comprised of the insulating films IF6 and IF7 and the dummy gate electrode DG are formed in the peripheral circuit area 1C by the same process.

After, for example, a silicon nitride film is formed over the semiconductor substrate SB by using the CVD method, for example, the silicon nitride film is partly removed by anisotropic etching to expose the upper surface of the semiconductor substrate SB and the upper surface of the insulating film IF7, whereby the offset spacers OF can be formed so as to contact the respective sidewalls of the above structure and laminated film.

Thereafter, a plurality of $n^-$ type semiconductor regions (impurity diffusion regions) EX are formed by using the ion implantation method or the like. That is, for example, an n-type impurity such as arsenic (As) or phosphorus (P) is introduced into the semiconductor substrate SB by the ion implantation method by using the insulating film IF7, the offset spacers OF, the dummy control gate electrode DC, the dummy memory gate electrode DM, the dummy gate electrode DG, and the ONO film ON or the like as a mask to thereby enable the $n^-$ type semiconductor regions EX to be formed.

In the memory cell area 1A, each of the $n^-$ type semiconductor regions EX formed in the upper surface of the semiconductor substrate SB located laterally of the structure including the dummy control gate electrode DC and the dummy memory gate electrode DM configures part of each of source-drain regions of the control transistor and the memory transistor in the memory cell area 1A, which are to be formed later. Further, in the peripheral circuit area 1C, each of the $n^-$ type semiconductor regions EX formed in the upper surface of the semiconductor substrate SB located laterally of the dummy gate electrode DG configures part of a source-drain region of the low breakdown voltage MISFET in the peripheral circuit area 1C, which is to be formed later. The $n^-$ type semiconductor regions EX in the memory cell area 1A and the peripheral circuit area 1C can be formed in the same ion implantation process, but can also be formed in different ion implantation processes.

Figure 12:
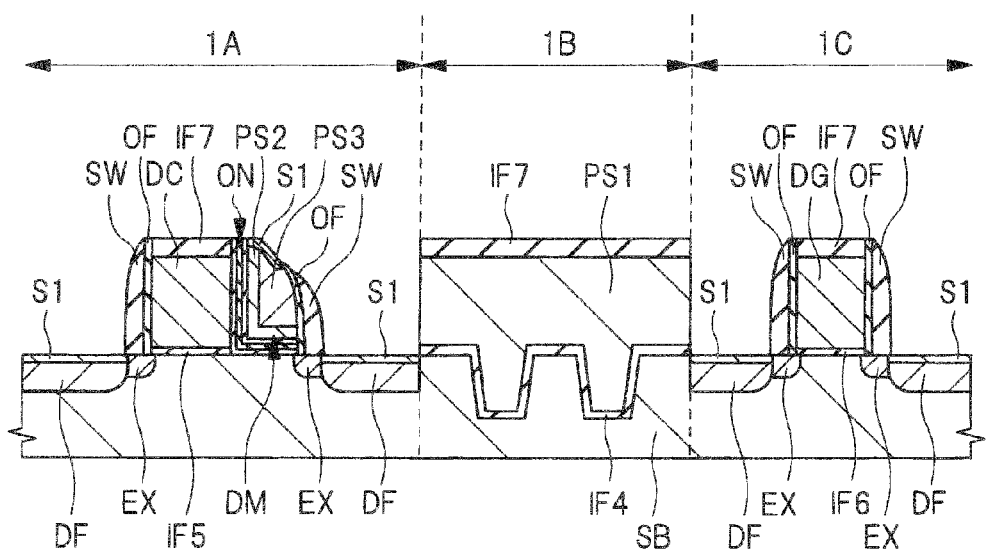
FIG. 12 is a sectional diagram in the manufacturing process of the semiconductor device, following FIG. 11.

Next, as shown in FIG. 12, sidewalls SW are formed which cover through the offset spacers OF interposed therebetween, the sidewalls on both sides of the structure including the dummy control gate electrode DC, the dummy memory gate electrode DM, the insulating film IF5, the insulating film IF7, and the ONO film ON in the memory cell area 1A. Further, sidewalls SW which cover the sidewalls on both sides of the laminated film comprised of the insulating films IF6 and IF7 and the dummy gate electrode DG through the offset spacers OF interposed therebetween are formed in the peripheral circuit area 1C by the same process.

The sidewalls SW can be formed in a self-alignment manner by, after, for example, a silicon oxide film and a silicon nitride film are formed in order over the semiconductor substrate SB by using the CVD method, for example, partly removing the silicon oxide film and the silicon nitride film by anisotropic etching, and exposing the upper surface of the semiconductor substrate SB and the upper surface of the insulating film IF7. That is, although the sidewalls SW are considered to be formed by the laminated film, the interface between the films which configure the laminated film is not shown in the drawing. Although not shown in the drawing, the offset spacers OF and the sidewalls SW are also formed over the sidewalls of the silicon film PS1 in the capacitor element area 1B.

Subsequently, $n^+$ type semiconductor regions (impurity diffusion regions) DF are formed in the memory cell area 1A and the peripheral circuit region 1C by using the ion implantation method or the like. That is, an n-type impurity (e.g., arsenic (As) or phosphorus (P)) is introduced into the semiconductor substrate SB by the ion implantation method by using the insulating film IF7, the offset spacers OF, the dummy control gate electrode DC, the dummy memory gate electrode DM, the dummy gate electrode DG, the ONO film ON, and the sidewalls SW as a mask (ion implantation inhibition mask) to thereby enable the $n^+$ type semiconductor regions DF to be formed. Each of the $n^+$ type semiconductor regions DF is higher in impurity concentration than the $n^-$ type semiconductor regions EX and deeper in junction depth than that.

Thus, the source-drain region is formed which is comprised of the $n^-$ type semiconductor region EX corresponding to an extension region, and the $n^+$ type semiconductor region DF higher in impurity concentration than the $n^-$ type semiconductor region EX and has an LDD (Lightly doped Drain) structure.

That is, in the memory cell area 1A, the $n^-$ type semiconductor region EX and the $n^+$ type semiconductor region DF formed in the upper surface of the semiconductor substrate SB located laterally of the structure including the dummy control gate electrode DC and the dummy memory gate electrode DM configure each of the source-drain regions of the control transistor and the memory transistor in the memory cell area 1A, which are to be formed later. Further, in the peripheral circuit area 1C, the $n^-$ type semiconductor region EX and the $n^+$ type semiconductor region DF formed in the upper surface of the semiconductor substrate SB located laterally of the dummy gate electrode DG configure the source-drain region of the low breakdown voltage MISFET in the peripheral circuit area 1C, which is to be formed later. The $n^+$ type semiconductor regions DF in the memory cell area 1A and the peripheral circuit area 1C can be formed in the same ion implantation process, but can also be formed in different ion implantation processes.

Incidentally, since the control transistor is a memory cell selecting transistor, it can also be assumed to be a selection transistor. Therefore, the control gate electrode CG can also be assumed to be a selection gate electrode. The memory transistor is a storing transistor.

Subsequently, activation annealing corresponding to a heat treatment for activating the impurities introduced into the semiconductor regions ($n^-$ type semiconductor region EX and $n^+$ type semiconductor region DF) for the source and drain, etc. is carried out.

Next, a silicide layer S1 is formed. The silicide layer S1 can be formed by performing a so-called salicide (SelfAlignedSilicide) process. Specifically, the silicide layer S1 can be formed in the following manner.

That is, a metallic film for the formation of the silicide layer S1 is formed (deposited) over the entire main surface of the semiconductor substrate SB including over the upper surface of the $n^+$ type semiconductor region DF and over the upper surface of the dummy memory gate electrode DM. The metallic film, a signal metallic film (pure metallic film) or an alloy film can be used. This is comprised of, for example, a cobalt (Co) film, a nickel (Ni) film, or a nickel platinum alloy film and can be formed by using a sputtering method or the like.

Then, a heat treatment (heat treatment for the formation of the silicide layer S1) is performed on the semiconductor substrate SB to thereby allow the respective surface layer portions of the $n^+$ type semiconductor region DF and the dummy memory gate electrode DM to react with the metallic film. Thus, the silicide layer S1 is formed at the upper parts of the $n^+$ type semiconductor region DF and the dummy memory gate electrode DM. Thereafter, the unreacted metallic film is removed by the wet etching or the like to obtain a structure shown in FIG. 12.

The silicide layer S1 can be taken to be, for example, a cobalt silicide layer, a nickel silicide layer or a nickel platinum silicide layer. Incidentally, since the upper surface of the dummy control gate electrode DC is covered by the insulating film IF7 used as a cap film, no silicide layer S1 is formed at the upper part of the dummy control gate electrode DC. Likewise, since the upper part of the silicon film PS1 in the capacitive element area 1B and the upper part of the dummy gate electrode DG in the peripheral circuit area 1C are also covered with the cap film, no silicide layer S1 is formed at the upper parts of those electrodes.

Figure 13:
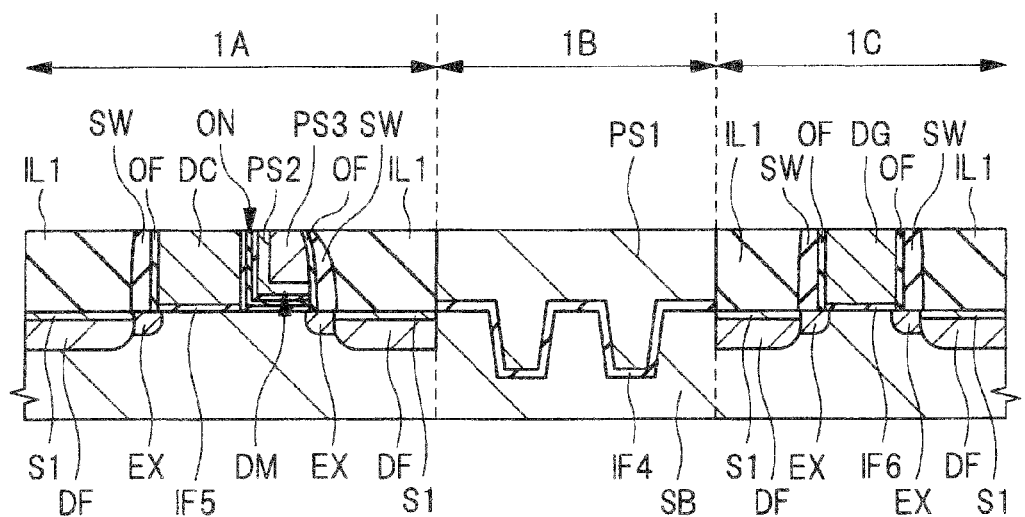
FIG. 13 is a sectional diagram in the manufacturing process of the semiconductor device, following FIG. 12.

Next, as shown in FIG. 13, an interlayer insulating film IL1 is formed over the entire main surface of the semiconductor substrate SB so as to cover the dummy control gate electrode DC, the dummy memory gate electrode DM, and the sidewalls SW. The interlayer insulating film IL1 is comprised of, for example, a single film as a silicon oxide film and can be formed by using the CVD method or the like, for example. The interlayer insulating film IL1 is formed with a thickness thicker than that of the dummy control gate electrode DC, for example.

Subsequently, the upper surface of the interlayer insulating film IL1 is polished by using the CMP method or the like. Thus, the respective upper surfaces of the dummy control gate electrode DC, the dummy memory gate electrode DM, the silicon film PS1 in the capacitive element area 1B, and the dummy gate electrode DG in the peripheral circuit area 1C are exposed. That is, in this polishing process, the interlayer insulating film IL1 is polished until the upper surfaces of the dummy control gate electrode DC, the dummy memory gate electrode DM, the silicon film PS1, and the dummy gate electrode DG are exposed. Consequently, the insulating film IF7 is removed, and the upper parts of the offset spacers OF and the sidewalls SW are also partly removed.

Figure 14:
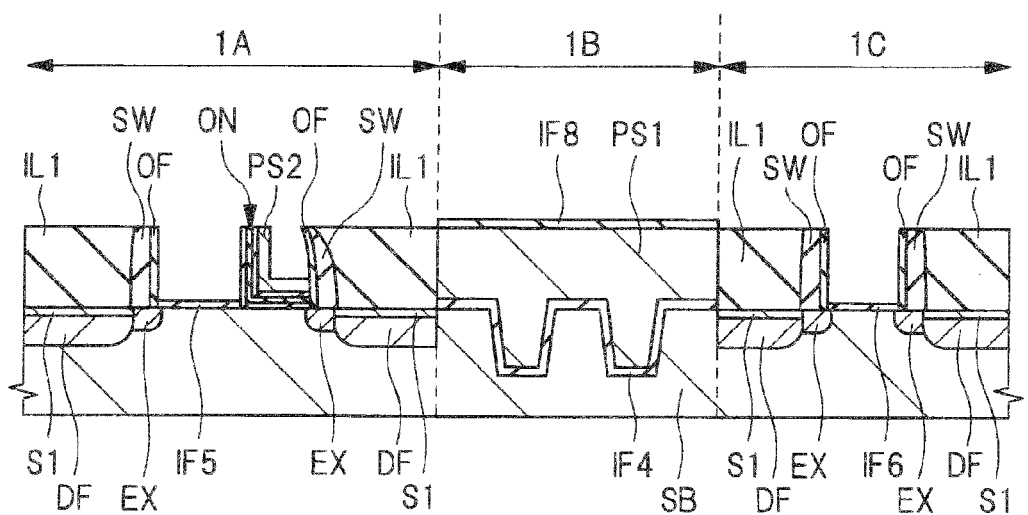
FIG. 14 is a sectional diagram in the manufacturing process of the semiconductor device, following FIG. 13.

Next, as shown in FIG. 14, the dummy control gate electrode DC, the silicon film PS3, and the dummy gate electrode DG are removed by etching. That is, such an insulating film IF8 as to cover the silicon film PS1 in the capacitive element area 1B and expose the dummy control gate electrode DC, the silicon film PS3, and the dummy gate electrode DG without covering them is formed over the interlayer insulating film IL1. The insulating film IF8 is formed by, for example, forming an insulating film comprised of, for example, a silicon oxide film or a silicon nitride film over the semiconductor substrate SB by using the CVD method or the like and thereafter processing the insulating film by using the photolithography technique and the etching method.

Thereafter, the insulating film IF8 is used as a mask and wet etching is performed by an alkaline aqueous solution to thereby remove the dummy control gate electrode DC, the silicon film PS3, and the dummy gate electrode DG. As the alkaline aqueous solution, for example, aqueous ammonia ($NH_4OH$) is used. Thereafter, the insulating film IF8 is removed.

Since, at this time, the silicon film PS2 being the $p^+$ type semiconductor region which configures the dummy memory gate electrode DM (refer to FIG. 13) is hardly soluble in the alkaline aqueous solution, it remains without being removed. This is considered to occur because since the transfer of electrons occurs in the reaction that takes place upon etching, a p-type semiconductor film containing a lots of holes has the property of being hard to be removed with respect to the alkaline aqueous solution or the like as compared with an n-type semiconductor film or an intrinsic semiconductor film containing a lot of electrons. Thus, since the p-type semiconductor film becomes slower in etching rate than the n-type semiconductor film or the like, the silicon film PS2 remains without being removed in the above wet etching. This difference in the etching rate occurs similarly not only in the case where the wet etching is carried out, but also in the case where the dry etching is performed.

Therefore, one sidewall of the ONO film ON having contacted the sidewall of the dummy control gate electrode DC, i.e., the ONO film ON extending in the direction perpendicular to the main surface of the semiconductor substrate SB is exposed by the above wet etching, whereas the silicon film PS2 is in contact with the other sidewall. Since the upper surface and sidewall of the ONO film ON covered with the dummy memory gate electrode DM remain covered with the silicon film PS2 through before and after the above wet etching, they are not subjected to a chemical solution for wet etching.

Since the dummy control gate electrode DC, the silicon film PS3, and the dummy gate electrode DG are removed, trenches (concave portions, recesses) are formed over the insulating film IF5, the silicon film PS2, and the insulating film IF6. Since the silicon film PS1 in the capacitive element area 1B is covered by the insulating film IF8, it is not removed.

The trench formed over the insulating film IF5 being the gate insulating film in the memory cell area 1A is a region from which the dummy control gate electrode DC has been removed. The sidewalls on both sides of the trench are configured by the offset spacers OF. The trench formed over the silicon film PS2 in the memory cell area 1A is a region from which the silicon film PS3 has been removed. One sidewall of the trench is configured by the offset spacer OF, and the other sidewall thereof is configured by the sidewall of the silicon film PS2. The trench formed over the insulating film IF6 corresponding to the gate insulating film in the peripheral circuit area 1C is a region from which the dummy gate electrode DG has been removed. The sidewalls on both sides of the trench are configured by the offset spacers OF.

Figure 15:
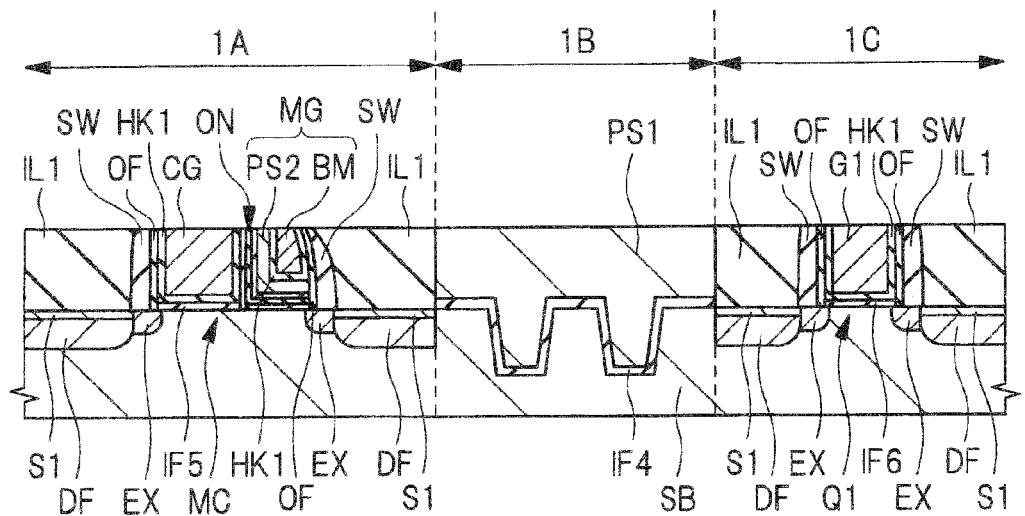
FIG. 15 is a sectional diagram in the manufacturing process of the semiconductor device, following FIG. 14.

Next, as shown in FIG. 15, an insulating film HK1 is formed over the semiconductor substrate SB, i.e., the interlayer insulating film IL1 including over the inner surface (bottom face and sidewalls) of each of the above trenches. After that, a metallic film is formed over the semiconductor substrate SB, i.e., the insulating film HK1 as a conductive film for each gate electrode so as to completely fill the respective trenches.

In the process of forming the insulating film HK1, the insides of the above trenches are not completely filled up. The trenches are brought into a state of being completely filled up by forming the above metallic film. Further, the metallic film is formed even over the interlayer insulating film IL1.

The insulating film HK1 is an insulating film for the gate insulating film. The metallic film is a conductive film for the gate electrode. Specifically, the insulating film HK1 serve as both the insulating film for the gate insulating film of the control transistor formed in the memory cell area 1A, and the gate insulating film of the low breakdown voltage MISFET formed in the peripheral circuit area 1C. Further, the insulating film HK1 covers the upper surface of the silicon film PS2 in the memory cell area 1A, the sidewall of the silicon film PS2 related to a portion extending in the direction substantially perpendicular to the main surface of the semiconductor substrate SB along the sidewall of the ONO film ON, i.e., the sidewall thereof not in contact with the ONO film ON, and the sidewall of the offset spacer OF opposite to the sidewall. That is, inside the trench formed over the silicon film PS2, the insulating film HK1 covers the sidewall and bottom face of the silicon film PS2, and the sidewall of the offset spacer OF.

The insulating film HK1 is an insulating material film, a so-called a high-k film (high permittivity film) higher in permittivity (specific permittivity) than both of the silicon oxide and the silicon nitride. Incidentally, when the insulating film HK1 refers to the high-k film and the high permittivity film in the present application, it means a film higher in permittivity (specific permittivity) than the silicon nitride.

As the insulating film HK1, a metal oxide film such as a hafnium oxide film, a zirconium oxide film, an aluminum oxide film, a tantalum oxide film or a lanthanum oxide film can be used. Further, these metal oxide films can also contain one or both of nitrogen (N) and silicon (Si). The insulating film HK1 can be formed by, for example, an ALD (Atomic layer Deposition) method or the like. The thickness of the insulating film HK1 is 1.5 nm, for example. There can be obtained an advantage that since the physical thickness of the gate insulating film can be increased when the high permittivity film (insulating film HK1 herein) is used as the gate insulating film, as compared with the case where the silicon oxide film is used, a leakage current can be reduced.

As the above metallic film, there can be used, for example, a metallic film such as a titanium nitride (TiN) film, a tantalum nitride (TaN) film, a tungsten nitride (WN) film, a titanium carbide (TiC) film, a tantalum carbide (TaC) film, a tungsten carbide (WC) film, a carbide nitride tantalum (TaCN) film, a titanium (Ti) film, a tantalum (Ta) film, a titanium aluminum (TiAl) film or an aluminum (Al) film. Further, the metallic film may be configured of a laminated film of these. Incidentally, the metallic film mentioned herein refers to a conductive film indicative of metallic conduction and includes not only a single metallic film (pure metallic film) or an alloy film, but also a metallic compound film indicative of metallic conduction. The metallic film can be formed by using the sputtering method or the like, for example.

Here, for example, the metallic film is comprised of a laminated film of the titanium nitride (TiN) film and the aluminum (Al) film provided over the titanium nitride film. At this time, the aluminum film is preferably made thicker than the titanium nitride film. Since the aluminum film is low in resistance, it is capable of reducing in resistance, a control gate electrode CG, a memory gate electrode MG, and a gate electrode G1 to be formed later.

Thereafter, the unnecessary metallic film and insulating film HK1 lying outside the trenches are removed by the CMP method or the like to thereby embed the insulating film HK1 and the metallic film in each trench. Thus, the control gate electrode CG is formed by the metallic film embedded in the trench over the insulating film IF5 in the memory cell area 1A. Further, the memory gate electrode MG is formed by the metallic film BM embedded in the trench over the silicon film PS2 in the memory cell area 1A and the silicon film PS2. The gate electrode G1 is formed by the metallic film embedded in the trench over the insulating film IF6 in the peripheral circuit area 1C. A gate length of the memory gate electrode MG is about 40 nm, for example.

Thus, a memory cell MC including the control transistor and the memory transistor is formed in the memory cell area 1A. A low breakdown voltage MISFETQ1 is formed in the peripheral circuit area 1C.

That is, the control gate electrode CG and the pair of source-drain regions formed in the upper surface of the semiconductor substrate SB located laterally of the control gate electrode CG configure the control transistor in the memory cell area 1A. Further, the insulating film HK1 and the insulating film IF5 located immediately under the control gate electrode CG configure the gate insulating film of the control transistor. Furthermore, in the memory cell area 1A, the memory gate electrode MG and the pair of source-drain regions formed in the upper surface of the semiconductor substrate SB located laterally of the memory gate electrode MG configure the memory transistor. In addition, the ONO film ON located below the memory gate electrode MG configures the gate insulating film of the memory transistor.

Thus, the control transistor and the memory transistor share the pair of source-drain regions. The memory cell MC is configured by the control transistor and the memory transistor.

Further, in the peripheral circuit area 1C, the gate electrode G1 and the pair of source-drain regions formed in the upper surface of the semiconductor substrate SB located laterally of the gate electrode G1 configure the low breakdown voltage MISFETQ1. The insulating film HK1 and the insulating film IF6 located immediately under the gate electrode G1 configure the gate insulating film of the MISFETQ1. Each of the control gate electrode CG and the gate electrode G1 is a metal gate electrode. The memory gate electrode MG is a gate electrode configured of a combination of the gate electrode comprised of polysilicon and the metal gate electrode comprised of the metallic film BM.

In the present embodiment, the dummy control gate electrode DC is removed to be replaced with the control gate electrode CG. The control gate electrode CG is used as the gate electrode of the control transistor in the memory cell area 1A. Therefore, the above dummy control gate electrode DC is a dummy gate electrode (pseudo gate electrode) and can be assumed to be a substitution gate electrode. Likewise, the dummy gate electrode DG is also a dummy gate electrode (pseudo gate electrode) and can be assumed to be a substitution gate electrode.

Further, in the present embodiment, the control gate electrode CG and the gate electrode G1 are formed by using the metallic film. The respective electrodes are configured as the metal gate electrodes. Therefore, there can be obtained an advantage that it is possible to suppress a depletion phenomenon of each of the control gate electrode CG and the gate electrode G1 and eliminate a parasitic capacitance. There can also be obtained an advantage that the memory element and the transistor element can also be reduced in size (the gate insulating film can be made thin). Likewise, there can be obtained an advantage that since the metallic film BM is used as part of the memory gate electrode MG herein, it is possible to suppress a depletion phenomenon of the memory gate electrode MG and reduce a parasitic capacitance. There is also obtained an advantage that a size reduction in the memory element is also made possible.

In the memory cell area 1A, the control gate electrode CG is formed whose bottom face and sidewalls are adjacent to the insulating film HK1 over the insulating film IF5. That is, the insulating film IF5 and the insulating film HK1 are interposed between the control gate electrode CG and the semiconductor substrate SB. At least the insulating film HK1 is interposed between the control gate electrode CG and the sidewall SW. The insulating film HK1 and the ONO film ON are interposed between the control gate electrode CG and the memory gate electrode MG. The insulating films IF5 and HK1 located immediately under the control gate electrode CG function as the gate insulating film of the control transistor.

In the peripheral circuit area 1C, the gate electrode G1 is formed whose bottom face and sidewalls are adjacent to the insulating film HK1 over the insulating film IF6. That is, the insulating film IF6 and the insulating film HK1 are interposed between the gate electrode G1 and the semiconductor substrate SB. At least the insulating film HK1 is interposed between the gate electrode G1 and the sidewall SW. The insulating films IF6 and HK1 located immediately under the gate electrode G1 function as the gate insulating film of the MISFETQ1.

Figure 16:
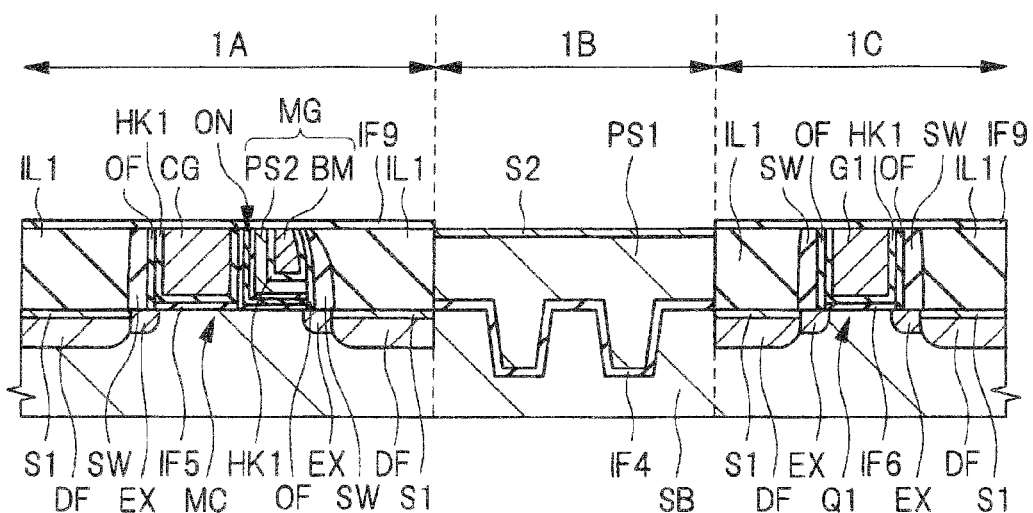
FIG. 16 is a sectional diagram in the manufacturing process of the semiconductor device, following FIG. 15.

Next, as shown in FIG. 16, a pattern of an insulating film IF9 which covers the memory cell area 1A and the peripheral circuit area 1C is formed by using the photolithography technique and the etching method. The insulating film IF9 is an insulating film which exposes the upper surface of the silicon film PS1 in the capacitive element area 1B and covers the control gate electrode CG, the metallic film BM, and the gate electrode G1. The insulating film IF9 is comprised of, for example, a silicon oxide film or the like.

Subsequently, a silicide layer S2 is formed in the upper surface of the silicon film PS1 in the capacitive element area 1B by using the known salicide process. The silicide layer S2 can be assumed to be, for example, a cobalt silicide layer, a nickel silicide layer or a nickel platinum silicide layer. In the salicide process, a process of removing the extra metallic film which did not react with the semiconductor film (silicon film PS1 herein) by a chemical solution is carried out. Since, at this time, the control gate electrode CG, the metallic film BM, and the gate electrode G1 each comprised of the metal are covered with the insulating film IF9, they are not subjected to the chemical solution and removed. Thereafter, the insulating film IF9 is removed.

Thus, it is possible to form the silicide layer S2 in the upper surface of the silicon film PS1 used as the upper electrode of the capacitive element while preventing the control gate electrode CG, the metallic film BM, and the gate electrode G1 from being removed, and reduce a coupling resistance between each contact plug to be formed in a subsequent process and the silicon film PS1. Incidentally, it is considered that in this process, the silicide layer S2 is formed over the upper surface of the silicon film PS2. Since it is however difficult to form a mask for exposing only the upper surface of the silicon film PS2 and covering the upper surfaces of the control gate electrode CG and the metallic film BM adjacent to the silicon film PS2 for the purpose of preventing the control gate electrode CG and the metallic film BM from being removed by the chemical solution, the silicide layer S2 is not formed in the upper surface of the silicon film PS2.

Next, as shown in FIGS. 17 to 19, an interlayer insulating film and a plurality of contact plugs are formed. A plan layout of the memory cell in the present embodiment, which includes a power feeding area 1D for feeding power to the memory gate electrode MG configuring the memory cell, is shown in FIG. 17. FIG. 18 is a sectional diagram showing the same part as the cross-section shown in FIG. 16. A cross-section of the memory cell area 1A shown in FIG. 18 is a cross-section taken along line A-A shown in FIG. 17. Further, FIG. 19 is a diagram showing a cross-section of the power feeding area 1D, which is taken along line B-B shown in FIG. 17.

In the process of forming the above interlayer insulating film and contact plugs, an interlayer insulating film IL2 which covers the entire upper surface of the semiconductor substrate SB including the memory cell area 1A, the capacitive element area 1B, and the peripheral circuit area 1C is first formed by using the CVD method, for example, as shown in FIG. 18. The interlayer insulating film IL2 is comprised of, for example, a silicon oxide film and covers the respective upper surfaces of the control gate electrode CG, the memory gate electrode MG, the silicon film PS1, the gate electrode G1, and the interlayer insulating film IL1.

Subsequently, the interlayer insulating films IL1 and IL2 are dry-etched with a photoresist pattern (not shown) formed over the interlayer insulating film IL2 by using the photolithography technique as an etching mask to thereby form contact holes (openings, through holes) in the interlayer insulating films IL1 and IL2 in plural form.

Then, a plurality of conductive contact plugs CP each comprised of tungsten (W) are respectively formed in the contact holes as coupling conductors. In order to form each contact plug CP, for example, a barrier conductor film (titanium film, titanium nitride film or laminated film of these) is formed over the interlayer insulating film IL2 containing the inside of each contact hole. Thereafter, a main conductor film comprised of a tungsten film or the like is formed over the barrier conductor film so as to completely fill each contact hole, and then main conductor film and barrier conductor film unnecessary outside each contact hole are removed by the CMP method or the etchback method or the like, thereby making it possible to form the contact plugs CP. Incidentally, for simplification of the drawings, the barrier conductor film and the main conductor film (tungsten film) which configure each contact plug CP are integrated together and shown in FIGS. 18 and 19.

The contact plugs CP embedded in the contact holes are formed to be coupled to the upper parts of the $n^+$ type semiconductor regions DF, the control gate electrode CG, the memory gate electrode MG, the silicon film PS1, and the gate electrode G1, etc. At the bottom of each contact hole, part of the main surface of the semiconductor substrate SB, e.g., part of the silicide layer S1 over the surface of each $n^+$ type semiconductor region DF, part of the control gate electrode CG, part of the memory gate electrode MG, part of the silicide layer S2 over the surface of the silicon film PS1, or part of the gate electrode G1, etc. are exposed. Incidentally, in the sectional diagram of FIG. 18, there are shown cross-sections in which part of the silicide layer S1 over the surface of each $n^+$ type semiconductor region DF and part of the silicide layer S2 over the surface of the silicon film PS1 are exposed at the bottoms of the contact holes, and the contact plugs CP for filling up the those contact holes and the $n^+$ type semiconductor regions DF are electrically coupled.

A description will be made here about the layout of the memory cell and the coupling state of each plug in the power feeding area for the memory cell, using FIG. 17 and FIG. 19. Illustrations of the semiconductor substrate, the semiconductor region formed in the upper surface of the semiconductor substrate, the silicide layer, and the element isolation region are omitted in FIG. 17. Further, there are not shown in FIG. 17, the insulating films HK1 (refer to FIG. 18 and FIG. 19) which interpose the control gate electrode CG and the memory gate electrode MG as seen in plan view.

As shown in FIG. 17, a first pattern including the control gate electrode CG and the memory gate electrode MG adjacent to each other extends in a gate width direction, i.e., in a depth direction of FIG. 18. In the present direction, the power feeding area 1D extends over the semiconductor substrate side by side with the memory cell area 1A. A second pattern including the control gate electrode CG and the memory gate electrode MG formed in the power feeding area 1D has a shape different from that of the first pattern in the memory cell area 1A.

In the memory cell area 1A, the first pattern configured of the control gate electrode CG, the memory gate electrode MG, and the ONO film ON extends in the gate width direction. In a gate length direction perpendicular to the corresponding direction, the source-drain regions (not shown) are provided so as to interpose the first pattern therebetween. The source-drain regions extend in the gate width direction. Further, the contact plugs are arranged in a pair in the gate length direction so as to interpose the first pattern therebetween. Those contact plugs are respectively coupled to the source-drain regions. In the memory cell area 1A, the control gate electrode CG, the insulating film HK1 (not shown), the ONO film ON, the silicon film PS2, the insulating film HK1 (not shown), and the metallic film BM are arranged in order in the gate length direction.

A second pattern including the first pattern extending in the above-described manner and a third pattern corresponding to a portion which protrudes in the gate length direction from one of the sidewalls of the first pattern is formed in the power feeding area 1D. The third pattern includes the semi-control gate electrode CG, the ONO film ON, and the memory gate electrode MG in a manner similar to the first pattern.

The first pattern has two sidewalls extending along the gate width direction. The first pattern has the memory gate electrode MG on one sidewall side and the control gate electrode CG on the other sidewall side. The third pattern is formed to protrude to the side of the sidewall formed with the memory gate electrode MG, of the two sidewalls of the first pattern. The third pattern has an annular pattern configured of the metallic film BM, which includes part of the metallic film BM in the first pattern. The annular silicon film PS2, the annular ONO film ON, and the control gate electrode CG are formed inside the annular pattern in order from the metallic film BM side.

That is, in the power feeding area 1D, the memory gate electrode MG in the first pattern extending in the gate width direction is interposed by the two control gate electrodes CG in the gate length direction. That is, in the power feeding area 1D, the control gate electrode CG is formed adjacent to the sidewall on the memory gate electrode MG side, of the sidewalls of the first pattern. The third pattern corresponding to the protruded pattern is configured by this control gate electrode CG, and the ONO film ON and the memory gate electrode MG which surround the periphery of this control gate electrode CG. Thus, the control gate electrode CG in the annular memory gate electrode MG which configures the third pattern is insulated from the control gate electrode CG and the memory gate electrode MG which configure the first pattern.

In order to form such a structure, two dummy control gate electrodes DC adjacent to the power feeding area 1D are formed in the process described using FIG. 4. Thereafter, the dummy memory gate electrodes DM around the two dummy control gate electrodes DC adjacent to each other in the power feeding area 1D are left without being removed in the process described using FIG. 9. At this time, the dummy memory gate electrode DM embedded between the two dummy control gate electrodes DC adjacent to each other in the power feeding area 1D is also left behind. Thereafter, the structure of the power feeding area 1D shown in FIGS. 17 and 19 can be obtained by substituting each dummy gate electrode with the metal gate electrode.

The power feeding area 1D is an area to form the contact plug CP for feeding a potential to the memory gate electrode MG. The contact plug CP is formed so as to overlap with the silicon film PS2 and the metallic film BM configuring the third pattern in plan view. That is, the contact plug CP in the power feeding area 1D extends in the gate width direction. One contact plug CP is coupled across the insulating film HK1 (refer to FIG. 19) to both of the silicon film PS2 and the metallic film BM which configure the memory gate electrode MG. Incidentally, while the contact plug CP is considered to overlap with the control gate electrode CG and the ONO film ON configuring the third pattern in plan view as shown in FIG. 17, it does not overlap in plan view with the control gate electrode CG which configures the first pattern and extends in the gate width direction.

Further, although not shown in the drawing, a power feeding part for the control gate electrode CG which configures the first pattern is provided at the end of the control gate electrode CG in the gate width direction. That is, although omitted in the drawing, each contact plug is coupled to the upper surface of the control gate electrode CG at the end in the extending direction of the first pattern.

As shown in FIG. 19, the element isolation region including the insulating film IF3 has been formed over the semiconductor substrate SB in the power feeding area 1D. The third pattern including the control gate electrode CG and the memory gate electrode MG has been formed over the element isolation region. The insulating film IF5, the control gate electrode CG, and the insulating film HK1 provided therebetween in the power feeding area 1D have a structure similar to that for the insulating film IF5, the control gate electrode CG, and the insulating film HK1 provided therebetween in the memory cell area 1A shown in FIG. 18. However, as seen in the direction along the cross-section shown in FIG. 19, i.e., the extending direction of the control gate electrode CG in the memory cell area 1A, the lateral width of the control gate electrode CG in the power feeding area 1D is larger than the gate length of the control gate electrode CG shown in FIG. 18.

Further, the ONO film ON, the insulating film HK1, the offset spacer OF, the sidewall SW, and the memory gate electrode MG comprised of the silicon film PS2 and the metallic film BM in the power feeding area 1D are similar in structure to the ONO film ON, the insulating film HK1, the offset spacer OF, the sidewall SW, and the memory gate electrode MG comprised of the silicon film PS2 and the metallic film BM shown in the memory cell area 1A of FIG. 18. However, the structure including the memory gate electrode MG is different from that in the memory cell area 1A and formed adjacent to both sidewalls of the control gate electrode CG. Incidentally, in FIG. 19, the structure on one sidewall side of the control gate electrode CG is not shown in FIG. 19.

One contact plug CP electrically coupled to the memory gate electrode MG in the power feeding area 1D is in contact with part of the upper surface of the control gate electrode CG of the third pattern, and the upper surfaces of the insulating film HK1, the ONO film ON, the silicon film PS2, the insulating film HK1, the metallic film BM, the offset spacer OF, and the sidewall SW, and is formed with a relatively broad width. Thus, one contact plug CP is coupled across the insulating film HK1 to both the silicon film PS2 and the metallic film BM which configure the memory gate electrode MG. That is, the voltage is applied through the contact plug CP of the power feeding area 1D to both the silicon film PS2 and the metallic film BM which configure the memory gate electrode MG in the memory cell area 1A shown in FIG. 17.

Incidentally, since the control gate electrode CG in the power feeding area 1D and the control gate electrode CG shown in the memory cell area 1A in FIGS. 17 and 18 are insulated from each other even if the contact plug CP for power feeding to the memory gate electrode MG is coupled to the control gate electrode CG in the power feeding area 1D, the memory gate electrode MG and the control gate electrode CG in the memory cell area 1A are not short-circuited.

Further, since the third pattern is formed over the element isolation region even if the contact plug CP in the power feeding area 1D is formed outside of the third pattern in plan view, i.e., outside from the sidewall SW, part of the contact plug CP is coupled to the upper surface of the element isolation region. Thus, it is possible to prevent the contact plug CP for the power feeding to the memory gate electrode MG from being electrically coupled to the semiconductor substrate SB. Thus, since it is easy to form the contact plug CP wide in width, the power feeding contact plug CP can be more reliably coupled to the memory gate electrode MG.

Thereafter, although omitted in the drawing, a first wiring layer including a first layer wiring is formed over the interlayer insulating film IL2 in which the contact plug CP is embedded. This wiring can be formed by using a damascene technique. The first wiring layer has an interlayer insulating film and a first layer wiring which penetrates the interlayer insulating film. A plurality of first layer wirings are coupled to the upper surface of each contact plug CP shown in FIGS. 17 to 19. Thereafter, a second wiring layer, a third wiring layer, etc. are formed over the first wiring layer in order to form a laminated wiring layer. After that, the semiconductor wafer is individualized by a dicing process to obtain a plurality of semiconductor chips.

The semiconductor device according to the present embodiment is manufactured in the above-described manner. As described above, in the manufacturing process of the semiconductor device according to the present embodiment, the control gate electrode CG, the metallic film BM corresponding to part of the memory gate electrode MG, and the gate electrode G1 are formed by a so-called gate last process. Further, the insulating film HK1 as the high-k film is also formed to be embedded in each trench together with each gate electrode in the gate last process. That is, the insulating film HK1 is not formed at the time of formation of each dummy gate electrode. After the removal of the dummy gate electrode, the insulating film HK1 is formed at part of the spot where the dummy gate electrode has been formed.

<Structure of Semiconductor Device According to the Present Embodiment>

The memory cell MC of the semiconductor device according to the present embodiment includes the control transistor and the memory transistor as shown in the memory cell area 1A of FIG. 18. The control gate electrode CG corresponding to the metal gate electrode which configures the control transistor is formed over the semiconductor substrate SB through the insulating film IF5 as the gate insulating film and the insulating film HK1 as the high-k film which forms the gate insulating film. The insulating film HK1 is formed over the insulating film IF5. The bottom face of the control gate electrode CG and the sidewalls on both sides thereof is covered by the insulating film HK1.

The sidewall SW is in contact with one sidewall of the laminated film comprised of the insulating films IF5 and HK1 and the control gate electrode CG through the offset spacer OF. The memory gate electrode MG is not formed on the one sidewall. The memory gate electrode MG is formed on the other sidewall through the ONO film ON. Further, part of the ONO film ON which comes into contact with the upper surface of the semiconductor substrate SB extends along the upper surface of the semiconductor substrate SB.

That is, the ONO film ON comes into contact with one sidewall of the laminated film. The bottom of the ONO film ON extends along the upper surface of the semiconductor substrate SB located laterally of the laminated film. That is, the ONO film ON has an L-shaped sectional shape at a cross-section extending along the direction perpendicular to the gate length directions of the control gate electrode CG and the memory gate electrode MG and the main surface of the semiconductor substrate SB. In other words, the ONO film ON is continuously formed from the region between the memory gate electrode MG and the control gate electrode CG to the region between the memory gate electrode MG and the semiconductor substrate SB.

The memory gate electrode MG is formed on one sidewall of the laminated film including the control gate electrode CG through the ONO film ON interposed therebetween. Further, the memory gate electrode MG is formed over the upper surface of the semiconductor substrate SB located laterally of the laminated film through the ONO film ON. In other words, the ONO film ON is interposed between the memory gate electrode MG and the control gate electrode CG and between the memory gate electrode MG and the upper surface of the semiconductor substrate SB respectively. Of the metallic film BM and the $p^+$ type silicon film PS2 which configure the memory gate electrode MG, only the silicon film PS2 comes in contact with the ONO film ON.

That is, the silicon film PS2 has a sectional shape L-shaped at the above cross-section in a manner similar to the ONO film ON. In other words, the silicon film PS2 is continuously formed from the region between the metallic film BM and the control gate electrode CG to the region between the metallic film BM and the semiconductor substrate SB.

The insulating film HK1 used as the high-k film is interposed between the metallic film BM and the silicon film PS2. The metallic film BM and the silicon film PS2 are not in contact with each other. The bottom face and sidewalls of the metallic film BM are covered by the insulating film HK1. That is, the insulating film HK1, the ONO film ON, the silicon film PS2, the insulating film HK1, and the metallic film BM are formed on one sidewall side of the control gate electrode CG in order from the control gate electrode CG side. Further, the ONO film ON, the silicon film PS2, the insulating film HK1, and the metallic film BM are formed over the semiconductor substrate SB located laterally of the control gate electrode CG in order from the semiconductor substrate SB side.

The metallic film BM and the silicon film PS2 which configure the memory gate electrode MG are electrically coupled to each other through the contact plug CP formed from the upper surface of the metallic film BM to the upper surface of the silicon film PS2 in the power feeding area 1D as shown in FIG. 19. Incidentally, no silicide layer is formed over the upper surfaces of the control gate electrode CG, the silicon film PS2, and the metallic film BM.

The sidewall SW comes close to the sidewall through the offset spacer OF, which is one sidewall of the laminated film comprised of the ONO film ON, the silicon film PS2, the insulating film HK1, and the metallic film BM and is located on the side opposite to the control gate electrode CG side.

The pairs of source-drain regions are formed in the main surface of the semiconductor substrate SB on both sides at the side of the structure including the control gate electrode CG, the ONO film ON, and the memory gate electrode MG. Each of the pairs of source-drain regions has the n⁻ type semiconductor region EX taken as the extension region and the n⁺ type semiconductor region DF taken as the impurity diffusion region. The n⁻ type semiconductor region EX is formed in the main surface of the semiconductor substrate SB, which is located in the region closer to the structure than the n⁺ type semiconductor region DF. The contact plug CP is coupled via the silicide layer S1 to the upper surface of the n⁺ type semiconductor region DF. The contact plug CP is a coupling metallic film which penetrates the interlayer insulating film IL1 and the interlayer insulating film IL2 provided over the interlayer insulating film IL1.

A main feature of the semiconductor device according to the present embodiment resides in that, for example, the control gate electrode CG is the metal gate electrode, the memory gate electrode MG has the p⁺ type silicon film PS2 and the metallic film BM formed over the silicon film PS2 through the insulating film HK1, and the silicon film PS2 and the metallic film BM are electrically coupled to each other through the contact plug CP (refer to FIG. 19). Further, the transistor in the peripheral circuit area 1C shown in FIG. 18 has the metal gate electrode and the high-k film. On the other hand, the silicon film PS1 corresponding to the upper electrode formed in the capacitive element area 1B is formed by a so-called gate first process and does not have the insulating film HK1 which is the high-k film.

<Regarding Operation of Nonvolatile Memory>

An example of the operation of the nonvolatile memory will next be described with reference to FIG. 20.

FIG. 20 is a table showing one example of conditions for application of voltages to each part of a selected memory cell at the time of "writing", "erasing", and "reading" in the present embodiment. A voltage Vmg applied to the memory gate electrode MG of such a memory cell as shown in FIG. 18, a voltage Vs applied to its source region, a voltage Vcg applied to the control gate electrode CG, a voltage Vd applied to its drain region, and a base voltage Vb applied to the p-type well at the upper surface of the semiconductor substrate are described in the table of FIG. 20 at the time of "writing", "erasing" and "reading". The selected memory cell mentioned herein refers to a memory cell selected as an object to perform "write", "erase" or "read".

Incidentally, those shown in the table of FIG. 20 are a suitable example descriptive of the conditions for the application of the voltages, but are not limited to it. They can be modified in various ways as needed. Further, in the present embodiment, the injection of an electron into the silicon nitride film NT (refer to FIG. 5) as the charge accumulation part in the ONO film ON of the memory transistor is defined as "write", and the injection of a hole (positive hole) therein is defined as "erase".

Further, in the table of FIG. 20, the column of A corresponds to a case where a write method is an SSI system and an erase method is a BTBT system, the column of B corresponds to a case where the write method is the SSI system and the erase method is an FN system, the column of C corresponds to a case where the write method is the FN system and the erase method is the BTBT system, and the column of D corresponds to a case where the write method is the FN system and the erase method is the FN system.

The SSI system can be assumed to be an operating method of performing writing to the memory cell by injecting hot electrons into the silicon nitride film NT. The BTBT system can be assumed to be an operating method of performing erasing of the memory cell by injecting hot holes into the silicon nitride film NT. The FN system can be assumed to be an operating method of performing writing or erasing by tunneling of electrons or holes. If the FN system is stated in another expression, the writing of the FN system can be assumed to be an operating system of performing writing to the memory cell by injecting electrons into the silicon nitride film NT by an FN tunnel effect. The erasing of the FN system can be assumed to be an operating method of performing erasing of the memory cell by injecting holes into the silicon nitride film NT by the FN tunnel effect. They will be specifically described below.

The writing method includes a writing system (hot electron injection write system) which performs writing by hot electron injection based on source side injection called a so-called SSI (Source Side Injection) system, and a write system (tunneling write system) which performs writing by FN (Fowler Nordheim) tunneling called a so-called FN system.

In the writing of the SSI system, for example, such voltages (Vmg=10V, Vs=5V, Vcg=1V, Vd=0.5V, and Vb=0V) as shown in "write operating voltage" of the column of A or B in the table of FIG. 20 are applied to each part of a selected memory cell to which writing is performed, and electrons are injected into the silicon nitride film NT in the ONO film ON of the selected memory cell to thereby perform writing.

At this time, the hot electrons are generated in a channel region (between the source and drain) below between the two gate electrodes (memory gate electrode MG and control gate electrode CG). The hot electrons are injected into the silicon nitride film NT corresponding to the charge accumulation part in the ONO film ON below the memory gate electrode MG. The injected hot electrons (electrons) are captured in trap levels in the silicon nitride film NT in the ONO film ON. As a result, the threshold voltage of the memory transistor rises. That is, the memory transistor is brought into a write state.

In the writing of the FN system, such voltages (Vmg=−12V, Vs=0V, Vcg=0V, Vd=0V, and Vb=0V) as shown in "write operating voltage" of the column of C or D in the table of FIG. 20, for example, are applied to each part of the selected memory cell to which writing is performed. In the selected memory cell, electrons are tunneled from the memory gate electrode MG so as to be injected into the silicon nitride film NT in the ONO film ON, whereby the writing is performed. At this time, the electrons are tunneled through the silicon oxide film OX2 (refer to FIG. 5) from the memory gate electrode MG by the FN tunneling (FN tunnel effect) so as to be injected into the ONO film ON. Then, the electrons are captured in trap levels in the silicon nitride film NT in the ONO film ON. As a result, the threshold voltage of the memory transistor rises. That is, the memory transistor is brought into a write state.

Incidentally, in the writing of the FN system, the writing can also be performed by tunneling the electrons from the semiconductor substrate SB so as to be injected into the silicon nitride film NT in the ONO film ON. In this case, the write operating voltage can be taken to be one in which the positive/negative of "write operating voltage" of the column of C or D in the table of FIG. 20, for example, is inverted.

The erase method includes an erase system (hot hole injection erase system) which performs erasing by means of hot hole injection by BTBT (Band-To-Band Tunneling) called a so-called BTBT system, and an erase system (tunneling erase system) which performs erasing by the FN (Fowler Nordheim) tunneling called the so-called FN system.

In the erasing of the BTBT system, holes (positive holes) generated by BTBT are injected into the charge accumulation part (silicon nitride NT in the ONO film ON) to thereby perform erasing. Such voltages (Vmg=−6V, Vs=6V, Vcg=0V, Vd=open, and Vb=0V) as shown in "erase operating voltage" of the column of A or C in the table of FIG. 20, for example, are applied to each part of the selected memory cell to which erasing is performed. Thus, the holes are generated by a BTBT phenomenon and injected into the silicon nitride film NT in the ONO film ON of the selected memory cell by acceleration by an electric field, whereby the threshold voltage of the memory transistor is lowered. That is, the memory transistor is brought into an erase state.

In the erasing of the FN system, such voltages (Vmg=12V, Vs=0V, Vcg=0V, Vd=0V, and Vb=0V) as shown in "erase operating voltage" of the column of B or D in the table of FIG. 20, for example, are applied to each part of the selected memory cell to which erasing is performed. In the selected memory cell, holes are tunneled from the memory gate electrode MG and thereby injected into the silicon nitride film NT in the ONO film ON, whereby the erasing is performed. At this time, the holes tunnels through the silicon oxide film OX2 (refer to FIG. 5) from the memory gate electrode MG by the FN tunneling (FN tunnel effect) and are injected into the ONO film ON. Then, the holes are captured in trap levels in the silicon nitride film NT in the ONO film ON. As a result, the threshold voltage of the memory transistor is lowered. That is, the memory transistor is brought into an erase state.

Incidentally, in the writing of the FN system, the erasing can also be performed by tunneling the holes from the semiconductor substrate SB so as to be injected into the silicon nitride film NT in the ONO film ON. In this case, the erase operating voltage can be taken to be one in which the positive/negative of "erase operating voltage" of the column of B or D in the table of FIG. 20, for example, is inverted.

At the time of reading, such voltages as shown in "read operating voltage" of the column A, B, C or D in the table of FIG. 20, for example, are applied to each part of a selected memory cell to which reading is performed. The write state and the erase state can be determined by setting the voltage Vmg applied to the memory gate electrode MG at the time of reading to a value between the threshold voltage of the memory transistor in the write state and the threshold voltage thereof in the erase state.

<Advantageous Effects of Semiconductor Device According to the Present Embodiment>

As shown in FIG. 18, the semiconductor device according to the present embodiment corresponds to the semiconductor device equipped with the memory cell MC of the nonvolatile memory. The memory cell MC has the memory gate electrode MG and the control gate electrode CG.

In order to improve the performance of the semiconductor device equipped with the nonvolatile memory and or miniaturize the semiconductor device, it is effective in adopting the metal gate electrode as the gate electrode of the memory cell of the nonvolatile memory. On the other hand, when the erase system (FN system) for injecting the holes into the memory gate insulating film (corresponding to the ONO film ON) from the memory gate electrode (corresponding to the memory gate electrode MG) is adopted for the erase operation of the nonvolatile memory, it becomes easy to appropriately carry out the erase operation by adopting the p-type silicon gate electrode for the memory gate electrode. This is because since the p-type semiconductor film is higher than the n-type semiconductor film or the metallic film in terms of the existence probability of each hole there inside, the erase operation can be more reliably performed and carried out with lower power consumption.

Therefore, in the present embodiment, the memory gate electrode MG which configures the memory cell MC of the nonvolatile memory is configured not only by only the silicon film PS2 but also by the silicon film PS2 and the metallic film BM, thereby enabling the memory gate electrode MG to be miniaturized and reduced in resistance. It is thus possible to improve the performance of the semiconductor device. Further, the control gate electrode CG is configured as the metal gate electrode to thereby enable the control gate electrode CG to be miniaturized and reduced in resistance. It is thus possible to improve the performance of the semiconductor device.

Further, the part which is part of the memory gate electrode MG and comes in contact with the ONO film ON is configured by the $p^+$ type silicon film PS2. Thus, when the erase system (FN system) for injecting the holes into the ONO film ON from the memory gate electrode MG is adopted for the erase operation of the nonvolatile memory, the holes can be injected into the ONO film ON from the $p^+$ type silicon film PS2. It is therefore possible to appropriately perform the erase operation. In particular, since the memory gate electrode MG adjacent to the end on the control gate electrode CG side, of the part of the ONO film ON extending along the upper surface of the semiconductor substrate SB, i.e., the corner of the memory gate electrode MG is configured by the p-type silicon film PS2, it becomes easy to inject the holes into the ONO film ON. It is thus possible to improve the performance of the semiconductor device.

Further, since the silicon film PS2 and the metallic film BM are both small in width when the contact plug CP for the power feeding to the memory gate electrode MG of the memory cell MC is formed, it is difficult to couple the contact plug CP to only either the silicon film PS2 or the metallic film BM. Therefore, even in trying to couple the contact plug CP to only either the silicon film PS2 or the metallic film BM, a plurality of coupled states such as the contact plug CP being coupled to only the silicon film PS2, only the metallic film BM or both thereof are easy to occur due to a shift in the forming position of the contact plug CP relative to the memory gate electrode MG. Therefore, a problem arises in that the performance varies among a plurality of memory cells MC.

On the other hand, in the present embodiment, as shown in FIGS. 17 and 19, the contact plug CP for the power feeding to the memory gate electrode MG is formed with a broad width so as to cover the upper surfaces of both of the silicon film PS2 and the metallic film BM which configure the memory gate electrode MG. That is, the contact plug CP is coupled to both of the silicon film PS2 and the metallic film BM which configure the memory gate electrode MG. Therefore, it is possible to prevent the performance of each memory cell MC from varying due to the occurrence of variations in coupled states of the contact plugs CP to the memory gate electrodes MG of the memory cells MC. It is thus possible to improve the performance of the semiconductor device.

Further, when the insulating film HK1 as the high-k film is interposed between the silicon film PS2 and the metallic film BM which configure the memory gate electrode MG, a voltage drop is considered to occur when a predetermined voltage is applied to the memory gate electrode MG. Since the capacitance of the insulating film HK1 is about 10 times larger than that of the ONO film ON, a voltage drop due to the insulating film HK1 becomes 1/10 or less of the predetermined voltage applied to the memory gate electrode MG, and no problem occurs.

It is however preferable from the standpoint of the voltage drop being made smaller that the voltage is applied to both of the silicon film PS2 and the metallic film BM of the memory gate electrode MG. Accordingly, the voltage drop at the memory gate electrode MG can be suppressed by forming the contact plug CP relatively broad in width and coupling the contact plug CP to both of the silicon film PS2 and the metallic film BM as described above. It is therefore possible to improve the performance of the semiconductor device.

<Advantageous Effects of Manufacturing Method of Semiconductor Device According to the Present Embodiment>

The semiconductor device manufactured by the manufacturing method of the semiconductor device according to the present embodiment has advantageous effects similar to the semiconductor device according to the present embodiment described above. That is, it is possible to realize miniaturization of the semiconductor device, its resistance reduction, etc. by using the metallic film for the gate electrode which configures the memory cell MC. Further, the erase operation can be properly performed by using the $p^+$ type silicon film PS2 for the memory gate electrode MG. Furthermore, it is possible to suppress variations in the performance among the memory cells MC by coupling the contact plug CP to both of the silicon film PS2 and the metallic film BM.

Further, in the present embodiment, since the control gate electrode CG and the part of the memory gate electrode MG in the memory cell MC can be formed using the gate last process, the miniaturization of the semiconductor device can be made easy as compared with the case where the so-called gate first process is adopted in which the dummy gate electrode and the like are not formed. This is because in the gate last process, a pattern which is fine and high in aspect ratio can be easily formed by forming the gate electrode with being filled in the trench.

Further it is not preferable that the dummy control gate electrode DC and the dummy gate electrode DG (refer to FIG. 10) each comprised of the silicon film PS1 formed before the forming process of the ONO film ON (refer to FIG. 5) are subjected to a high temperature generated in the forming process of the ONO film ON and are respectively used as the gate electrode of the memory cell or the MISFET of the peripheral circuit area 1C, which requires high reliability. Thus, in the present embodiment, the dummy control gate electrode DC and the dummy gate electrode DG are removed, and then the control gate electrode CG and the gate electrode G1 shown in FIG. 18 are formed by using the gate last process. It is thus possible to improve the reliability of the semiconductor device.

Since there is a case where it is advantageous to configure the memory gate electrode MG by the silicon film in the erase operation of the nonvolatile memory as described above, it is considered that, for example, the control gate electrode CG is taken as the metal gate electrode formed by the gate last process and the memory gate electrode MG is taken as the silicon gate electrode formed by the gate first process. In that case, it is considered that in the process described using FIG. 8, i.e., the process of forming the sidewall-like memory gate electrode by etching, the height of the memory gate electrode is made lower than the dummy control gate electrode DC by making an extension of the etching time or the like.

If the upper surface of the memory gate electrode is covered with the interlayer insulating film IL1 even after the polishing process (refer to FIG. 13) carried out subsequently, the memory gate electrode is left without being removed in the subsequent removing process (refer to FIG. 14) of the dummy control gate electrode DC. Thus, the control gate electrode CG can be taken as the metal gate electrode, and the memory gate electrode MG can be taken as the silicon gate electrode.

Since, however, it is necessary to suppress variations in the performance of the memory gate while adjusting the height of the memory gate electrode to prevent the removal of the memory gate electrode for the purpose of separately forming the control gate electrode and the memory gate electrode by using the specific method in this way, high accuracy is required in the manufacture of the semiconductor device.

On the other hand, in the present embodiment, since it is not necessary to adjust the height of the sidewall-like dummy memory gate electrode DM with high accuracy in the etching process described using FIG. 8, the control gate electrode CG and the metallic film BM which is part of the memory gate electrode MG can be easily formed by the known gate last process. That is, since high accuracy is not required in the formation of the memory gate electrode MG, it is possible to improve the yield in the manufacturing process of the semiconductor device and improve the reliability of the semiconductor device.

Further, in the process of removing the various dummy gate electrodes, which has been described using FIG. 14, the silicon film PS2 is left in contact with the sidewall of the ONO film ON extending in the direction perpendicular to the main surface of the semiconductor substrate SB. Therefore, it is possible to prevent the occurrence of unstable states that the silicon film PS2 is not left and the ONO film ON extending in the vertical direction, of the ONO film ON small in thickness becomes easy to collapse. That is, since the silicon film PS2 supports the ONO film ON when the part of the dummy memory gate electrode DM (refer to FIG. 13) and the dummy control gate electrode DC (refer to FIG. 13) are removed, it is possible to improve the yield in the manufacturing process of the semiconductor device.

Further, the surface of the ONO film ON opposite to the area formed with the dummy memory gate electrode DM, i.e., the surface of the silicon oxide film OX2 (refer to FIG. 5) is covered by the silicon film PS2 when the various dummy gate electrodes are removed as described above (refer to FIG. 14). Accordingly, it is possible to prevent the silicon oxide film OX2 from being damaged due to the surface of the ONO film ON being subjected to the chemical solution for removing the dummy memory gate electrode DM and the like. Further, it is possible to prevent the memory cell MC from being not normally operated due to an unexpected interface level occurring in the ONO film ON and prevent the occurrence of variations in the performance between the memory cells MC due to the same. It is thus possible to improve the reliability of the semiconductor device.

Further, in the present embodiment, although the control gate electrode CG and the memory gate electrode MG which configure the memory cell MC, and the gate electrode G1 of the MISFETQ1 in the peripheral circuit area 1C are respectively configured to include the metallic film as shown in FIG. 18, it is also possible to separately form elements each having an electrode not including the metallic film and the insulating film HK1 as in the capacitive element formed in the capacitive element area 1B.

In the present embodiment, the silicon film PS1 is prevented from removal by covering the silicon film PS1 of the capacitive element area 1B by the insulating film IF8 in the process described using FIG. 14. Further, in order to form the silicide layer S2 for reducing the coupling resistance between the silicon film PS1 and the contact plug CP (refer to FIG. 18), and prevent the metal gate electrode from being removed, the memory cell area 1A and the peripheral circuit area 1C are covered by the insulating film IF9 (refer to FIG. 16). Thus, the capacitive element including the silicon film PS1 can be mixedly mounted over the semiconductor substrate SB together with other elements including the metal gate electrode formed by the gate last process. That is, the degree of freedom of each element mounted onto the semiconductor device can be improved.

Embodiment 2

Manufacturing Method of Semiconductor Device

The present embodiment will be explained using FIGS. 21 to 34, in the case where a control gate electrode, a memory gate electrode and a high-k film which configure a memory cell in a memory cell area 1A, and a gate electrode which configures a MISFET in a peripheral circuit area 1C are formed by a gate last process, and a high-k film which configures the MISFET in the peripheral circuit area 1C is formed by a gate first process. FIGS. 21 to 34 are respectively sectional diagrams for describing a manufacturing process of a semiconductor device according to the present embodiment. In FIGS. 21 to 34, a cross-section about a peripheral area 1E is shown between a capacitive element area 1B and the peripheral circuit area 1C unlike FIGS. 1 to 16 and FIG. 18. The peripheral area 1E is an area between an area including the memory cell area 1A and the capacitive element area 1B, and the peripheral circuit area 1C and is an area around the area including the memory cell area 1A and the capacitive element area 1B.

The memory cell and a capacitive element formed by the manufacturing process to be described below are respectively similar in structure to the memory cell and the capacitive element described in the embodiment 1. The MISFET in the peripheral circuit area 1C is different in structure from the MISFET in the peripheral circuit area 1C in the embodiment 1. Incidentally, the peripheral area 1E is shown in a broad width to make it easy to understand the structure over a semiconductor substrate in the peripheral area 1E in FIGS. 21 to 24. In FIGS. 25 to 34, however, the width of the peripheral area 1E is shown narrower than in FIGS. 21 to 24.

In the manufacturing method of the semiconductor device according to the present embodiment, processes similar to the processes described using FIGS. 1 to 9 are first performed. That is, as shown in FIG. 9, the dummy control gate electrode DC, the ONO film ON, and the dummy memory gate electrode DM are formed in the memory cell area 1A. The upper electrode comprised of the silicon film PS1 is formed in the capacitive element area 1B. The insulating film IF6 and the silicon film PS1 are formed in the peripheral circuit area 1C.

A description will be made here about the state of the peripheral area 1E in each process described using FIGS. 1 to 9. In the process described using FIG. 1, the insulating films IF1 and IF2 are formed in order over the semiconductor substrate SB in the peripheral area 1E. In the process described using FIG. 2, the insulating film IF2 in the peripheral area 1E is removed. In the process described using FIG. 3, the insulating film IF6 is formed in contact with the main surface of the semiconductor substrate SB in the peripheral area 1E, and the silicon film PS1 and the insulating film IF7 are laminated in order over the insulating film IF6. In the process described using FIG. 4, the laminated film in each of the memory cell area 1A and the capacitive element area 1B is processed and the insulating film IF7, the silicon film PS1, and the insulating film IF6 in the peripheral area 1E are removed, so that the main surface of the semiconductor substrate SB is exposed.

In the process described using FIG. 5, the ONO film ON and the silicon film PS2 are formed over the semiconductor substrate SB in the peripheral area 1E. In the process described using FIG. 6, the p-type impurity is implanted in the silicon film PS2 in the peripheral area 1E. In the process described using FIG. 7, the silicon film PS3 is formed over the silicon film PS2 in the peripheral area 1E. In the process described using FIG. 8, the silicon films PS3 and PS2 in the peripheral area 1E are removed. In the process described using FIG. 9, the ONO film ON in the peripheral area 1E is removed and hence the main surface of the semiconductor substrate SB is exposed.

Figure 21:
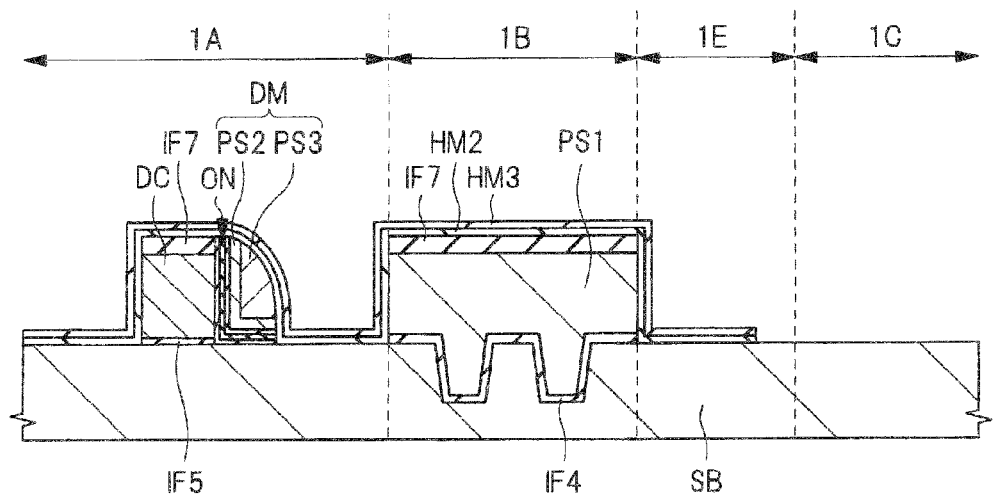
FIG. 21 is a sectional diagram in a manufacturing process of a semiconductor device showing an embodiment 2.

Next, as shown in FIG. 21, insulating films HM2 and HM3 are formed in order over the entire main surface of the semiconductor substrate SB by the CVD method, for example. The insulating film HM2 is comprised of, for example, a silicon oxide film, and the insulating film HM3 is comprised of, for example, a silicon nitride film. Thereafter, parts of the insulating films HM2 and HM3 in the peripheral area 1E and the insulating films HM2 and HM3 in the peripheral circuit area 1C are removed by using a photolithography technique and an etching method. Thus, in the peripheral area 1E, the insulating films HM2 and HM3 in the area close to the capacitive element area 1B and the memory cell area 1A are left, and the main surface of the semiconductor substrate SB is exposed in the area close to the peripheral circuit area 1C. Further, the silicon film PS1 and the insulating film IF7 in the peripheral circuit area 1C are exposed from the insulating films HM2 and HM3.

Here, the insulating films HM2 and HM3 are formed to protect the silicon film formed in each of the memory cell area 1A and the peripheral circuit area 1C. Thus, the insulating films HM2 and HM3 on the peripheral circuit area 1C side are removed with the peripheral area 1E as the boundary. Further, in the dummy control gate electrode DC and the dummy memory gate electrode DM in the memory cell area 1A, and the silicon film PS1 in the capacitive element area 1B, not only their upper surfaces but also their sidewalls are covered by the insulating films HM2 and HM3.

Thereafter, the silicon film PS1 (refer to FIG. 9) and the insulating film IF7 (refer to FIG. 9) in the peripheral circuit area 1C are removed by using the wet etching method, for example. Since, at this time, the silicon films PS1 to PS3 and the insulating film IF7 in the memory cell area 1A and the capacitive element area 1B are covered by the insulating films HM2 and HM3, they are not removed. Subsequently, the insulating film IF6 in the peripheral circuit area 1C is removed to thereby expose the main surface of the semiconductor substrate SB in the peripheral circuit area 1C.

Here, the insulating film IF6 is removed because there is a fear that since the insulating film IF6 small in thickness is damaged upon removal of the silicon film PS1, the reliability of a gate insulating film for the insulating film IF6 is degraded when the insulating film IF6 is used as the gate insulating film. Thus, in the process described using FIG. 22, a process for reforming an insulating film for being used as the gate insulating film is next performed.

Further, in order to remove the insulating film IF6 and lay out the insulating film again in this way, the silicon film PS1 (refer to FIG. 9) lying over the insulating film IF6 is once removed. Since the silicon film PS1 (refer to FIG. 9) formed in the peripheral circuit area 1C is subjected to a high temperature in the forming process of the ONO film ON (refer to FIG. 5), it is not preferable in terms of improving the performance and reliability of the semiconductor device that the silicon film PS1 is used as a gate electrode of a MISFET to be formed in a subsequent process.

Further, it is considered that when the MISFET is formed in the peripheral circuit area 1C and a high-k film is formed in a gate insulating film which configures the MISFET, the high-k film is formed in the peripheral circuit area 1C before the formation of the ONO film ON. In this case, however, there is a fear that the MISFET including the high-k film is not normally operated because the high-k film is subjected to the high temperature at the formation of the ONO film ON. Thus, in the present embodiment, an insulating film HK2 (refer to FIG. 22) which is a high-k film is formed in a process to be described later after the forming process of the ONO film ON (refer to FIG. 5). It is thus possible to enhance the reliability of the MISFET having the high-k film.

Figure 22:
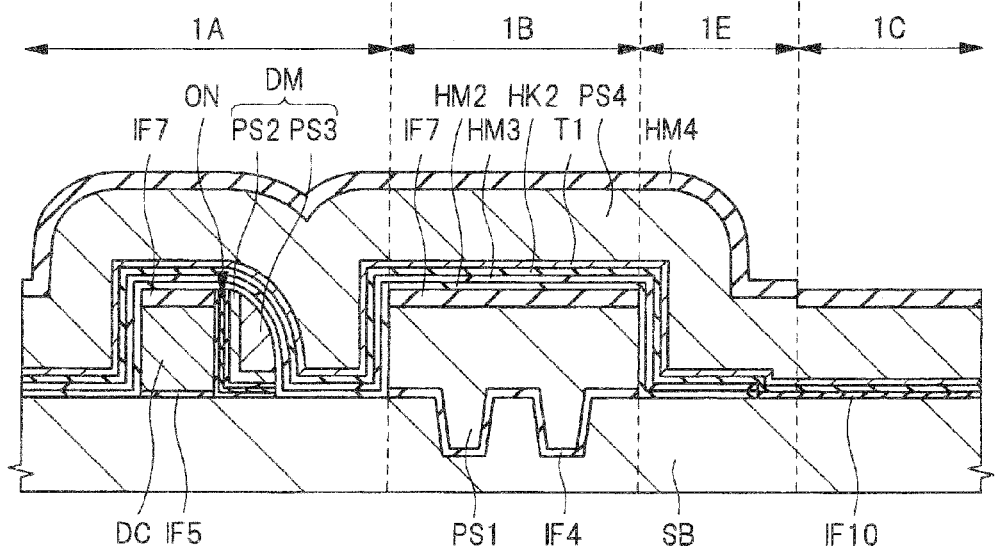
FIG. 22 is a sectional diagram in the manufacturing process of the semiconductor device, following FIG. 21.

Next, as shown in FIG. 22, an insulating film IF10 is formed over the main surface of the semiconductor substrate SB by using the thermal oxidation method or the like, for example. The insulating film IF10 is comprised of, for example, a silicon oxide film. The insulating film IF10 is a film taken to be part of the gate insulating film of the MISFET formed in the peripheral circuit area 1C in a subsequent process. Then, the insulating film IF10 in each of the memory cell area 1A and the capacitive element area 1B is removed by using the photolithography technique and the etching method to leave the insulating film IF10 in the peripheral circuit area 1C. At this time, in the peripheral area 1E, the insulating film IF10 is left even over the semiconductor substrate SB in the area not covered with the insulating films HM2 and HM3.

Thereafter, an insulating film HK2, a conductive film T1, a silicon film PS4, and an insulating film HM4 are formed in order over the entire main surface of the semiconductor device SB by using the CVD method, for example. The insulating film HK2 is comprised of a metal oxide film such as a hafnium oxide film, a zirconium oxide film, an aluminum oxide film, a tantalum oxide film or a lanthanum oxide film. The conductive film T1 is comprised of, for example, a titanium nitride film. The silicon film PS4 is comprised of, for example, a polycrystalline silicon film. The insulating film HM4 is comprised of, for example, a silicon nitride film. The silicon film PS4 is a semiconductor film which serves as a dummy gate electrode later. Thus, the surfaces of the insulating films HM3 and IF10 are covered by the insulating film HK2, the conductive film T1, the silicon film PS4, and the insulating film HM4.

Figure 23:
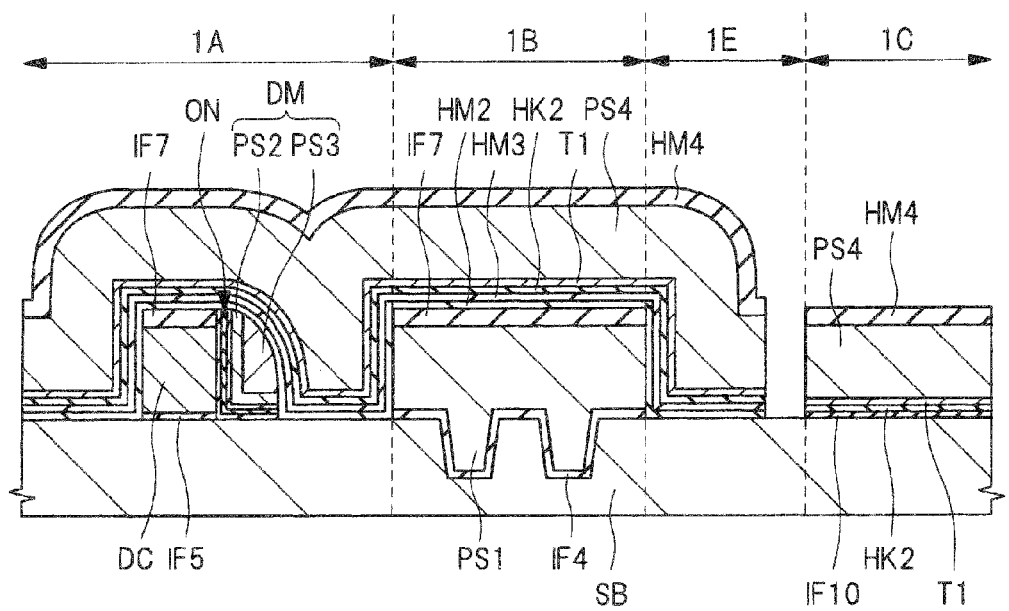
FIG. 23 is a sectional diagram in the manufacturing process of the semiconductor device, following FIG. 22.

Next, as shown in FIG. 23, the insulating film HM4, the silicon film PS4, the conductive film T1, and the insulating films HK2 and IF10 at part of the peripheral area 1E are removed by using the photolithography technique and the etching method to thereby expose the upper surface of the semiconductor substrate SB. That is, in the peripheral area 1E, an opening is formed in a laminated film including the insulating film HK2, the conductive film T1, the silicon film PS4, and the insulating film HM4.

Figure 24:
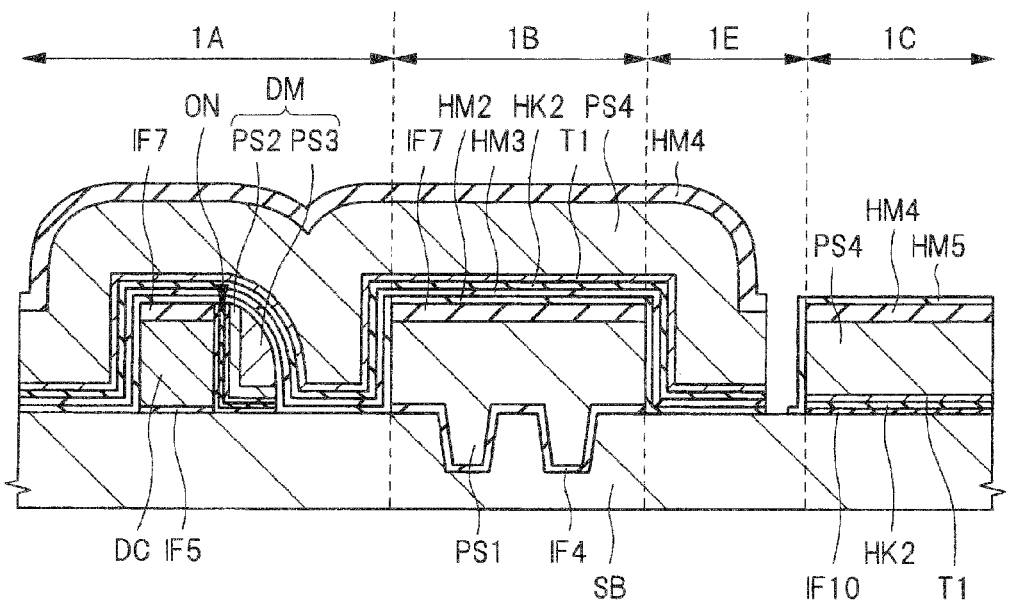
FIG. 24 is a sectional diagram in the manufacturing process of the semiconductor device, following FIG. 23.

Next, as shown in FIG. 24, an insulating film HM5 is formed over the entire main surface of the semiconductor substrate SB by using the CVD method, for example. The insulating film HM5 is formed so as to cover the sidewall lying inside the opening, its bottom face, and the surface of the insulating film HM4. Thereafter, with the bottom of the opening in the peripheral area 1E as the boundary, the insulating film HM5 in each of the memory cell area 1A, the capacitive element area 1B, and the area closer to the memory cell area 1A and the capacitive element area 1B than the boundary is removed by using the photolithography technique and the etching method.

Thus, the insulating film HM4 in each of the memory cell area 1A and the capacitive element area 1B is exposed. Further, the laminated film and the insulating films HM2 and HM3 in the area closer to the memory cell area 1A and the capacitive element area 1B than the opening in the peripheral area 1E are exposed from the insulating film HM5. That is, one sidewall which exists inside the opening and is close to the memory cell area 1A and the capacitive element area 1B is exposed from the insulating film HM5, and the other sidewall is held in a state of being covered with the insulating film HM5. That is, a laminated film comprised of the insulating films IF10 and HK2, the conductive film T1, the silicon film PS4, and the insulating film HM4 in the peripheral circuit area 1C remains covered with the insulating film HM5. Thus, the laminated film lying over the semiconductor substrate SB in the peripheral circuit area 1C is protected by the insulating film HM5.

Figure 25:
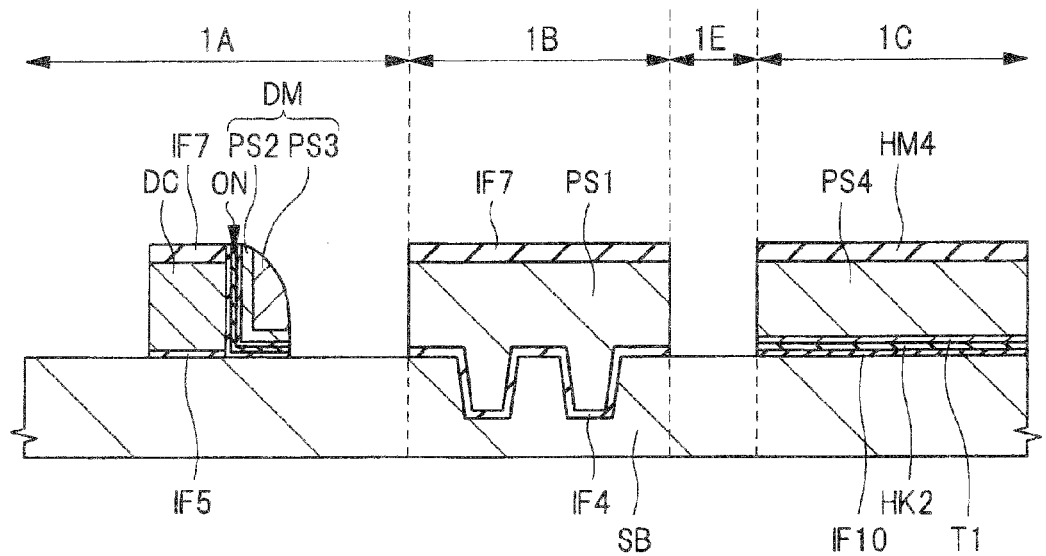
FIG. 25 is a sectional diagram in the manufacturing process of the semiconductor device, following FIG. 24.

Next, as shown in FIG. 25, the insulating film HM4, the silicon film PS4, the conductive film T1, and the insulating films HK2, HM3 and HM2 in the memory cell area 1A and the capacitive element area 1B are removed by performing wet etching. Thus, a structure comprised of the insulating film IF5, the dummy control gate electrode DC, the insulating film IF7, the ONO film ON, and the dummy memory gate electrode DM in the memory cell area 1A is exposed, and a laminated film comprised of the insulating film IF4, the silicon film PS1, and the insulating film IF7 in the capacitive element area 1B is exposed. Further, the semiconductor substrate SB in the peripheral area 1E is exposed by the above etching process.

Here, since the laminated film comprised of the insulating films IF10 and HK2, the conductive film T1, the silicon film PS4, and the insulating film HM4 in the peripheral circuit area 1C is covered by the insulating film HM5, it is not removed. Thereafter, the above laminated film in the peripheral circuit area 1C is exposed by removing the insulating film HM5 by the wet etching method.

Figure 26:
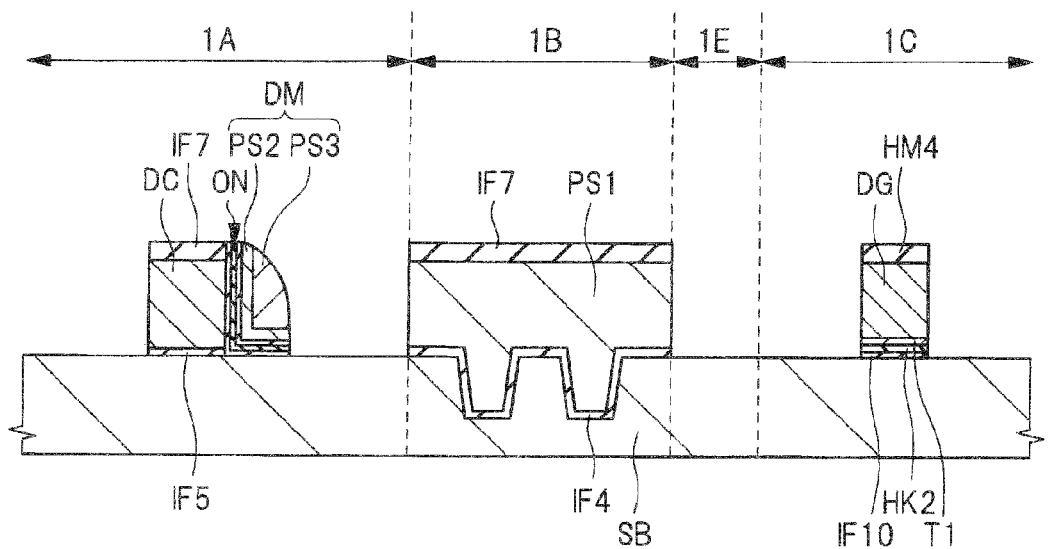
FIG. 26 is a sectional diagram in the manufacturing process of the semiconductor device, following FIG. 25.

Next, as shown in FIG. 26, a process similar to the process described using FIG. 10 is performed to process the laminated film comprised of the insulating films IF10 and HK2, the conductive film T1, the silicon film PS4, and the insulating film HM4 in the peripheral circuit area 1C. Thus, a pattern for the laminated film comprised of the insulating films IF10 and HK2, the conductive film T1, the dummy gate electrode DG, and the insulating film HM4 is formed over the semiconductor substrate SB in the peripheral circuit area 1C. The dummy gate electrode DG is a pattern comprised of the silicon film PS4. The insulating film IF10 and the insulating film HK2 processed by the corresponding process are respectively a film which configures a gate insulating film of a low breakdown voltage MISFET formed in the peripheral circuit area 1C in a subsequent process.

Figure 27:
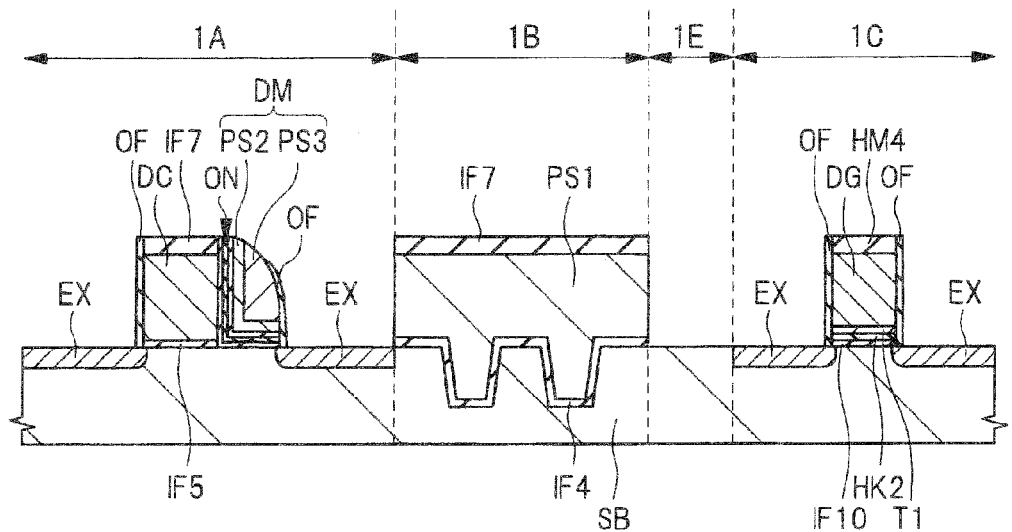
FIG. 27 is a sectional diagram in the manufacturing process of the semiconductor device, following FIG. 26.

Next, as shown in FIG. 27, a process similar to the process described using FIG. 11 is performed. That is, offset spacers OF are respectively formed on sidewalls on both sides of the structure including the dummy control gate electrode DC and the dummy memory gate electrode DM and sidewalls on both sides of the dummy gate electrode DG. Thereafter, a pair of n⁻ type semiconductor regions EX is formed in the upper surface of the semiconductor substrate SB located laterally of the above structure. A pair of n⁻ type semiconductor regions EX is formed in the upper surface of the semiconductor substrate SB located laterally of the dummy gate electrode DG.

Figure 28:
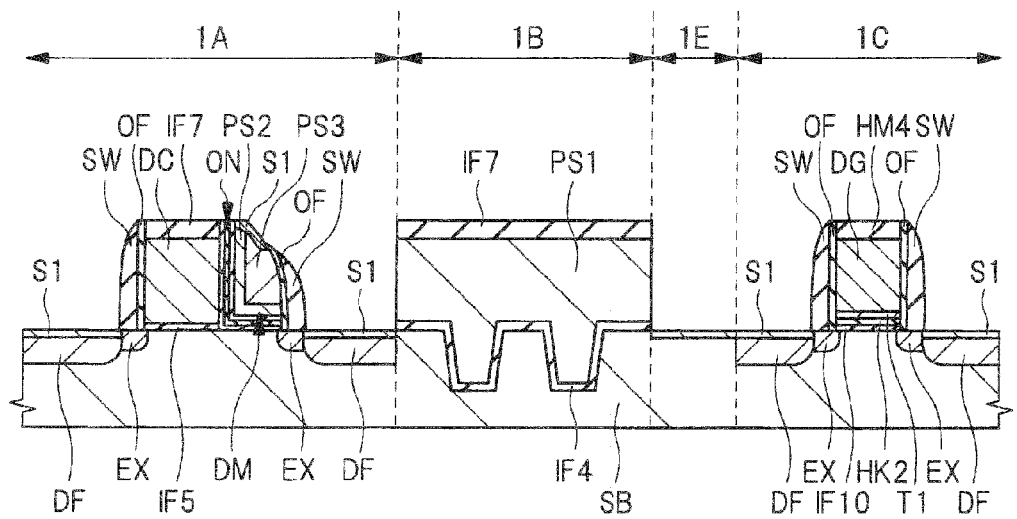
FIG. 28 is a sectional diagram in the manufacturing process of the semiconductor device, following FIG. 27.

Next, as shown in FIG. 28, a process similar to the process described using FIG. 12 is performed. That is, sidewalls SW are respectively formed on the sidewalls on both sides of the structure including the dummy control gate electrode DC and the dummy memory gate electrode DM and the sidewalls on both sides of the dummy gate electrode DG through the offset spacers OF. Thereafter, a pair of n⁺ type semiconductor regions DF is formed in the upper surface of the semiconductor substrate SB located laterally of the above structure. A pair of n⁺ type semiconductor regions DF is formed in the upper surface of the semiconductor substrate SB located laterally of the dummy gate electrode DG. Thus, source-drain regions each having the n⁻ type semiconductor region EX used as an extension region and the n⁺ type semiconductor region DF used as a diffusion region are respectively formed in the memory cell area 1A and the peripheral circuit area 1C.

Subsequently, a heat treatment for diffusing impurities implanted into the source-drain regions or the like is performed. Thereafter, a silicide layer S1 is formed over the upper surfaces of the n⁺ type semiconductor regions DF and the dummy memory gate electrode DM by using the known salicide process. At this time, the silicide layer S1 is formed even over the upper surface of the semiconductor substrate SB in the peripheral area 1E.

Figure 29:
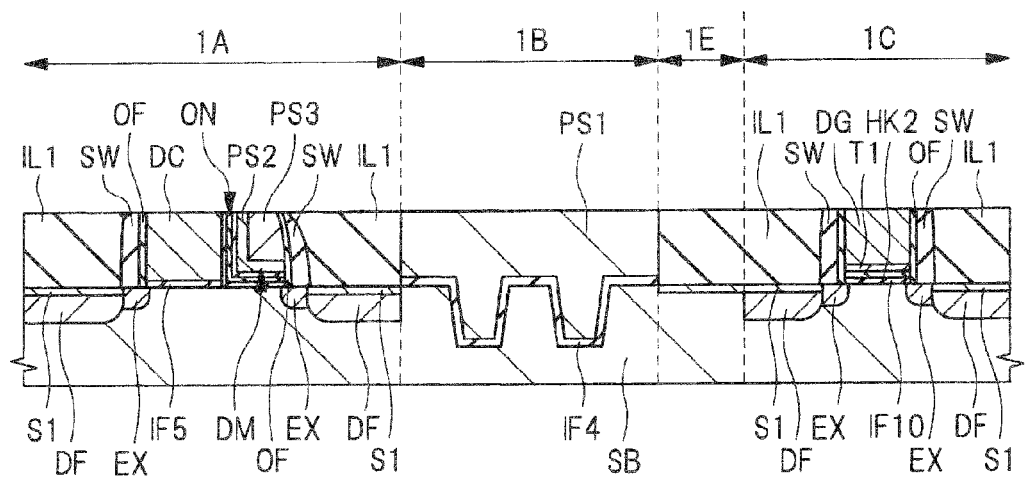
FIG. 29 is a sectional diagram in the manufacturing process of the semiconductor device, following FIG. 28.

Next, as shown in FIG. 29, a process similar to the process described using FIG. 13 is performed to form an interlayer insulating film IL1. A polishing process for planarizing the upper surfaces of the interlayer insulating film IL1, the sidewalls SW, the offset spacers OF, the dummy control gate electrode DC, the dummy memory gate electrode DM, the ONO film ON, the silicon film PS1, and the dummy gate electrode DG is performed by the CMP method, for example. Thus, the insulating films IF7 and HM4 are removed so that the upper surfaces of the dummy control gate electrode DC, the dummy memory gate electrode DM, the silicon film PS1, and the dummy gate electrode DG are exposed.

Figure 30:
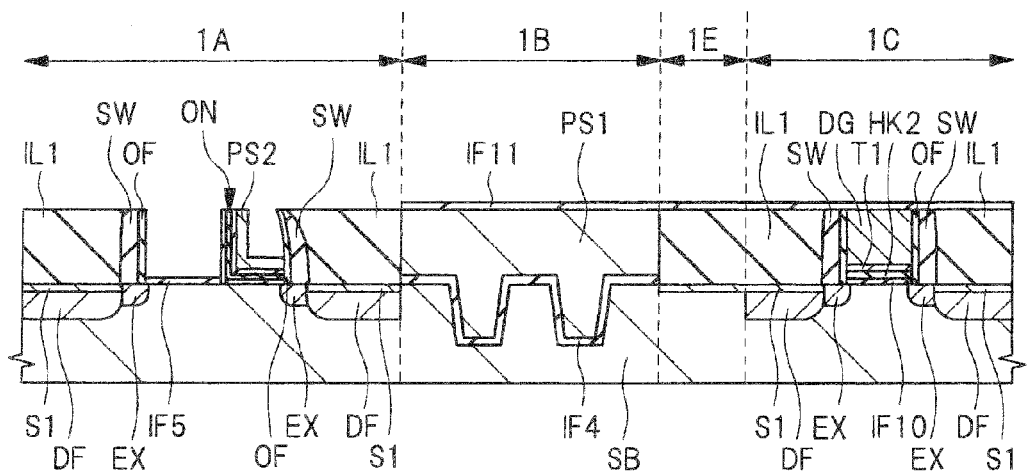
FIG. 30 is a sectional diagram in the manufacturing process of the semiconductor device, following FIG. 29.

Next, as shown in FIG. 30, a process similar to the process described using FIG. 14 is performed to thereby remove the dummy control gate electrode DC, the silicon film PS3, and the dummy gate electrode DG by etching. However, the dummy gate electrode DG in the peripheral circuit area 1C is not removed.

That is, here, an insulating film IF11 is first formed which covers the silicon film PS1 in the capacitive element area 1B, the interlayer insulating film IL1 in the peripheral area 1E, and the interlayer insulating film IL1, the sidewalls SW, the offset spacers OF, and the dummy memory gate electrode DM in the peripheral circuit area 1C and expose the dummy control gate electrode DC, the silicon film PS3, and the dummy gate electrode DG without covering them. The insulating film IF11 is formed by, for example, forming an insulating film comprised of, for example, a silicon oxide film or a silicon nitride film over the semiconductor substrate SB by using the CVD method or the like and thereafter processing the insulating film by using the photolithography technique and the etching method.

Thereafter, wet etching is performed by an alkaline aqueous solution using the insulating film IF11 as a mask to thereby remove the dummy control gate electrode DC and the silicon film PS3. For example, aqueous ammonia (NH₄OH) is used as the alkaline aqueous solution. At this time, the silicon film PS2 as the p⁺ type semiconductor film which has configured the dummy memory gate electrode DM (refer to FIG. 13) is left without being removed because it is insoluble in the aqueous ammonia.

Therefore, one sidewall of the ONO film ON having come in contact with the sidewall of the dummy control gate electrode DC, i.e., the ONO film ON extending in the direction vertical to the main surface of the semiconductor substrate SB is exposed, whereas the silicon film PS2 is in contact with the other sidewall. Since the upper surface and sidewall of the ONO film ON covered with the dummy memory gate electrode DM remain covered with the silicon film PS2 through before and after the above wet etching, they are not subjected to a chemical solution for wet etching.

Since the dummy control gate electrode DC, the silicon film PS3, and the dummy gate electrode DG are removed, trenches (concave portions, recesses) are formed over the insulating film IF5 and the silicon film PS2. Since the silicon film PS1 in the capacitive element area 1B and the dummy gate electrode DG in the peripheral circuit area 1C are covered by the insulating film IF11, they are not removed.

The trench formed over the insulating film IF5 being the gate insulating film in the memory cell area 1A is a region from which the dummy control gate electrode DC has been removed. The sidewalls on both sides of the trench are configured by the offset spacers OF. The trench formed over the silicon film PS2 in the memory cell area 1A is a region from which the silicon film PS3 has been removed. One sidewall of the trench is configured by the offset spacer OF, and the other sidewall thereof is configured by the sidewall of the silicon film PS2.

Figure 31:
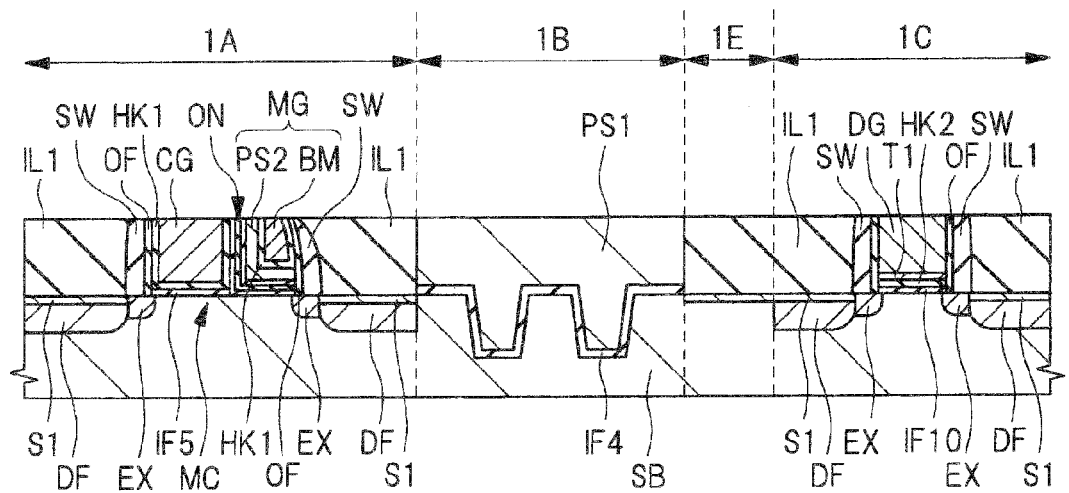
FIG. 31 is a sectional diagram in the manufacturing process of the semiconductor device, following FIG. 30.

Next, as shown in FIG. 31, a process similar to the process described using FIG. 15 is performed to thereby form an insulating film HK1, a control gate electrode CG comprised of a metallic film, and a memory gate electrode MG in the memory cell area 1A. That is, a metallic film BM is formed within the trench over the ONO film ON through the insulating film HK1, whereby the memory gate electrode MG comprised of the silicon film PS2 and the metallic film BM is formed. Since, however, no trench is formed in the peripheral circuit area 1C unlike the process described using FIG. 15, the insulating film HK1 and the metal gate electrode are not formed in the peripheral circuit area 1C.

That is, an insulating film HK1 and a metallic film are sequentially formed over the semiconductor substrate SB, i.e., the interlayer insulating film IL1 including over the inner surfaces of the trenches to fill the trenches over the semiconductor substrate SB. In the forming process of the insulating film HK1, the inside of each trench described above is not completely filled up, and each trench is brought into a completely filled-up state by forming the above metallic film. Further, the metallic film is formed even over the interlayer insulating film IL1.

The insulating film HK1 is a high-k film for the gate insulating film. The metallic film is a conductive film for the gate electrode. As the insulating film HK1, a metal oxide film such as a hafnium oxide film, a zirconium oxide film, an aluminum oxide film, a tantalum oxide film or a lanthanum oxide film can be used.

As the metallic film, there can be used, for example, a metallic film such as a titanium nitride (TiN) film, a tantalum nitride (TaN) film, a tungsten nitride (WN) film, a titanium carbide (TiC) film, a tantalum carbide (TaC) film, a tungsten carbide (WC) film, a carbide nitride tantalum (TaCN) film, a titanium (Ti) film, a tantalum (Ta) film, a titanium aluminum (TiAl) film or an aluminum (Al) film. Further, the metallic film may be comprised of a laminated film of these. The metallic film can be formed by using the sputtering method or the like, for example. Here, for example, the metallic film is comprised of a laminated film of a titanium nitride (TiN) film and an aluminum (Al) film lying over the titanium nitride film.

Thereafter, the unnecessary metallic film and insulating film HK1 lying outside the trenches are removed by the CMP method or the like to thereby embed the insulating film HK1 and the metallic film in each trench. Thus, the control gate electrode CG is formed by the metallic film embedded in the trench over the insulating film IF5 in the memory cell area 1A. Further, the memory gate electrode MG is formed by the metallic film BM embedded in the trench over the silicon film PS2 in the memory cell area 1A and the silicon film PS2. A gate length of the memory gate electrode MG is about 40 nm, for example.

Thus, a memory cell MC including a control transistor and a memory transistor is formed in the memory cell area 1A.

Figure 32:
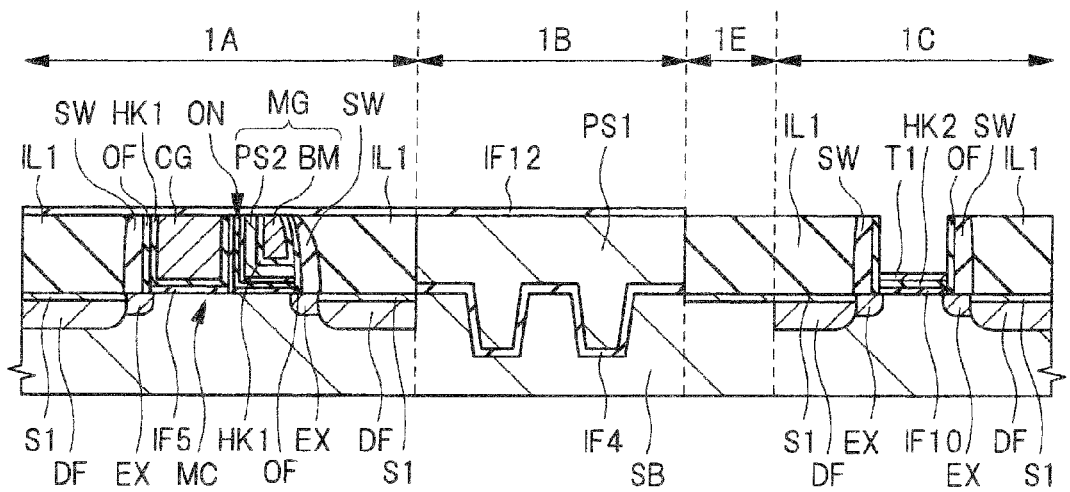
FIG. 32 is a sectional diagram in the manufacturing process of the semiconductor device, following FIG. 31.

Next, as shown in FIG. 32, an insulating film IF12 which covers the entire main surface of the semiconductor substrate SB is formed by the CVD method, for example. Thereafter, the insulating film IF12 in each of the peripheral area 1E and the peripheral circuit area 1C is removed by using the photolithography technique and the etching method. Thus, the dummy gate electrode DG is exposed while covering the memory cell area 1A and the capacitive element area 1B by the insulating film IF12.

Subsequently, the dummy gate electrode DG in the peripheral circuit area 1C is removed by the wet etching method to thereby expose the upper surface of the conductive film T1. Thus, a trench is formed over the laminated film comprised of the insulating films IF10 and HK2 and the conductive film T1.

Figure 33:
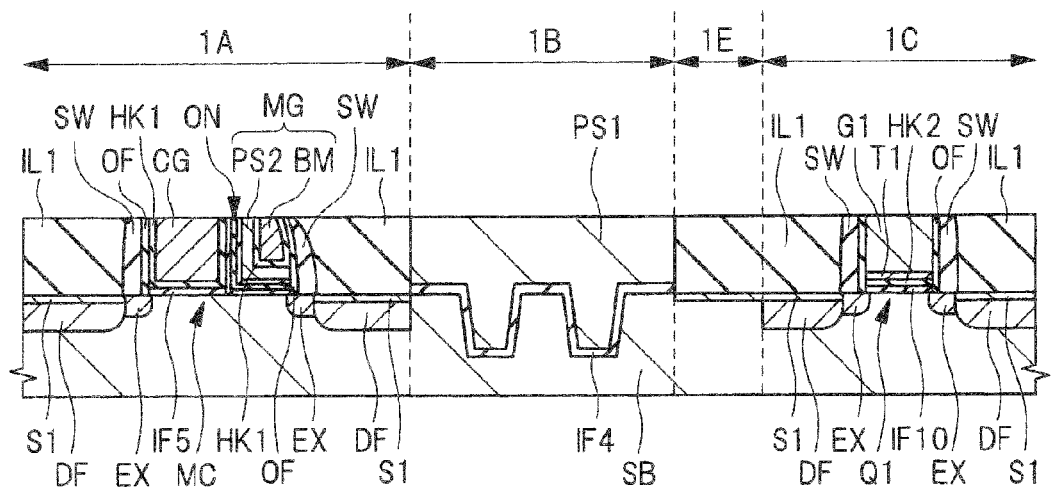
FIG. 33 is a sectional diagram in the manufacturing process of the semiconductor device, following FIG. 32.

Next, as shown in FIG. 33, a gate electrode G1 as a metal gate electrode comprised of a metallic film is formed in the trench in the peripheral circuit area 1C.

That is, a metallic film is first formed over the semiconductor substrate SB, i.e., the interlayer insulating film IL1 including over the above inner surfaces by the sputtering method, for example to fill each trench over the semiconductor substrate SB. By forming the metallic film, each trench is brought into a completely filled state. Further, the metallic film is formed even over the interlayer insulating film IL1.

As the metallic film, there can be used, for example, a metallic film such as a titanium nitride (TiN) film, a tantalum nitride (TaN) film, a tungsten nitride (WN) film, a titanium carbide (TiC) film, a tantalum carbide (TaC) film, a tungsten carbide (WC) film, a carbide nitride tantalum (TaCN) film, a titanium (Ti) film, a tantalum (Ta) film, a titanium aluminum (TiAl) film or an aluminum (Al) film. Further, the metallic film may be comprised of a laminated film of these.

Thereafter, the unnecessary metallic film lying outside each of the trenches is removed by the CMP method or the like to thereby embed the metallic film in each trench. Accordingly, the gate electrode G1 is formed by the metallic film embedded in the trench. Thus, the low breakdown voltage MISFETQ1 is formed in the peripheral circuit area 1C.

That is, in the peripheral circuit area 1C, the gate electrode G1 and the pair of source-drain regions formed in the upper surface of the semiconductor substrate SB located laterally of the gate electrode G1 configure the low breakdown voltage MISFETQ1. The insulating film HK2 and the insulating film IF10 provided immediately below the gate electrode G1 configure the gate insulating film of the MISFETQ1. Further, the conductive film T1 provided immediately below the gate electrode G1 configures part of the gate electrode of the MISFETQ1.

Figure 34:
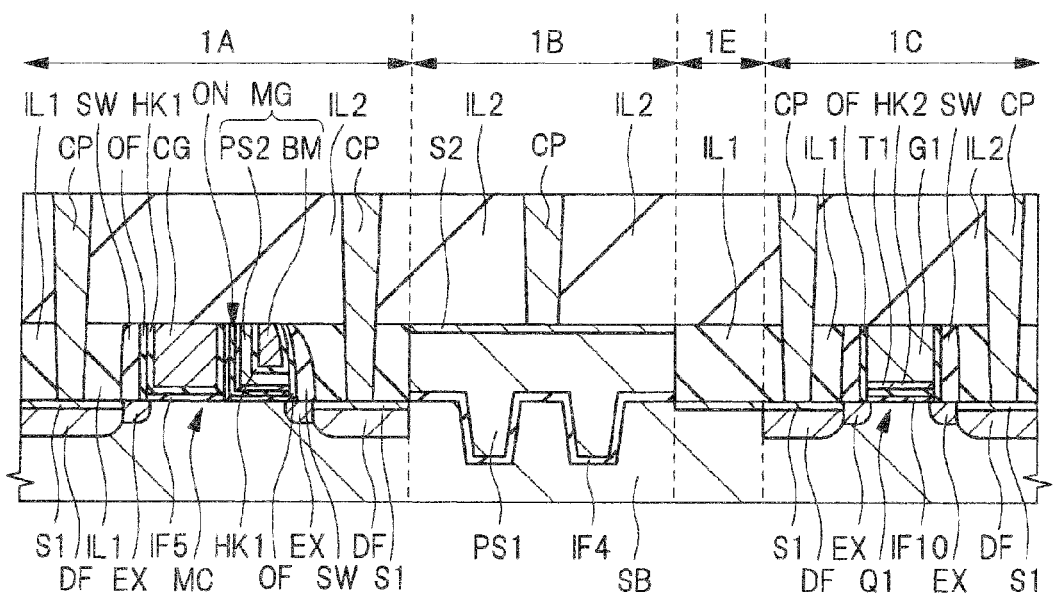
FIG. 34 is a sectional diagram in the manufacturing process of the semiconductor device, following FIG. 33.

Next, as shown in FIG. 34, processes similar to the processes described using FIGS. 16 to 19 are performed to manufacture the semiconductor device according to the present embodiment. That is, a silicide layer S2 is selectively formed over the upper surface of the silicon film PS1 in the capacitive element area 1B, and thereafter an interlayer insulating film IL2 and a contact plug CP are formed over the semiconductor substrate SB.

Even in the present embodiment as described using FIGS. 17 and 19, a power feeding area 1D relative to the memory cell is formed. The power feeding area 1D in the present embodiment is identical in structure to that shown in FIGS. 17 and 19. That is, a contact plug CP formed in the power feeding area 1D is coupled to each of the silicon film PS2 and the metallic film BM which configure the memory gate electrode MG of the memory cell MC (refer to FIG. 34).

<Advantageous Effects of Semiconductor Device According to the Present Embodiment>

The semiconductor device according to the present embodiment is capable of obtaining advantageous effects similar to the embodiment 1. That is, in the present embodiment, the memory gate electrode MG which configures the memory cell MC of the nonvolatile memory is partly configured of the metallic film BM without being configured by only the silicon film PS2, thereby enabling miniaturization of the memory gate electrode MG and its resistance reduction. Consequently, it is possible to improve the performance of the semiconductor device. Further, the control gate electrode CG is configured as the metal gate electrode to thereby enable miniaturization of the control gate electrode CG and its resistance reduction. It is thus possible to improve the performance of the semiconductor device.

Further, the part which is part of the memory gate electrode MG and in contact with the ONO film ON is configured by the $p^+$ type silicon film PS2. Thus, since the holes can be injected into the ONO film ON from the $p^+$ type silicon film PS2 when the erase system (FN system) for injecting holes into the ONO film ON from the memory gate electrode MG is adopted for the erase operation of the nonvolatile memory, the erase operation can be appropriately performed. It is thus possible to improve the performance of the semiconductor device.

Furthermore, as described using FIGS. 17 and 19, the contact plug CP is coupled to both the silicon film PS2 and the metallic film BM which configure the memory gate electrode MG. Therefore, it is possible to prevent the performance of each memory cell MC from varying due to variations in the coupled state of the contact plug CP by coupling to only the silicon film PS2, only the metallic film BM or both thereof, etc. in the power feeding area 1D to perform power feeding to the memory gate electrode MG of each of the memory cells MC. It is thus possible to improve the performance of the semiconductor device.

Still further, since a voltage drop in the memory gate electrode MG can be suppressed by forming the contact plug PC relatively broad in width and coupling the contact plug CP to both the silicon film PS2 and the metallic film BM, it is possible to improve the performance of the semiconductor device.

<Advantageous Effects of Manufacturing Method of Semiconductor Device According to the Present Embodiment>

In the manufacturing method of the semiconductor device according to the present embodiment as described above, the insulating film HK1 and the control gate electrode CG which configure the memory cell MC, and the metallic film BM which configures the memory gate electrode MG are formed through the gate last process by the method of embedding them into the trenches. On the other hand, the insulating film HK2 and the conductive film T1 which configure the MISFETQ1 in the peripheral circuit area 1C can be formed by patterning the film formed over the semiconductor substrate SB in a manner similar to the case where the gate first process is performed.

Thus, the degree of freedom of the forming method of each element formed over the semiconductor substrate SB is enhanced. Accordingly, the semiconductor element in the partial area can be formed using the known manufacturing method or the existing manufacturing device without forming all semiconductor elements by a relatively new manufacturing method or manufacturing device. Thus, since the corresponding semiconductor element can be formed by means having a good result for the manufacture, it is possible to prevent the reliability of the semiconductor device from being degraded.

Also, the semiconductor device according to the present embodiment is capable of obtaining advantageous effects similar to the embodiment 1. That is, the semiconductor device manufactured by the manufacturing method of the semiconductor device according to the present embodiment has advantageous effects similar to the semiconductor device according to the present embodiment described above. That is, the miniaturization of the semiconductor device and its resistance reduction can be realized by using the metallic film for the control gate electrode CG and the memory gate electrode MG which configure the memory cell MC. Further, the erase operation can be appropriately carried out by using the p$^+$ type silicon film PS2 as the part of the memory gate electrode MG. Furthermore, the contact plug CP is coupled to both of the silicon film PS2 and the metallic film BM to thereby make it possible to suppress a voltage drop in the memory gate electrode MG and suppress variations in the performance among the memory cells MC.

Further, in the present embodiment, since the control gate electrode CG and the part of the memory gate electrode MG in the memory cell MC can be formed by using the gate last process, the miniaturization of the semiconductor device can be made easy as compared with the case where the so-called gate first process is adopted in which the dummy gate electrode and the like are not formed.

Furthermore, in the present embodiment, the control gate electrode CG and the gate electrode G1 shown in FIG. 34 are formed using the gate last process after the dummy control gate electrode DC and the dummy gate electrode DG (refer to FIG. 26) comprised of the silicon film both subjected to the high temperature by the forming process of the ONO film ON (refer to FIG. 5). It is thus possible to improve the reliability of the semiconductor device.

Still further, in the present embodiment, since it is not necessary to adjust the height of the sidewall-like dummy memory gate electrode DM with high accuracy in the etching process described using FIG. 8, the control gate electrode CG and the metallic film BM as the part of the memory gate electrode MG can easily be formed by the known gate last process. That is, since no high accuracy is required for the formation of the memory gate electrode MG, the reliability of the semiconductor device can be improved.

Still further, in the removing process of the various dummy gate electrodes, which has been described using FIG. 30, the silicon film PS2 is left in contact with the sidewall of the ONO film ON extending in the direction perpendicular to the main surface of the semiconductor substrate SB. Therefore, it is possible to prevent the occurrence of unstable states that the ONO film ON small in thickness becomes easy to collapse where the silicon film PS2 is not left behind.

Still further, the ONO film ON opposite to the area formed with the dummy memory gate electrode DM, i.e., the silicon oxide film OX2 (refer to FIG. 5) is covered by the silicon film PS2 when the various dummy gate electrodes are removed as described above (refer to FIG. 30). Accordingly, it is possible to prevent the silicon oxide film OX2 from being damaged due to the surface of the ONO film ON being subjected to the chemical solution for removing the dummy memory gate electrode DM and the like. Further, it is possible to prevent the memory cell MC from not normally operating due to an unexpected interface level occurring in the ONO film ON and prevent variations in the performance between the memory cells MC due to the same. It is thus possible to improve the reliability of the semiconductor device.

Still further, in the present embodiment, although the control gate electrode CG and the memory gate electrode MG which configure the memory cell MC, and the gate electrode G1 of the MISFETQ1 in the peripheral circuit area 1C are respectively configured to include the metallic film as shown in FIG. 34, it is also possible to separately form elements each having an electrode not including the metallic film and the insulating film HK1 as in the capacitive element formed in the capacitive element area 1B. That is, the degree of freedom of each element mounted onto the semiconductor device can be improved.

Embodiment 3

The present embodiment will be explained using FIGS. 35 to 39, in the case where a memory cell is formed in which a vertical part extending in the direction perpendicular to a main surface of a semiconductor substrate and a horizontal part extending along the main surface of the semiconductor substrate are different from each other in terms of the thickness of a semiconductor film which configures a memory gate electrode. FIGS. 35 to 39 are sectional diagrams for describing a manufacturing process of a semiconductor device according to the present embodiment.

First, processes similar to the processes described using FIGS. 1 to 6 are performed to introduce a p-type impurity into a silicon film PS2 in a relatively high concentration.

Figure 35:
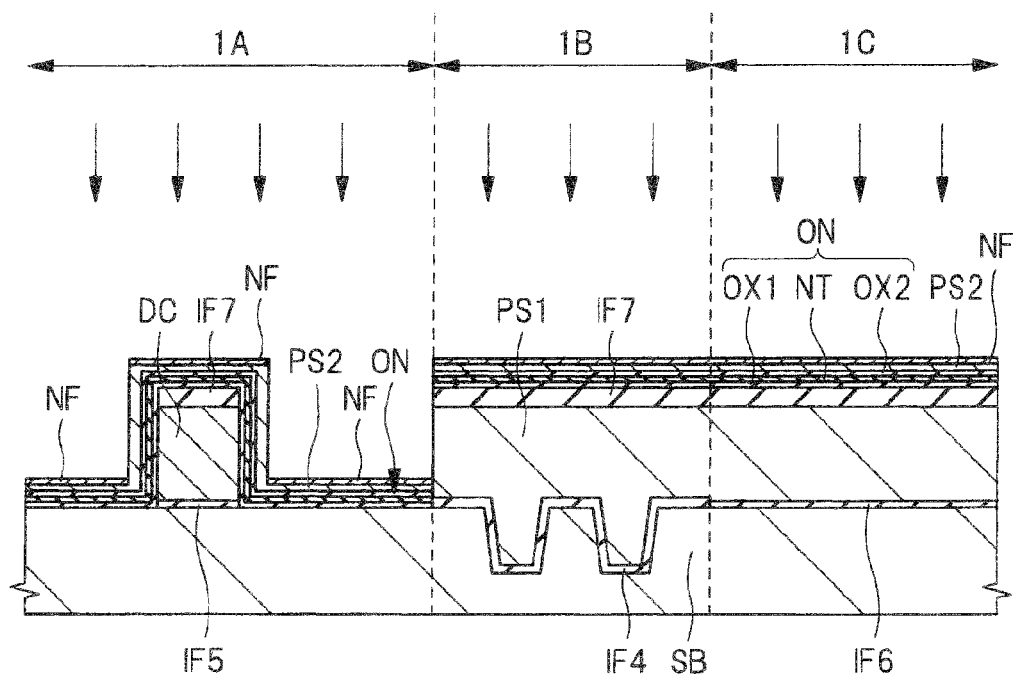
FIG. 35 is a sectional diagram in a manufacturing process of a semiconductor device showing an embodiment 3.

Next, as shown in FIG. 35, an n-type impurity (e.g., arsenic (As) or phosphorus (P)) is implanted into the upper surface of the silicon film PS2 from above the semiconductor substrate SB in a relatively high concentration by using an ion implantation method, for example. Thus, an n$^+$ type semiconductor layer NF is formed over the upper surface of the silicon film PS2.

The ion implantation herein is performed from the direction perpendicular to the main surface of the semiconductor substrate SB. This is done to prevent the n-type impurity from being implanted in the sidewalls of the silicon film PS2 formed adjacent to the sidewalls of a dummy control gate electrode DC by the ion implantation process. Further, the n$^+$ type semiconductor layer NF is formed from the upper surface of the silicon film PS2 to a depth on the way of the silicon film PS2 without forming it over the whole surface from the upper surface of the silicon film PS2 to its lower surface. That is, the formation depth of the n$^+$ type semiconductor layer NF does not reach the bottom face of the silicon film PS2. That is, here, the n-type impurity is ion-implanted with the aim of forming the n$^+$ type semiconductor layer NF only in the vicinity of the upper surface within the silicon film PS2.

Figure 36:
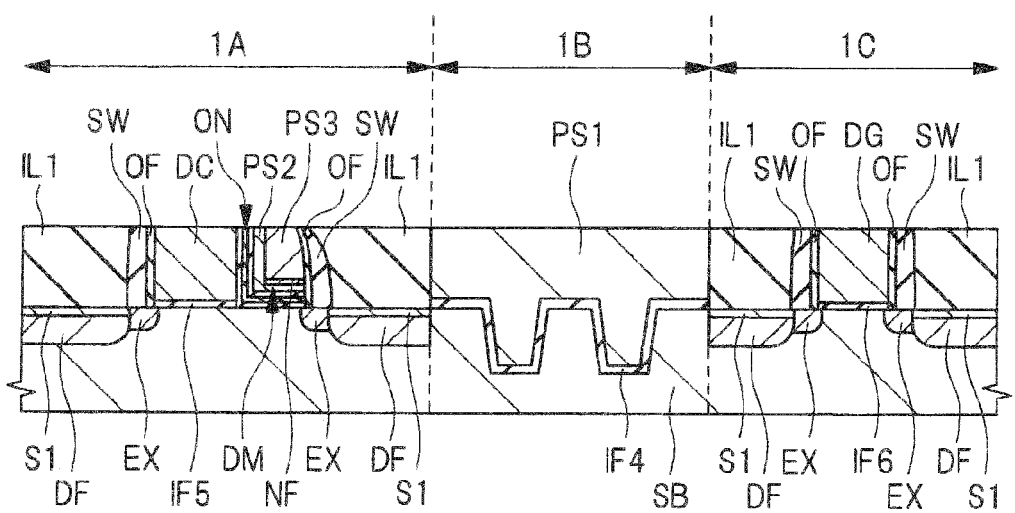
FIG. 36 is a sectional diagram in the manufacturing process of the semiconductor device, following FIG. 35.

Next, as shown in FIG. 36, processes similar to the processes described using FIGS. 7 to 13 are carried out to form an interlayer insulating film IL1. A polishing process for planarizing the upper surfaces of the interlayer insulating film IL1, sidewalls SW, offset spacers OF, dummy control gate electrode DC, dummy memory gate electrode DM, ONO film ON, silicon film PS1, and dummy gate electrode DG is performed by a CMP method, for example. The dummy memory gate electrode DM includes the silicon films PS2 and PS3 and the n$^+$ type semiconductor layer NF.

After the polishing process, the n$^+$ type semiconductor layer NF is formed only at the bottom of the silicon film PS2 having an L-shaped sectional shape, i.e., the upper surface of the silicon film PS2 extending along the main surface of the semiconductor substrate SB. One sidewall of the silicon film PS3 is in contact with the sidewall of the silicon film PS2 as a p$^+$ type semiconductor film, whereas the bottom face of the silicon film PS3 is in contact with the upper surface of the n$^+$ type semiconductor layer NF. In other words, the n$^+$ type semiconductor layer NF is not formed between the silicon film PS3 and the dummy control gate electrode DC, and the silicon film PS2 is formed therebetween. On the other hand, the n$^+$ type semiconductor layer NF and the silicon film PS2 are formed between the silicon film PS3 and the semiconductor substrate SB in order from the silicon film PS3 side.

Figure 37:
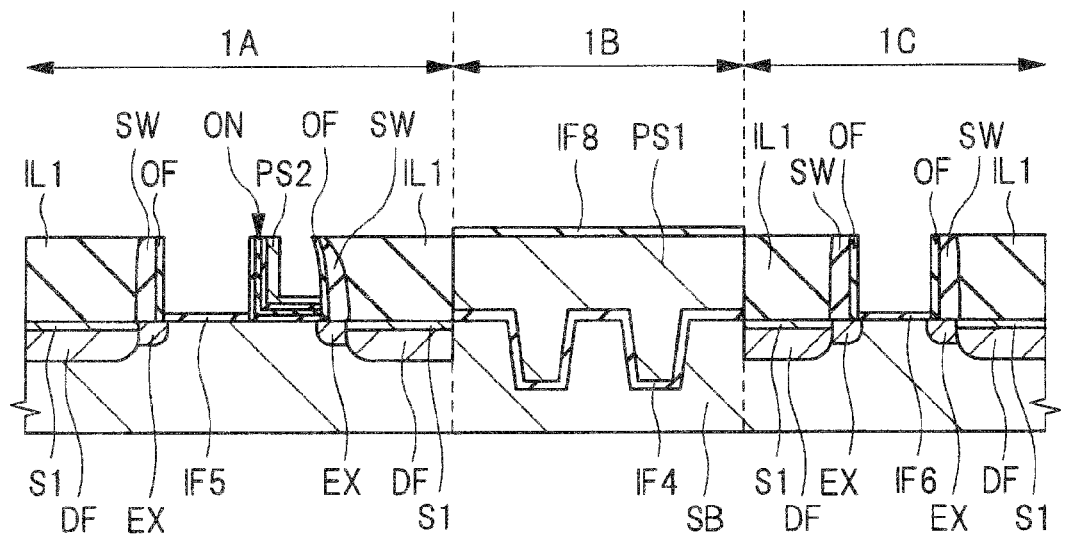
FIG. 37 is a sectional diagram in the manufacturing process of the semiconductor device, following FIG. 36.

Next, as shown in FIG. 37, a process similar to the process described using FIG. 14 is performed to remove the dummy control gate electrode DC, the silicon film PS3, and the dummy gate electrode DG by a wet etching method. Here, an alkaline aqueous solution is used as a chemical solution for wet etching. At this time, the n$^+$ type semiconductor layer NF below the silicon film PS3 is also removed in the process of removing the silicon film PS3 by the wet etching method. Since, however, the silicon film PS2 as the p$^+$ type semiconductor film is insoluble in the alkaline aqueous solution, it is left without being removed.

This is considered to occur because since the transfer of electrons occurs in the reaction that takes place upon etching, a p-type semiconductor film containing a lots of holes has the property of being hard to be removed with respect to the alkaline aqueous solution or the like as compared with an n-type semiconductor film containing a lot of electrons. Thus, since the p-type semiconductor film becomes slower in etching rate than the n-type semiconductor film, the n$^+$ type semiconductor layer NF is removed whereas the silicon film PS2 remains without being removed in the above wet etching. This difference in the etching rate occurs similarly not only in the case where the wet etching is carried out, but also in the case where the dry etching is performed.

Thus, the thickness of the silicon film PS2 at its part extending in the direction perpendicular to the main surface of the semiconductor substrate SB becomes larger than that of the silicon film PS2 at its part extending along the main surface of the semiconductor substrate SB. In the following, of the silicon film PS2 having the L-shaped sectional shape, the part extending in the direction perpendicular to the main surface of the semiconductor substrate SB is called a vertical part, and the part extending along the main surface of the semiconductor substrate SB is called a horizontal part.

For example, even where the vertical part of the silicon film PS2 has a thickness smaller than the horizontal part when the film-forming process descried using FIG. 5 is performed, the vertical part of the silicon film PS2 becomes larger in thickness than the horizontal part by removing the n$^+$ type semiconductor layer NF formed over the upper surface of the horizontal part of the silicon film PS2 as described above.

Figure 38:
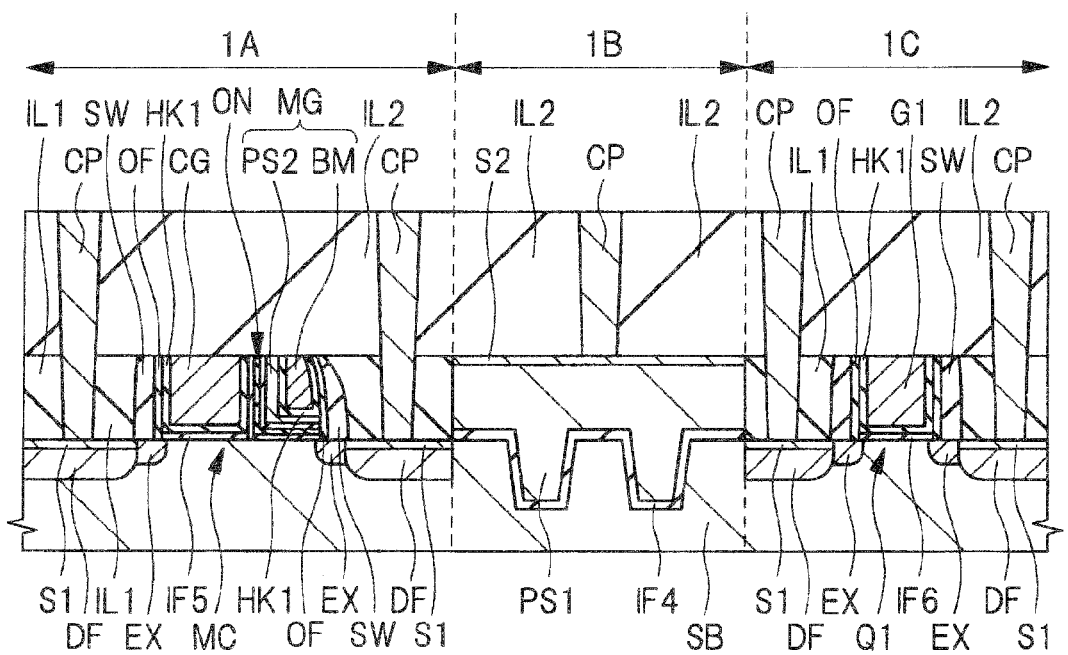
FIG. 38 is a sectional diagram in the manufacturing process of the semiconductor device, following FIG. 37.
Figure 39:
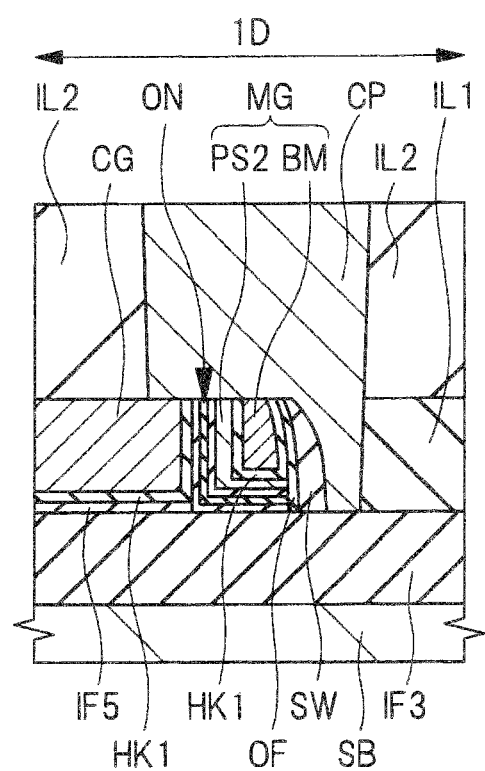
FIG. 39 is a sectional diagram in the manufacturing process of the semiconductor device, following FIG. 37.

Next, as shown in FIGS. 38 and 39, processes similar to the processes described using FIGS. 15 to 19 are performed to thereby form a memory cell MC, a power feeding part for the memory cell MC, a capacitive element, and a low breakdown voltage MISFETQ1. Thus, the semiconductor device according to the present embodiment is manufactured. In the present embodiment, the metallic film BM formed in the embedding process described using FIG. 15 is larger in thickness than the metallic film BM (refer to FIG. 18) in the structure described in the embodiment 1. This is because the thickness of the horizontal part of the silicon film PS2 in the present embodiment shown in FIGS. 38 and 39 is smaller than that of the vertical part of the silicon film PS2.

<Advantageous Effects of Semiconductor Device According to the Present Embodiment and its Manufacturing Method>

The present embodiment is capable of obtaining advantageous effects similar to the embodiment 1.

Further, in the present embodiment, unlike the embodiment 1, the thickness of the horizontal part of the silicon film PS2 is made smaller than that of the vertical part of the silicon film PS2. Thus, the metallic film BM deposited larger can be embedded into the trench provided immediately above the silicon film PS2. In this case, the thickness and volume of the metallic film BM can be made large as compared with the case where the vertical and horizontal parts of the silicon film PS2 have the same thickness. Thus, since the ratio occupied by the metallic film BM in the silicon film PS2 and the metallic film BM configuring the memory gate electrode MG becomes large, it is possible to realize miniaturization of the memory gate electrode MG and its resistance reduction.

As a method of increasing the occupation rate of the metallic film BM in the memory gate electrode MG, it is considered that, for example, the thickness of the silicon film PS2 formed in the process described using FIG. 5 is set small. In this method, however, a problem arises in that since the thickness of the vertical part of the silicon film PS2 formed along the sidewall of the control gate electrode CG also becomes small, a breakdown voltage between the control gate electrode CG and the memory gate electrode MG is reduced with the formation of the metallic film BM and the control gate electrode CG close to each other.

Further, as a method of reducing the thickness of the horizontal part of the silicon film PS2, it is considered that, for example, after the process described using FIG. 5, the upper surface of the silicon film PS2 is partly etchbacked by anisotropic etching (dry etching). In this method, however, there is a possibility that since the silicon film PS2 is subjected to the anisotropic etching, the silicon film PS2 will be damaged. Further, it is difficult to remove a desired region of the silicon film PS2 with high accuracy in dry etching. Thus, in trying to remove part of the horizontal part of the silicon film PS2 by etchback, there arise problems where the reliability of the memory gate electrode MG including the silicon film PS2 is degraded, the memory cell MC is not normally operated, or variations occur in the performance among the memory cells MC, etc.

On the other hand, since the $n^+$ type semiconductor layer NF (refer to FIG. 36) is removed by the wet etching method in the present embodiment, the silicon film PS2 shown in FIG. 38 can be prevented from being damaged. Further, the horizontal part of the silicon film PS2 can be made thin with high accuracy by the forming process of the $n^+$ type semiconductor layer NF by the ion implantation method, and the removing process of the $n^+$ type semiconductor layer NF by the wet etching method. In addition, a drop in the breakdown voltage due to the control gate electrode CG and the metallic film BM coming near each other can be prevented by making the thickness of the vertical part of the silicon film PS2 keep larger than the thickness of the horizontal part of the silicon film PS2. It is thus possible to improve the reliability of the semiconductor device.

Embodiment 4

The present embodiment will be explained using FIGS. 40 to 44, in the case where a memory cell is formed in which a vertical part extending in the direction perpendicular to a main surface of a semiconductor substrate and a horizontal part extending along the main surface of the semiconductor substrate are different from each other in terms of the thickness of a semiconductor film which configures a memory gate electrode. FIGS. 40 to 44 are respectively sectional diagrams for describing a manufacturing process of a semiconductor device according to the present embodiment.

Processes similar to the processes described using FIGS. 1 to 6 are first performed to thereby introduce a p-type impurity into a silicon film PS2 in a relatively high concentration. Here, in the present embodiment, the thickness of the silicon film PS2 formed in a process similar to the process described using FIG. 5 is made smaller than the thickness of the silicon film PS2 formed in the process described using FIG. 5 in the embodiment 1.

Figure 40:
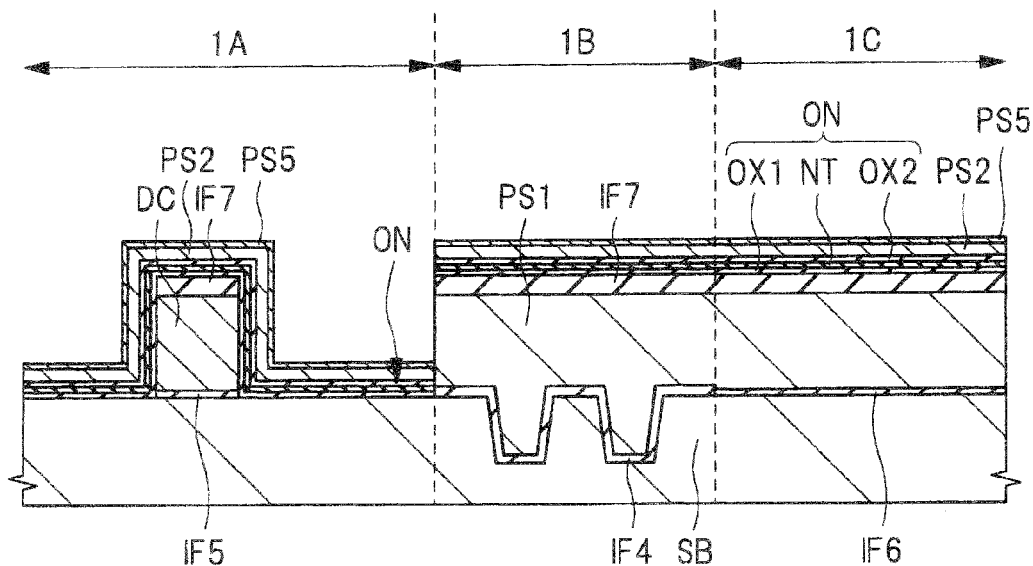
FIG. 40 is a sectional diagram in a manufacturing process of a semiconductor device showing an embodiment 4.

Next, as shown in FIG. 40, a silicon film PS5 is formed over the silicon film PS2 by using a CVD method, for example. The silicon film PS5 is comprised of, for example, a polysilicon film in which an impurity is hardly introduced. That is, the silicon film PS5 is an intrinsic semiconductor film. The silicon film PS5 is formed so as to cover the upper surface and sidewalls of the silicon film PS2.

Figure 41:
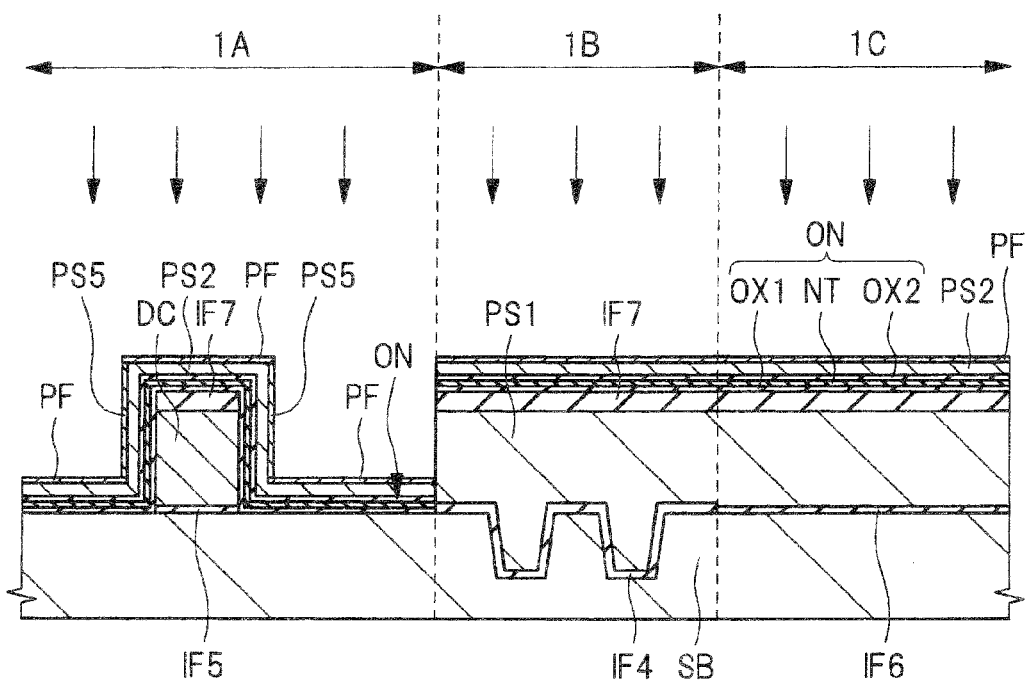
FIG. 41 is a sectional diagram in the manufacturing process of the semiconductor device, following FIG. 40.

Next, as shown in FIG. 41, a p-type impurity (e.g., boron (B)) is implanted in the upper surface of the silicon film PS5 from above the semiconductor substrate SB in a relatively high concentration. Thus, a $p^+$ type semiconductor layer PF is formed in the upper surface of the silicon film PS5. The $p^+$ type semiconductor layer PF is formed in a horizontal part of the silicon film PS5 located over and laterally of a dummy control gate electrode DC.

The ion implantation herein is performed from the direction perpendicular to the main surface of the semiconductor substrate SB. This is done to prevent the p-type impurity from being implanted in the sidewalls of the silicon film PS5 formed adjacent to the sidewalls of the dummy control gate electrode DC by the ion implantation process. Here, the $p^+$ type semiconductor layer PF is formed over the whole surface from the upper surface of the silicon film PS5 to its lower surface. That is, the formation depth of the $p^+$ type semiconductor layer PF reaches from the upper surface of the silicon film PS5 to the bottom face thereof. The horizontal part of the silicon film PS5 has its entire thickness which serves as the $p^+$ type semiconductor layer PF.

Thereafter, a heat treatment for diffusing the p-type impurity implanted in the silicon film PS5 is performed. Thus, since the p-type impurity is diffused within the silicon film PS5, the formation area of the $p^+$ type semiconductor layer PF formed in the horizontal part of the silicon film PS5 located laterally of the dummy control gate electrode DC expands in a lateral direction. Thus, the end of the $p^+$ type semiconductor layer PF in the horizontal part reaches the sidewall of the vertical part of the silicon film PS2 extending along the sidewall of the dummy control gate electrode DC.

That is, the vertical part of the silicon film PS5 which is in contact with the sidewall of the vertical part of the silicon film PS2 extending along the sidewall of the dummy control gate electrode DC is a non-doped intrinsic semiconductor film. On the other hand, the $p^+$ type semiconductor layer PF implanted with a p-type impurity relatively high in concentration is formed within the silicon film PS5 which is a part including immediately below the vertical part of the silicon film PS5 and is formed in contact with the upper surface of the horizontal part of the silicon film PS2 located laterally of the dummy control gate electrode DC. That is, the $p^+$ type semiconductor layer PF is formed over the entire bottom face of the silicon film PS5 located laterally of the dummy control gate electrode DC.

Figure 42:
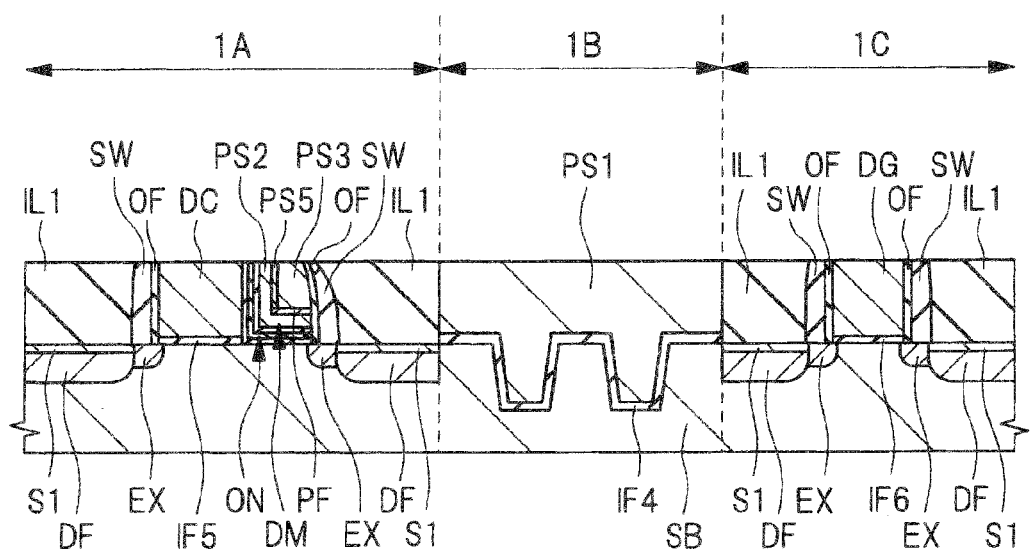
FIG. 42 is a sectional diagram in the manufacturing process of the semiconductor device, following FIG. 41.

Next, as shown in FIG. 42, processes similar to the processes described using FIGS. 7 to 13 are performed to thereby form an interlayer insulating film IL1. A polishing process for planarizing the upper surfaces of the interlayer insulating film IL1, sidewalls SW, offset spacers OF, dummy control gate electrode DC, dummy memory gate electrode DM, ONO film ON, silicon film PS1, and dummy gate electrode DG is performed by a CMP method, for example. Thus, the $p^+$ type semiconductor layer PF and the insulating film IF7 which have been formed over the dummy control gate electrode DC, the dummy memory gate electrode DM, the silicon film PS1, and the dummy gate electrode DG are removed. The dummy memory gate electrode DM includes the silicon films PS2, PS3 and PS5, and the $p^+$ type semiconductor layer PF.

After the polishing process, the $p^+$ type semiconductor layer PF is formed in contact with the upper surface of the horizontal part of the silicon film PS2 having an L-shaped sectional shape. The $p^+$ type semiconductor layer PF is not formed in other areas. The vertical part of the silicon film PS2 is adjacent to one sidewall of the dummy control gate electrode DC through the ONO film ON. The silicon film PS5 as the intrinsic semiconductor film is formed immediately above the $p^+$ type semiconductor layer PF in contact with the sidewall located on the side opposite to the area in which the dummy control gate electrode DC is formed, of the sidewall of the vertical part of the silicon film PS2. That is, the silicon film PS5 and the $p^+$ type semiconductor layer PF located below the silicon film PS5 are in contact with one sidewall of the vertical part of the silicon film PS2. One sidewall of a silicon film PS3 is in contact with the sidewall of the silicon film PS5 as the $p^+$ type semiconductor film, whereas the bottom face of the silicon film PS3 is in contact with the upper surface of the $p^+$ type semiconductor layer PF.

Figure 43:
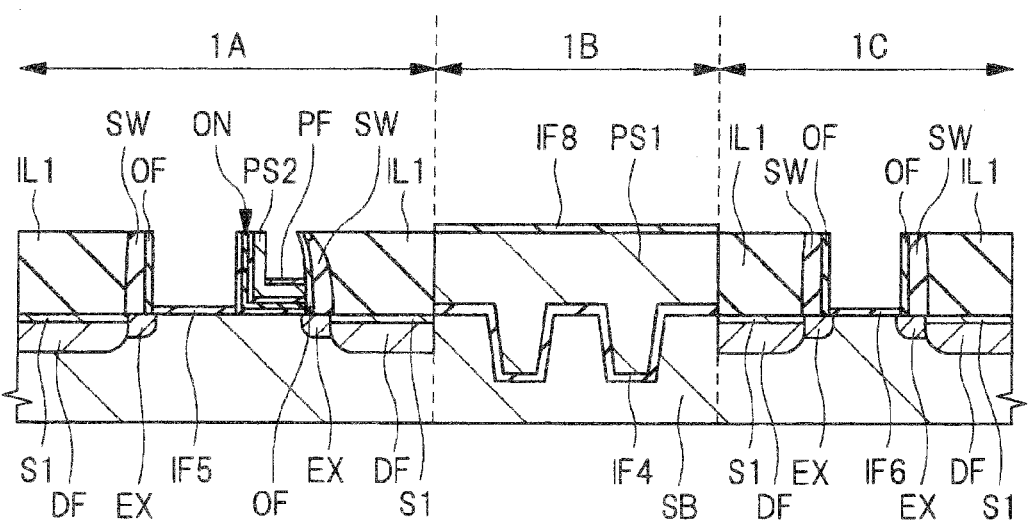
FIG. 43 is a sectional diagram in the manufacturing process of the semiconductor device, following FIG. 42.

Next, as shown in FIG. 43, a process similar to the process described using FIG. 14 is performed to thereby remove the dummy control gate electrode DC, the silicon film PS3, and the dummy gate electrode DG by a wet etching method. Here, an alkaline aqueous solution is used as a chemical solution for wet etching. In the corresponding process of removing the silicon film PS3 as the intrinsic semiconductor film by the wet etching method, the silicon film PS5 as the intrinsic semiconductor film which is in contact with the sidewall of the silicon film PS3 is also removed. Since, however, the p$^+$ type semiconductor layer PF formed below the silicon film PS3 is insoluble in the alkaline aqueous solution, it is left without being removed.

Thus, when a laminated film comprised of the silicon film PS2 as the p-type semiconductor film, and the p$^+$ type semiconductor layer PF is assumed to be a semiconductor film of a single layer, the semiconductor film can be assumed to be a film having an L-shaped sectional shape comprised of a vertical part and a horizontal part. That is, the vertical part of the semiconductor film is comprised of only the silicon film PS2, and the horizontal part of the semiconductor film is comprised of the silicon film PS2 and the p$^+$ type semiconductor layer PF lying over the silicon film PS2. Since the vertical and horizontal parts of the silicon film PS2 have substantially the same thickness as each other, the thickness of the horizontal part of the semiconductor film including the p$^+$ type semiconductor layer PF is larger than that of the vertical part of the semiconductor film not including the p$^+$ type semiconductor layer PF.

Figure 44:
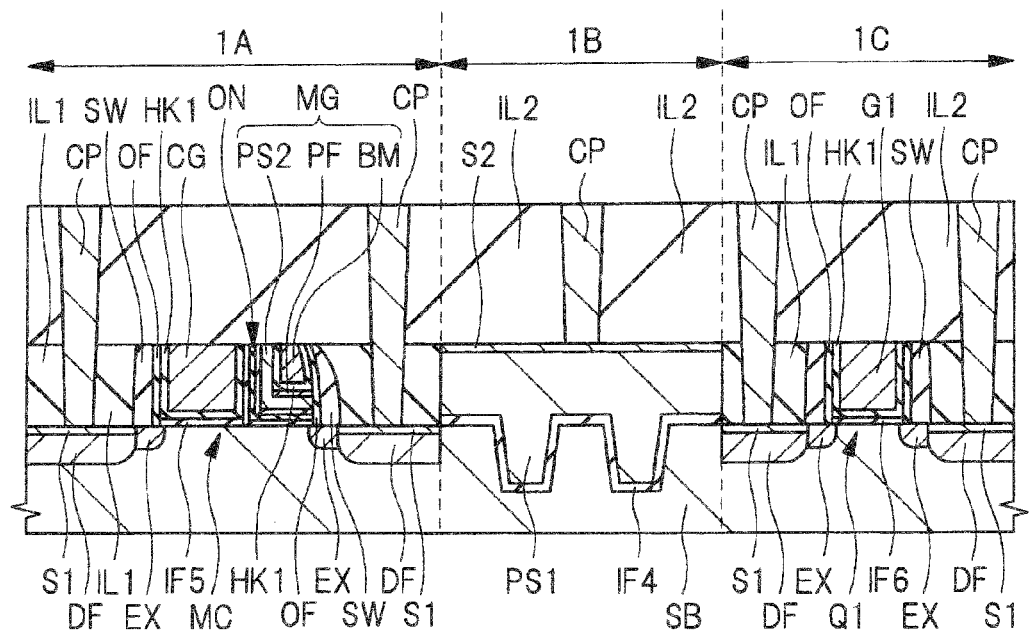
FIG. 44 is a sectional diagram in the manufacturing process of the semiconductor device, following FIG. 43.

Next, as shown in FIG. 44, processes similar to the processes described using FIGS. 15 to 19 are performed to form a memory cell MC, a power feeding part for the memory cell MC, a capacitive element, and a low breakdown voltage MISFETQ1. Thus, the semiconductor device according to the present embodiment is manufactured. The memory gate electrode MG of the memory cell MC is comprised of the silicon film PS2, the metallic film BM, and the p$^+$ type semiconductor layer PF. In the present embodiment, the metallic film BM formed in the embedding process described using FIG. 15 is smaller in aspect ratio than the metallic film BM (refer to FIG. 18) in the structure described in the embodiment 1. This is because the thickness of the vertical part of the silicon film PS2 in the present embodiment shown in FIG. 44 is smaller than the total thickness of the horizontal part of the silicon film PS2 and the p$^+$ type semiconductor layer PF lying over the horizontal part.

<Advantageous Effects of Semiconductor Device According to the Present Embodiment and its Manufacturing Method>

The present embodiment is capable of obtaining advantageous effects similar to the embodiment 1.

Further, in the present embodiment, unlike the embodiment 1, the thickness of the horizontal part of the semiconductor film configuring the memory gate electrode MG, i.e., the p-type semiconductor film comprised of the silicon film PS2 and p$^+$ type semiconductor layer PF is larger than that of the vertical part of the semiconductor film. Thus, the aspect ratio of the metallic film BM embedded in the trench provided immediately above the silicon film PS2 becomes small. That is, the ratio of the height of the metallic film BM to its width can be made small as compared with the embodiment 1.

This is because the thickness of the horizontal part of the semiconductor film comprised of the silicon film PS2 and the p$^+$ type semiconductor layer PF is larger than that of the vertical part of the semiconductor film, and thereby the aspect ratio of the trench formed in the process described using FIG. 43 and opened immediately above the silicon film PS2 and the p$^+$ type semiconductor layer PF can be made small. That is, the depth of the trench, i.e., the distance from the upper surface of the interlayer insulating film IL1 to the upper surface of the p$^+$ type semiconductor layer PF in the direction perpendicular to the main surface of the semiconductor substrate SB can be made smaller than the depth of the trench in the embodiment 1. Thus, it is possible to improve the embedding property of the metallic film BM embedded in the trench.

That is, there is a fear that when the miniaturization of the semiconductor device is advanced and the width of the trench becomes small, it becomes difficult to completely embed the metallic film BM and the insulating film HK1 in the trench where the depth of the trench is large. On the other hand, since the depth of the trench can be made shallower in the present embodiment, the metallic film BM and the insulating film HK1 can be more reliably embedded in the trench. Thus, the reliability of the semiconductor device can be enhanced, and the yield of the manufacturing process of the semiconductor device can be improved. Further, since it becomes easy to embed the metallic film BM in a narrow trench, the memory cell MC can be further miniaturized. Thus, it is possible to improve the performance of the semiconductor device.

Although the invention made above by the present inventors has been described specifically on the basis of the preferred embodiments, the present invention is not limited to the embodiments referred to above. It is needless to say that various changes can be made thereto within the scope not departing from the gist thereof.

What is claimed is:

1. A method of manufacturing a semiconductor device equipped with a memory cell of a nonvolatile memory, comprising the steps of:

(a) providing a semiconductor substrate;

(b) forming a first dummy gate electrode over the semiconductor substrate through a first insulating film;

(c) forming in order a second insulating film having a charge accumulation part there inside, a first semiconductor film and a second semiconductor film each having a p-type conductivity type, so as to cover sidewalls of the first dummy gate electrode and the semiconductor substrate exposed from the first insulating film in adjacency to the sidewalls;

(d) processing the first semiconductor film and the second semiconductor film to thereby form a second dummy gate electrode including the first semiconductor film and the second semiconductor film over the sidewalls of the first dummy gate electrode through the second insulating film;

(e) forming a first interlayer insulating film so as to cover the first dummy gate electrode and the second dummy gate electrode;

(f) polishing the first interlayer insulating film to expose the first dummy gate electrode and the second dummy gate electrode;

(g) removing the second semiconductor film configuring the second dummy gate electrode, and the first dummy gate electrode;

(h) forming a first gate electrode corresponding to a metal gate electrode for the memory cell in a first trench corresponding to a region from which the first dummy gate electrode is removed in the (g) step, and forming a metallic film in a second trench corresponding to a region from which the second semiconductor film is removed in the (g) step to thereby form a second gate electrode including the first semiconductor film and the metallic film for the memory cell.

2. The method according to claim 1, further comprising the step of (i) forming a contact plug coupled to both of the first semiconductor film and the metallic film.

3. The method according to claim 1,
wherein the (c) step comprises the steps of:
(c1) forming the second insulating film and a third semiconductor film over the semiconductor substrate in order;
(c2) implanting a p-type impurity in the third semiconductor film to thereby form the first semiconductor film comprised of the third semiconductor film; and
(c3) forming the second semiconductor film over the first semiconductor film.

4. The method according to claim 3, further comprising the step of:
(c5) after the (c2) step and before (c3) step, implanting an n-type impurity in an upper surface of the first semiconductor film from a direction perpendicular to a main surface of the semiconductor substrate to thereby form an n-type semiconductor layer from the upper surface of the first semiconductor film to a depth on the way of the first semiconductor film,
wherein in the (g) step, the first dummy gate electrode, the second semiconductor film, and the n-type semiconductor layer are removed.

5. The method according to claim 3, further comprising the steps of:
(c6) after the (c2) step, depositing a fourth semiconductor film over the first semiconductor film; and
(c7) before the (c3) step, implanting, from a direction perpendicular to the main surface of the semiconductor substrate, a p-type impurity in a part of the fourth semiconductor film, extending along the main surface of the semiconductor substrate to thereby form a p-type semiconductor layer in a part of the fourth semiconductor film,
wherein in the (g) step, the first dummy gate electrode, the second semiconductor film, and the fourth semiconductor film being in contact with the sidewalls of the second insulating film are removed, and after the (g) step, the upper surface of the first semiconductor film is covered with the p-type semiconductor layer.

6. The method according to claim 1, wherein in the (h) step, a first high permittivity insulating film higher in permittivity than silicon nitride, and the first gate electrode are formed in the first trench in order, and
wherein a second high permittivity insulating film higher in permittivity than silicon nitride, and the metallic film are formed in the second trench in order to form the second gate electrode.

7. The method according to claim 6, further comprising the step of:
(d1) after the (d) step, forming a third dummy gate electrode over the semiconductor substrate through a third insulating film; and
(d2) before the (e) step, forming a second source-drain region in the upper surface of the semiconductor substrate located laterally of the third dummy gate electrode,
wherein in the (e) step, the first interlayer insulating film is formed so as to cover the first through third dummy gate electrodes,
wherein in the (f) step, the first interlayer insulating film is polished to expose the first through third dummy gate electrodes,
wherein in the (g) step, the first dummy gate electrode, the second semiconductor film, and the third dummy gate electrode are removed,
wherein in the (h) step, the first gate electrode, the second gate electrode, and the first high permittivity insulating film are formed, and
wherein in the (g) step, a third high permittivity insulating film higher in permittivity than silicon nitride, and a third gate electrode corresponding to a metal gate electrode for a MISFET other than the memory cell are formed in order in a third trench corresponding to an area from which the third dummy gate electrode is removed.

8. The method according to claim 6, further comprising the steps of:
(d1) after the (d) step, forming a third insulating film, a third high permittivity insulating film higher in permittivity than silicon nitride, and a third dummy gate electrode over the semiconductor substrate in order; and
(d2) before the (e) step, forming a second source-drain region in the upper surface of the semiconductor substrate located laterally of the third dummy gate electrode,
wherein in the (e) step, the first interlayer insulating film is formed so as to cover the first through third dummy gate electrodes,
wherein in the (f) step, the first interlayer insulating film is polished to expose the first through third dummy gate electrodes, and
wherein the method further comprises the step of:
(g1) before the (g) step or after the (h) step, removing the third dummy gate electrode and forming a third gate electrode corresponding to a metal gate electrode for a MISFET other than the memory cell in a third trench corresponding to an area from which the third dummy gate electrode provided over the third high permittivity insulating film is removed.

9. The method according to claim 1, wherein in the (d) step, the first semiconductor film and the second semiconductor film are etchbacked to thereby form the second dummy gate electrode like a sidewall, which is adjacent to the sidewall of the first dummy gate electrode.

10. The method according to claim 1, further comprising the step of:
(c4) after the (d) step and before the (e) step, forming a first source-drain region of the memory cell in an upper surface of the semiconductor substrate.

11. The method according to claim 1,
wherein in the (b) step, the first insulating film and the first dummy gate electrode are formed and a fifth semiconductor film is formed over the semiconductor substrate through a fourth insulating film to thereby form a capacitive element having the semiconductor substrate and the fifth semiconductor film,
wherein in the (e) step, the first interlayer insulating film is formed so as to cover the first dummy gate electrode, the second dummy gate electrode, and the fifth semiconductor film,
wherein in the (f) step, the first interlayer insulating film is polished to expose the first dummy gate electrode, the second dummy gate electrode, and the fifth semiconductor film, and
wherein in the (g) step, the fifth semiconductor film is left and the first dummy gate electrode and the second semiconductor film are removed.

12. A semiconductor device, comprising:
a semiconductor substrate; and
a memory cell including:
- a first gate electrode corresponding to a metal gate electrode, the first gate electrode being formed over the semiconductor substrate through a first insulating film,
- a second gate electrode formed over one of sidewalls of the first gate electrode through a second insulating film having a charge accumulation part there inside, and
- source-drain regions formed in a main surface of the semiconductor substrate, wherein the second gate electrode is formed over the semiconductor substrate through the second insulating film, wherein the second gate electrode includes a metallic film and further includes a first semiconductor film having a p-type conductivity, which is continuously formed from an area between the metallic film and the first gate electrode to between the metallic film and the semiconductor substrate, wherein a first high permittivity insulating film higher in permittivity than silicon nitride is interposed between the metallic film and the first semiconductor film, and wherein a contact plug electrically coupled to the metallic film and the first semiconductor film is formed over the memory cell.

13. The semiconductor device according to claim 12,
wherein the thickness of a first part of the first semiconductor film, which is formed between the metallic film and the first gate electrode is larger than the thickness of a second part of the first semiconductor film, which is formed between the metallic film and the semiconductor substrate.

14. The semiconductor device according to claim 12,
wherein the thickness of a first part of the first semiconductor film, which is formed between the metallic film and the first gate electrode is smaller than the thickness of a second part of the first semiconductor film, which is formed between the metallic film and the semiconductor substrate.

15. The semiconductor device according to claim 14,
wherein the first semiconductor film includes a second semiconductor film having a p-type conductivity type, which is continuously formed from an area between the metallic film and the first gate electrode to between the metallic film and the semiconductor substrate, and further includes a p-type semiconductor layer formed over the second semiconductor film between the metallic film and the semiconductor substrate.

16. The semiconductor device according to claim 12,
wherein the memory cell includes a control transistor and a memory transistor,
wherein the control transistor has the first gate electrode corresponding to a control gate electrode, and the source-drain regions, and
wherein the memory transistor has the second gate electrode corresponding to a memory gate electrode, and the source-drain regions.

* * * * *